United States Patent
Satou et al.

(10) Patent No.: US 7,928,589 B2
(45) Date of Patent: Apr. 19, 2011

(54) SEMICONDUCTOR DEVICE

(75) Inventors: Yukihiro Satou, Takasaki (JP); Tomoaki Uno, Takasaki (JP); Nobuyoshi Matsuura, Takasaki (JP); Masaki Shiraishi, Hitachi (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/464,135

(22) Filed: May 12, 2009

(65) Prior Publication Data

US 2009/0218683 A1 Sep. 3, 2009

Related U.S. Application Data

(63) Continuation of application No. 11/680,758, filed on Mar. 1, 2007, now Pat. No. 7,554,209, which is a continuation of application No. 11/053,326, filed on Feb. 9, 2005, now Pat. No. 7,554,181.

(30) Foreign Application Priority Data

Mar. 31, 2004 (JP) ................................. 2004-106224

(51) Int. Cl.
*H01L 23/48* (2006.01)

(52) U.S. Cl. ........ 257/786; 257/784; 257/777; 257/706; 257/E23.141; 438/617

(58) Field of Classification Search ................ 257/786, 257/E23.141
See application file for complete search history.

(56) References Cited

U.S. PATENT DOCUMENTS

| 4,766,479 | A | 8/1988 | Krum et al. |
| 6,040,626 | A | 3/2000 | Cheah et al. |
| 6,184,585 | B1 | 2/2001 | Martinez et al. |
| 6,521,987 | B1 | 2/2003 | Glenn et al. |
| 6,717,260 | B2 | 4/2004 | Pavier et al. |
| 6,940,724 | B2 | 9/2005 | Divakar et al. |
| 6,946,740 | B2 | 9/2005 | Schaffer |
| 2002/0021560 | A1 | 2/2002 | Jauregui |
| 2003/0098468 | A1 | 5/2003 | Wheeler et al. |
| 2003/0183924 | A1* | 10/2003 | Bhalla et al. ............ 257/723 |
| 2004/0004272 | A1 | 1/2004 | Luo et al. |
| 2004/0217488 | A1 | 11/2004 | Luechinger |
| 2005/0231990 | A1 | 10/2005 | Uno et al. |

FOREIGN PATENT DOCUMENTS

| JP | 2001-025239 | | 1/2001 |
| JP | 2002-217416 | | 8/2002 |
| JP | 2004-055756 | A | 2/2004 |
| JP | 2004-342735 | A | 12/2004 |

* cited by examiner

*Primary Examiner* — Ajay K Arora
(74) *Attorney, Agent, or Firm* — Miles & Stockbridge P.C.

(57) ABSTRACT

The present invention provides a non-insulated type DC-DC converter having a circuit in which a power MOS•FET for a high side switch and a power MOS•FET for a low side switch are connected in series. In the non-insulated type DC-DC converter, the power transistor for the high side switch, the power transistor for the low side switch, and driver circuits that drive these are respectively constituted by different semiconductor chips. The three semiconductor chips are accommodated in one package, and the semiconductor chip including the power transistor for the high side switch, and the semiconductor chip including the driver circuits are disposed so as to approach each other.

25 Claims, 44 Drawing Sheets

SEMICONDUCTOR DEVICE

CROSS-REFERENCE TO RELATED APPLICATIONS

This application is a continuation of application Ser. No. 11/680,758 filed Mar. 1, 2007, now U.S. Pat. No. 7,554,209 which is a continuation of application Ser. No. 11/053,326 filed Feb. 9, 2005 now U.S. Pat. No. 7,554,181. The present application claims priority from Japanese patent application No. 2004-106224 filed on Mar. 31, 2004, the disclosure of which, including the specification, drawings, and abstract, is incorporated herein by reference in its entirety.

BACKGROUND OF THE INVENTION

The present invention relates to a semiconductor device technique, and particularly to a technique effective when applied to a semiconductor device having a power supply circuit.

In order to attain adaptation to miniaturization of a power supply circuit or the like and its fast response, a power MOS•FET (Metal Oxide Semiconductor Field Effect Transistor) used in a power supply has been proceeding toward an increase in high frequency in recent years.

In particular, a non-insulated type DC-DC converter used as a power supply circuit for a desk top type or notebook personal computer, a server or a game machine or the like has a tendency to increase in current and frequency with respect to a CPU (Central Processing Unit) and a DSP or the like to be controlled.

A DC-DC converter widely used as one example of a power supply circuit has a configuration wherein a power MOS•FET for a high side switch and a power MOS•FET for a low side switch are connected in series. The power MOS•FET for the high side switch has a switch function for control of the DC-DC converter, whereas the power MOS•FET for the low side switch has a switch function for synchronous rectification. The two power MOS•FETs are alternately turned on/off while being synchronized with each other to perform conversion of a source or power supply voltage.

Such a DC-DC converter has been described in, for example, Japanese Unexamined Patent Publication No. 2002-217416, which discloses a technique wherein a power MOS•FET for high side and a power MOS•FET for low side are configured with the same package, and the efficiency of voltage conversion between the power MOS•FET for high side and the power MOS•FET for low side is improved (refer to a patent document 1).

A technique wherein noise showing a problem at a DC-DC converter in which a control circuit, a driver circuit and a power MOS•FET are brought into one chip, is reduced by a resistor and a condenser, has been disclosed in, for example, Japanese Unexamined Patent Publication No. 2001-25239 (refer to a patent document 2).

Patent document 1
  Japanese Unexamined Patent Publication No. 2002-217416
Patent document 2
  Japanese Unexamined Patent Publication No. 2001-25239

SUMMARY OF THE INVENTION

As a result of discussions about a further size reduction, speeding-up and increase in efficiency of the DC-DC converter, the present inventors have found out the existence of the following problems.

The patent document 1 has disclosed the technique of incorporating two conductor chips of a switch semiconductor chip for a high side power MOS•FET and a switch semiconductor chip for a low side power MOS•FET into the same resin molded type package. However, no detailed mention is made of control circuits for controlling on/off operations of the switches, in other words, driver circuits for driving the gates of the power MOS•FETs. When the driver circuits are configured by different packages including different semiconductor chips, the number of parts for constituting the DC-DC converter increases and hence a packaging area becomes large. Thus, there is a fear that a size reduction of the DC-DC converter cannot be achieved sufficiently. Further, there is a fear that since there is a need to route wirings on a mounting board to connect the two different packages, losses occur due to inductances parasitized on the routing wirings and hence the efficiency of voltage conversion will be degraded. The proportion of the losses is particularly noticeable where an increase in high frequency has proceeded.

The patent document 1 does not refer particularly to the control circuits for controlling the driver circuits.

When the control circuits for controlling the driver circuits, the driver circuits and the power MOS•FETs are brought into one chip as in the patent document 2, a reduction in the size of a semiconductor device for constituting the DC-DC converter can be realized. However, the process of manufacturing a chip becomes complicated. There is thus a fear that respective semiconductor elements and circuit characteristics are not brought out sufficiently. Therefore, there is a fear that the speeding up of the DC-DC converter and an increase in efficiency thereof cannot be achieved sufficiently. There is also a fear that time is required for chip manufacture and the manufacturing cost increases.

Important objectives are how to adapt to a large current and an increase in frequency and to obtain a DC-DC converter small in size and high in the efficiency of voltage conversion in order to reduce or solve the above fears.

One object of the present invention is to provide a technique capable of improving voltage conversion efficiency of a semiconductor device.

Another object of the present invention is to provide a technique capable of scaling down a package of a semiconductor device.

A further object of the present invention is to provide a technique capable of reducing manufacturing cost of a semiconductor device.

A still further object of the present invention is to provide a technique capable of attaining an improvement in reliability of a semiconductor device.

The above, other objects and novel features of the present invention will become apparent from the description of the present specification and the accompanying drawings.

A summary of a representative one of the inventions disclosed in the present application will be explained in brief as follows:

In the present invention, a power transistor for a high side switch, a power transistor for a low side switch, and driver circuits that drive these are respectively constituted of different semiconductor chips. The three semiconductor chips are accommodated or held in one package. Further, the semiconductor chip including the power transistor for the high side switch, and the semiconductor chip including the driver circuits are disposed so as to approach each other. Described more specifically, a semiconductor device of the present invention comprises:

a first chip mounting section, a second chip mounting section and a third chip mounting section respectively disposed at predetermined intervals;

a plurality of external terminals disposed around the first, second and third chip mounting sections;

a first semiconductor chip disposed over the first chip mounting section and having a first field effect transistor;

a second semiconductor chip disposed over the second chip mounting section and having a second field effect transistor;

a third semiconductor chip disposed over the third chip mounting section and including control circuits for controlling the operations of the first and second field effect transistors; and a resin body that encapsulates the first, second and third semiconductor chips, the first, second and third chip mounting sections and some of the plurality of external terminals, wherein the plurality of external terminals include a first power supply terminal that supplies an input power supply potential, a second power supply terminal that supplies a potential lower than the input power supply potential, signal terminals that control the control circuits of the third semiconductor chip, and an output terminal that outputs an output power supply potential to the outside, wherein the first field effect transistor has a source-to-drain path series-connected between the first power supply terminal and the output terminal, wherein the second field effect transistor has a source-to-drain path series-connected between the output terminal and the second power supply terminal, wherein the control circuits of the third semiconductor chip control the gates of the first and second field effect transistors in accordance with control signals inputted to the signal terminals, and wherein the third semiconductor chip is disposed in such a manner that the distance between the third semiconductor chip and the first semiconductor chip becomes shorter than the distance between the third semiconductor chip and the second semiconductor chip.

Advantageous effects obtained by a representative one of the inventions disclosed in the present application will hereinafter be described in brief as follows:

In the present invention, a power transistor (first field effect transistor) for a high side switch, a power transistor (second field effect transistor) for a low side switch, and driver circuits (control circuits) that drive these are respectively constituted of different first through third semiconductor chips. Further, the three semiconductor chips are accommodated or held in one package. Furthermore, the first semiconductor chip including the power transistor (first field effect transistor) for the high side switch, and the third semiconductor chip including the driver circuits (control circuits) are disposed so as to approach each other. Thus, the optimum semiconductor device forming technology can be applied to constitute necessary circuit blocks. Further, the number of parts can be reduced. Furthermore, parasitic inductance components of wirings located inside and outside a package, which greatly influence high frequency characteristics, can be reduced. Thus, the speeding-up, downsizing and increasing efficiency of a semiconductor device can be achieved.

DETAILED DESCRIPTION OF THE PREFERRED EMBODIMENTS

Figure 1:
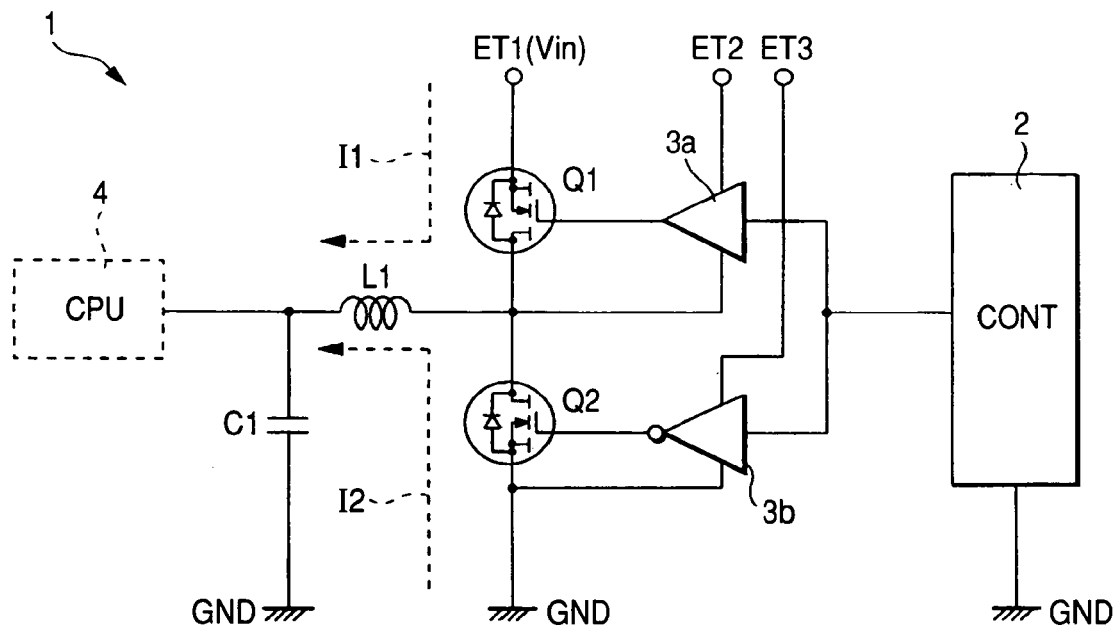
FIG. 1 is a circuit diagram showing one example of a semiconductor device according to a first embodiment of the present invention.

Whenever circumstances require it for convenience in the following embodiments, they will be described by being divided into a plurality of sections or embodiments. However, unless otherwise specified in particular, they are not irrelevant to one another. One thereof has to do with modifications, details and supplementary explanations of some or all of the other. When reference is made to the number of elements or the like (including the number of pieces, numerical values, quantity, range, etc.) in the following embodiments, the number thereof is not limited to a specific number and may be greater than or less than or equal to the specific number unless otherwise specified in particular and definitely limited to the specific number in principle. It is also needless to say that components (including element or factor steps, etc.) employed in the following embodiments are not always essential unless otherwise specified in particular and considered to be definitely essential in principle. Similarly, when reference is made to the shapes, positional relations and the like of the components or the like in the following embodiments, they will include ones substantially analogous or similar to their shapes or the like unless otherwise specified in particular and considered not to be definitely so in principle, etc. This is similarly applied even to the above-described numerical values and range. Those each having the same function in all the drawings for describing the embodiments are respectively given the same reference numerals and their repetitive description will be omitted. The preferred embodiments of the present invention will hereinafter be described in detail based on the accompanying drawings.

First Preferred Embodiment

Figure 54:
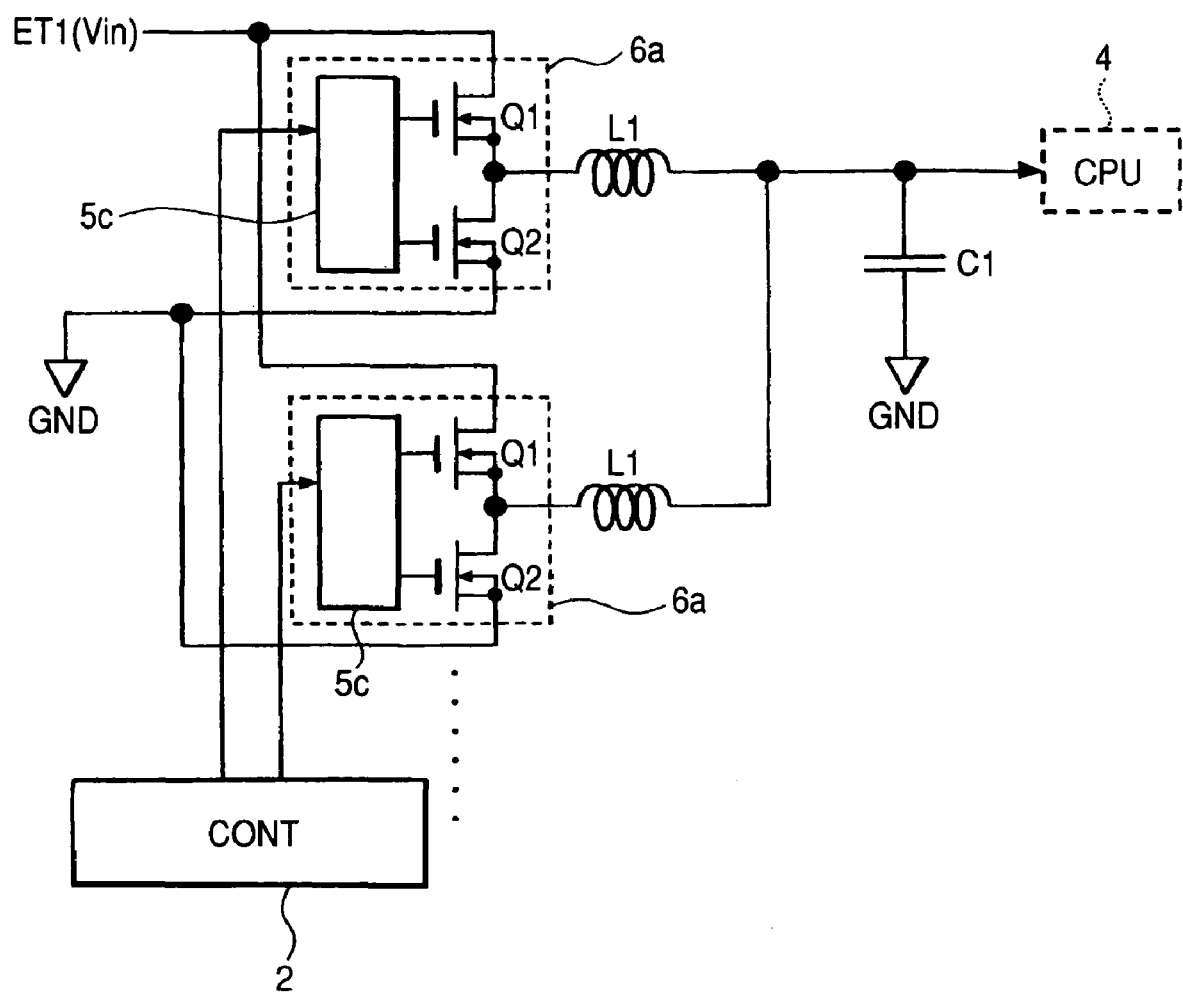
FIG. 54 is a diagram for describing one example of a circuit configuration of a semiconductor device of the present invention.

A semiconductor device according to a first embodiment is of, for example, a non-insulated type DC-DC converter employed in a power supply circuit for a disk top type personal computer, a notebook-size personal computer, a server or a game machine or the like. FIG. 1 shows a circuit diagram of one example of the non-insulated type DC-DC converter. The non-insulated type DC-DC converter has elements like a control circuit 2, driver circuits 3a and 3b, field effect transistors (power MOS•FETs) Q1 and Q2, a coil L1, a condenser or capacitor C1, etc. These elements are mounted on a wiring board and electrically connected to one another through wirings of the wiring board. Incidentally, reference numeral 4 in FIG. 1 indicates a load circuit like a CPU (Central Processing Unit) or DSP (Digital Signal Processor) for the disk top type personal computer, notebook-size personal computer, server or game machine. Symbols ET1, ET2 and ET3 indicate terminals respectively. As shown in FIG. 54, such a non-insulated type DC-DC converter 1 is placed so as to be parallel-connected in plural form with respect to one CPU.

Figure 2:
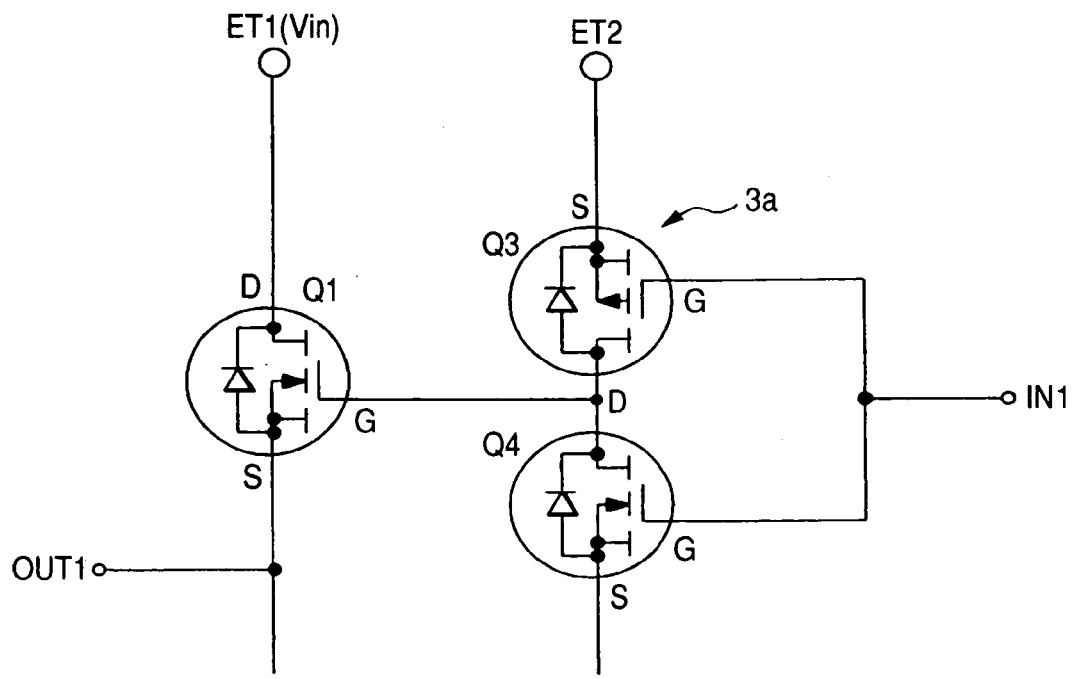
FIG. 2 is a circuit diagram illustrating one example of a control circuit of the semiconductor device shown in FIG. 1.

The control circuit 2 is a circuit which supplies a signal that controls a width (on time) for voltage switch-on of each of the field effect transistors Q1 (first field effect transistor) and Q2 (second field effect transistor). The control circuit 2 is packaged aside from the first field effect transistor Q1, the second field effect transistor Q2, and the driver circuits 3a and 3b. The output of the control circuit 2 is electrically connected to its corresponding inputs of the driver circuits 3a (hereinafter also called first control circuit) and 3b (hereinafter also called second control circuit). The first control circuit 3a and the second control circuit 3b are circuits which respectively control the gates of the first and second field effect transistors Q1 and Q2 in accordance with the control signal supplied from the control circuit 2. The first and second control circuits 3a and 3b are respectively formed of, for example, a CMOS inverter circuit. One example of a circuit diagram of the first control circuit 3a is shown in FIG. 2. The first control circuit 3a has a circuit configuration in which a p channel type field effect transistor Q3 and an n channel type field effect transistor Q4 are complementarily connected in series. Incidentally, symbols D, G and S in FIG. 2 respectively indicate a drain, a gate and a source. The control circuit 3a is controlled based on a control signal IN1 and controls the level of an output OUT1 through the field effect transistor Q1.

Figure 5:
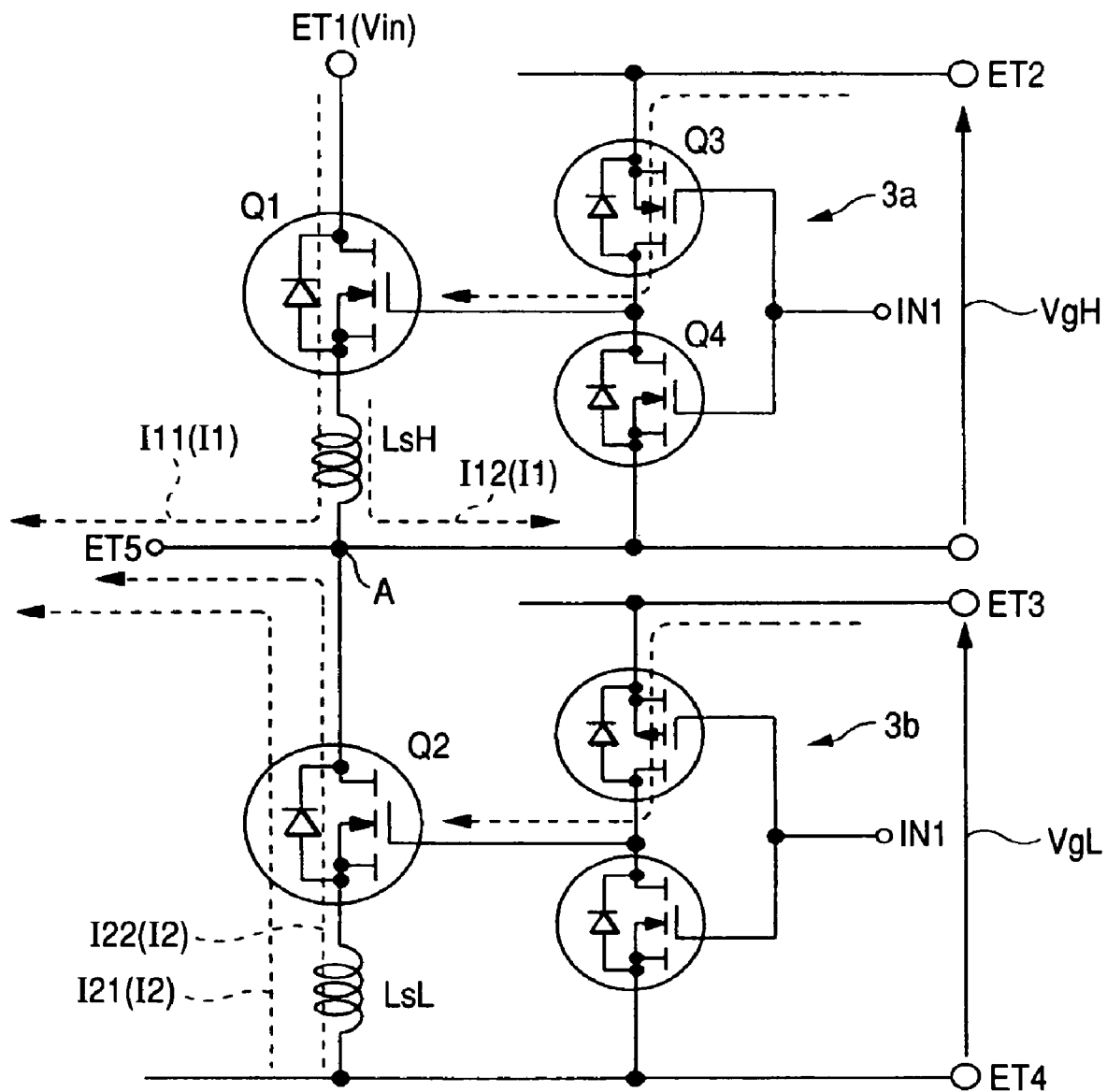
FIG. 5 is a diagram for describing a circuit operation discussed by the present inventors.

As shown in FIG. 5, the inputs (IN) of first and second control circuits 3a and 3b are electrically connected to their corresponding terminals (signal terminals) supplied with a control signal from the corresponding control circuit 2. The outputs of the first and second control circuits 3a and 3b are respectively electrically connected to the gates of first and second field effect transistors Q1 and Q2. The first and second field effect transistors Q1 and Q2 are series-connected between a terminal ET1 (first power or power supply terminal) supplied with an input power supply potential Vin and a terminal ET4 (second power or power supply terminal) supplied with a reference potential GND. The input power supply potential Vin ranges from approximately 5 to 12V, for example. The reference potential GND is, for example, a power supply or source potential lower than the input power supply potential, e.g., 0 (zero) V corresponding to a ground potential. An operating frequency (corresponding to a cycle taken when the first and second field effect transistors Q1 and Q2 are turned on and off) of the non-insulated type DC-DC converter 1 is about 1 MHz or so, for example.

The first field effect transistor Q1 is intended for a high side switch (high potential side: first operating voltage) and has a switch function for storing energy in the coil L1 for supplying power to an output Vout (input of load circuit 4) of the non-insulated type DC-DC converter 1. The first field effect transistor Q1 is formed of a vertical field effect transistor in which a channel is formed in the direction of thickness of a chip. According to the discussions of the present inventors, in the field effect transistor Q1 for the high side switch, switching losses (turn-on loss and turn-off loss) comes into sight in a large way due to a parasitic capacitance added thereto as the operating frequency of the non-insulated type DC-DC converter 1 becomes high. Thus, it is desired that if ordinary, a horizontal field effect transistor in which a channel is formed in the surface (direction normal to the chip's thickness direction) of the chip, is applied as the field effect transistor for the high side switch in consideration of the switching losses. This is because a parasitic capacitance (gate parasitic capacitance) applied between the gate and drain can be reduced since the horizontal field effect transistor is smaller than the vertical field effect transistor in terms of an area at which a gate electrode and a drain region overlap.

It is however disadvantageous to bring each element into less size because when an attempt is made to obtain a value nearly equal to that of the vertical field effect transistor as the resistance (on resistance) produced at the operation of the horizontal field effect transistor, the cell area of the horizontal field effect transistor becomes about 2.5 times as large as or more than the cell area of the vertical field effect transistor. In the case of the vertical field effect transistor, a channel width per unit area can be increased as compared with the horizontal field effect transistor, so that the on resistance can be reduced.

That is, the formation of the first field effect transistor Q1 for the high side switch by the vertical field effect transistor makes it possible to realize a reduction in the size of each element and bring packaging into less size.

Figure 3:
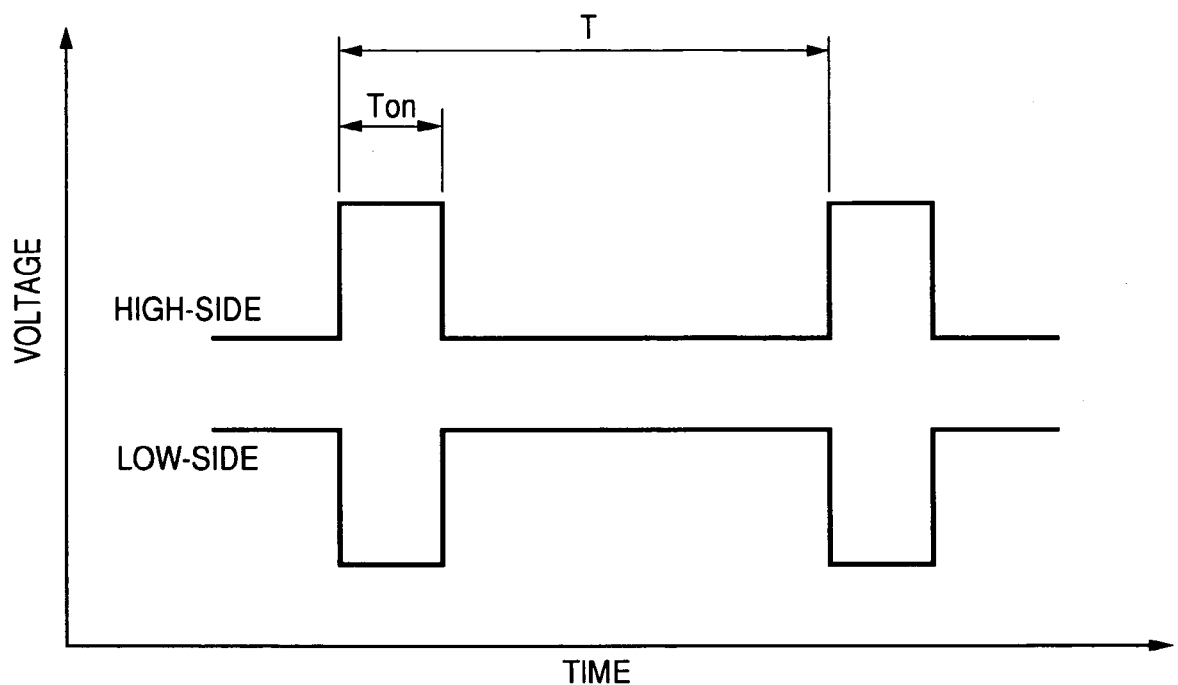
FIG. 3 is a diagram for describing one example of a timing chart of the semiconductor device shown in FIG. 1.

On the other hand, the second field effect transistor Q2 is of a field effect transistor for a low side switch (low potential side: second operating voltage) and also serves as a rectifying transistor of the non-insulated type DC-DC converter 1. The second field effect transistor Q2 has the function of reducing the resistance of the transistor in sync with a frequency sent from the control circuit 2 to perform rectification. The second field effect transistor Q2 is formed of a vertical field effect transistor in which a channel is formed in the direction of thickness of the chip, in a manner similar to the first field effect transistor Q1. It is advantageous to apply the vertical field effect transistor because a loss due to the on resistance rather than the switching losses comes into sight in a large fashion since the time (on time) during which the voltage is being applied to the field effect transistor for the low side switch, becomes longer than the on time of the field effect transistor for the high side switch as shown in FIG. 3. That is, the formation of the second field effect transistor Q2 for the low side switch by the vertical field effect transistor makes it possible to reduce the on resistance. Therefore, even if current that flows through the non-insulated type DC-DC converter 1 increases, the efficiency of voltage conversion can be improved.

An output terminal ET5 for supplying an output power supply potential to the outside is provided between wirings for connecting the source of the first field effect transistor Q1 and the drain of the second field effect transistor Q2. An output wiring is electrically connected to the output terminal ET5. Also the coil L1 is electrically connected to the output wiring. At a stage subsequent to the coil L1, the condenser C1 is electrically connected between the output wiring and a terminal for supply of the reference potential GND.

In such a circuit, the first and second field effect transistors Q1 and Q2 are alternately turned on and off while being kept synchronized with each other to thereby perform conversion of the power supply voltage. That is, when the first field effect transistor Q1 for the high side switch is turned on, a current (first current) I1 flows from the first power supply terminal electrically connected to the drain of the first field effect transistor Q1 to the output terminal via the first field effect transistor Q1. When the first field effect transistor Q1 for the high side switch is turned off, a current I2 flows due to a back electromotive voltage of the coil L1. Turning on the second field effect transistor Q2 for the low side switch when the current I2 is flowing, makes it possible to reduce a voltage drop. FIG. 3 referred to above shows one example of a timing chart of the non-insulated type DC-DC converter 1. As described above, the on time of the second field effect transistor Q2 for the low side switch is longer than the on time of the first field effect transistor Q1 for the high side switch. Ton indicates a pulse width at the turning-on of the first field effect transistor Q1 for the high side switch, and T indicates a pulse cycle. The current I1 is a large current of about 20 A, for example.

Meanwhile, the required drive current of the non-insulated type DC-DC converter 1 has also been increased in recent years with an increase in drive current of the load circuit 4. There has also been a demand for a size reduction of the non-insulated type DC-DC converter 1. Further, the required operating frequency of the non-insulated type DC-DC converter 1 has also been increased to supply a low voltage stably. The reason why the demand for the size reduction of the non-insulated type DC-DC converter 1 is made, is that it is preferable to make its size reduction in view of the fact that in addition to a demand for an overall size reduction in semiconductor device, its size reduction enables shortening of the distance between the non-insulated type DC-DC converter 1 and the load circuit 4, and a large current is supplied to the load circuit 4 in a short period of time. Another reason why the operating frequency of the non-insulated type DC-DC converter 1 is made high, is that the number of unit elements such as the coil L1 and the condenser C1 can be reduced, and the coil L1 and the condenser C1 can be brought into less size.

Figure 4:
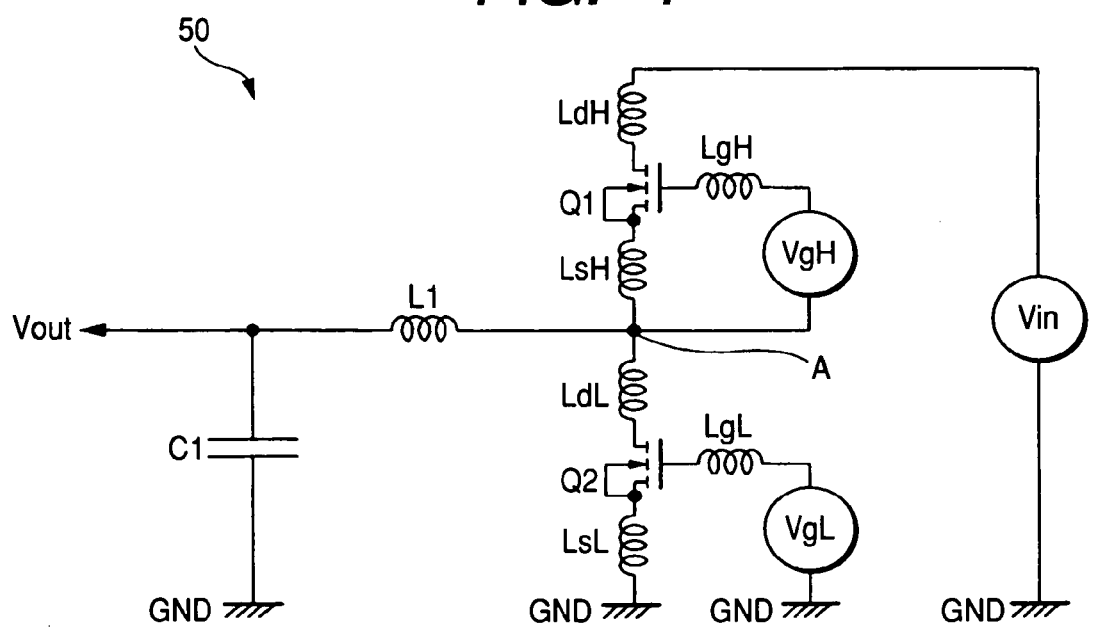
FIG. 4 is an equivalent circuit diagram showing inductance components parasitized on a semiconductor device discussed by the present inventors.

However, the present inventors have found the problem that with the above progress of the increases in current and frequency, the efficiency of voltage conversion of such a non-insulated type DC-DC converter 50 as shown in FIG. 4 is degraded due to influences of an inductance LsH parasitized on the source side of a first field effect transistor Q1 for a high side switch, an inductance LgH parasitized on the gate side thereof, and an inductance LsL parasitized on the source side of a second field effect transistor Q2 for a low side switch. FIG. 4 is an equivalent circuit diagram showing inductance components parasitized on the non-insulated type DC-DC converter 50. Symbols LdH, LgH, LsH, LdL, LgL and LsL respectively indicate inductances parasitized on packages of the first and second field effect transistors Q1 and Q2 and wirings or the like of a printed wiring board. VgH indicates a gate voltage for turning on the first field effect transistor Q1, and VgL indicates a gate voltage for turning on the second field effect transistor Q2.

When the parasitic inductance LsH increases, a turn-on loss and a turn-off loss (turn-on loss in particular) of the first field effect transistor Q1 for the high side switch become large significantly, so that the efficiency of voltage conversion of the non-insulated type DC-DC converter 50 is degraded. The turn-on loss and the turn-off loss are proportional to the frequency and output current, loss components become large with the progress of the increases in current and frequency of the non-insulated type DC-DC converter 50 as described above.

A description will next be made of the reason why when the parasitic inductance LsH increases, the turn-on and the turn-off become slow, and the turn-on loss and the turn-off loss increase. FIG. 5 is a diagram for describing a circuit operation of a non-insulated type DC-DC converter 50, and FIG. 6 is a diagram for describing a device section at the circuit operation of FIG. 5, respectively.

Figure 6:
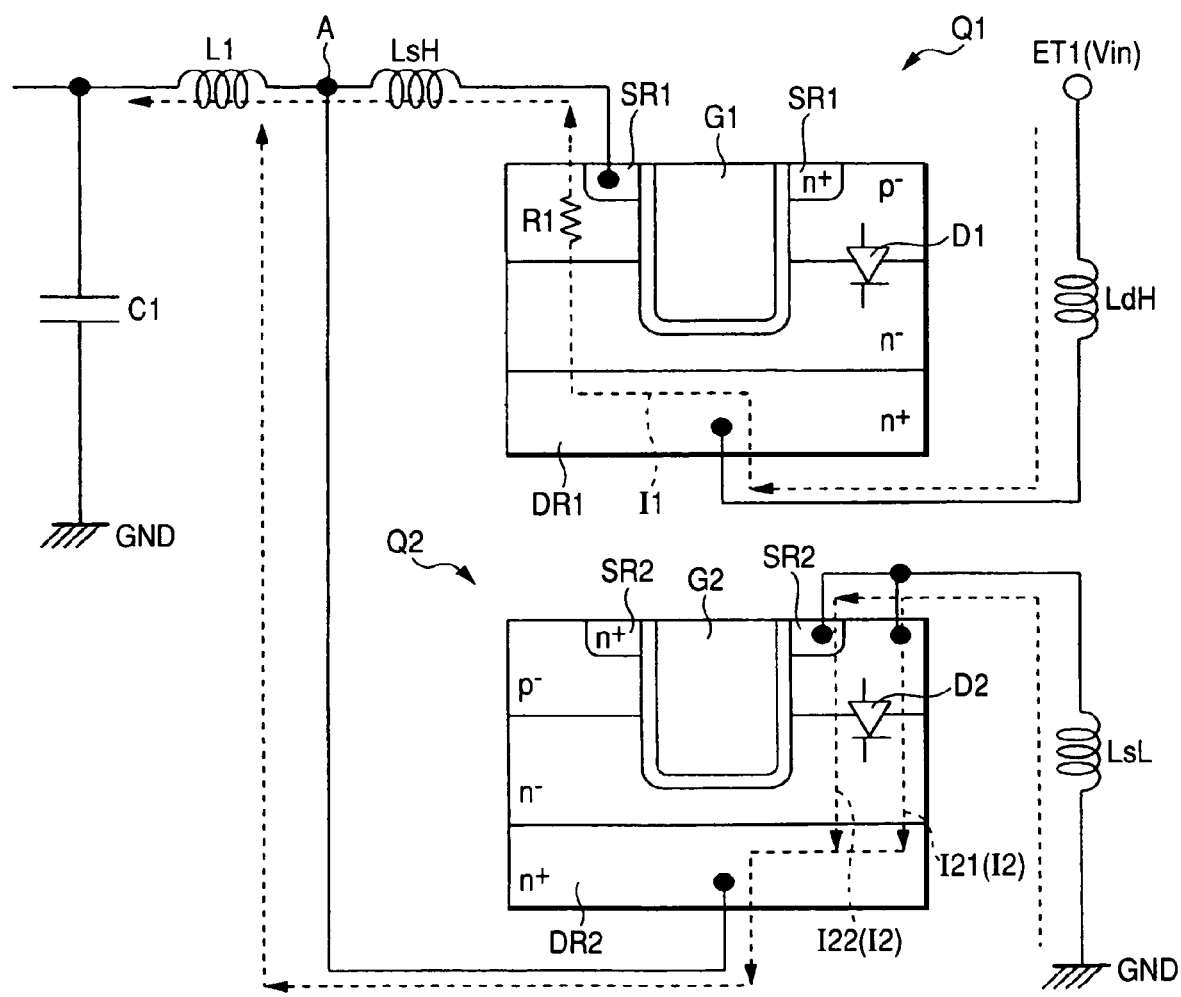
FIG. 6 is a diagram for describing a device section at the circuit operation of FIG. 5.

When the gate voltage of the first field effect transistor Q1 for the high side switch exceeds a threshold voltage and a current (first current) I1 starts to flow from a drain region DR1 of the first field effect transistor Q1 to a source region SR1 thereof, a back electromotive force (LsH×di/dt) occurs due to the parasitic inductance LsH, and a source potential of the first field effect transistor Q1 for the high side switch becomes higher than at points A of FIGS. 4, 5 and 6. Since the gate voltage of the first field effect transistor Q1 is supplied from a driver circuit 3a with the point A as the reference, the voltage applied between a gate region G1 and the source region SR1 of the first field effect transistor Q1 for the high side switch becomes lower than a gate voltage VgH. Thus, since a channel resistance R1 of the first field effect transistor Q1 for the high side switch is not sufficiently lowered, the loss of the current I1 occurs. That is, the turn-on time becomes long. The reason why the turn-on loss and turn-off loss increase with the increase in power and frequency as described above, is that the back electromotive force (LsH×di/dt) increases with the increase in power and frequency.

Since the first field effect transistor Q1 for the high side switch has a switch function for storing energy in the coil L1 that supplies power to the output (input of load circuit 4) of the non-insulated type DC-DC converter 1, the speeding up of a switching operation is required upon the increase in frequency. Since, however, the parasitic inductance LgH occurs between the first control circuit 3a and the first field effect transistor Q1, the switching operation becomes slow. That is, a switching loss is produced so that the efficiency of voltage conversion is degraded.

On the other hand, the second field effect transistor Q2 for the low side switch is configured so as not to produce such a switching loss as mentioned above. That is, when the first field effect transistor Q1 for the high side switch is turned off, a current (second current) I21 flows from a reference potential GND to a drain region DR2 of the second field effect transistor Q2 through a parasitic diode D2 connected in parallel to the second field effect transistor Q2 for the low side switch. When a gate voltage VgL is applied to its corresponding gate region G2 of the second field effect transistor Q2 for the low side switch to turn on it in this condition, a current (third current) I22 flows from a source region SR2 of the second field effect transistor Q2 to the drain region DR2 through a channel region of the second field effect transistor Q2. However, the current I21 has already flown before its current flow, and the amount of change in current per unit time at the time that the current I22 flows, is small. This is because a back electromotive force produced due to a parasitic inductance LsL is negligibly small and does not lead to a substantial loss.

Since the current (second current) I21 flows on ahead through the parasitic diode D2 connected in parallel to the second field effect transistor Q2 for the low side switch, the switching loss is almost negligible in the second field effect transistor Q2 for the low side switch. On the other hand, a parasitic diode D1 exists even in the first field effect transistor Q1 for the high side switch in a manner similar to above. However, the parasitic diodes D1 and D2 have anodes formed over their corresponding source SR1 and SR2 sides of the first and second field effect transistors Q1 and Q2 respectively and have cathodes formed over their corresponding drain region DR1 and DR2 sides of the first and second field effect transistors Q1 and Q2 respectively. Therefore, the first field effect transistor Q1 for the high side switch is not formed in the same direction (forward direction) as the current (first current) that flows from the drain region DR1 of the first field effect transistor Q1 to the source region SR1 thereof. Thus, since no current flows through the first field effect transistor Q1 before the gate voltage VgH is applied thereto to turn on it, the amount of change in current per unit time is not reduced, so that a switching loss is produced.

The second field effect transistor Q2 is of a rectifying transistor of the non-insulated type DC-DC converter 1 and has the function of lowering the resistance thereof in sync with the frequency sent from the control circuit 2. Therefore, a loss produced due to the on resistance, rather than the switching loss becomes remarkable since the on time of the second field effect transistor Q2 is longer than that of the first field effect transistor Q1. Thus, there is a need to reduce the on resistance. Since, however, the parasitic inductance LsL occurs between the second field effect transistor Q2 and a terminal (second power supply terminal) supplied with a reference potential GND, the on resistance increases and the efficiency of current conversion is degraded.

Figure 7:
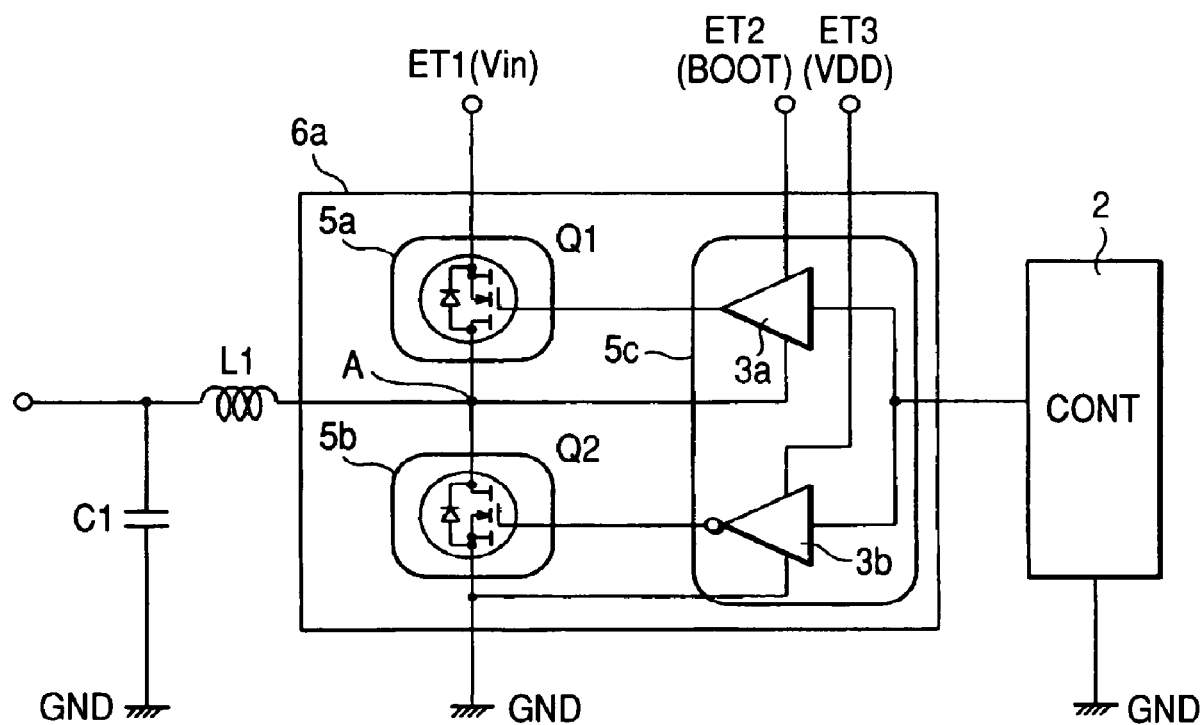
FIG. 7 is a diagram for describing one example of a configuration of the semiconductor device shown in FIG. 1.

With the main objective of avoiding the problem that the efficiency of voltage conversion of the non-insulated type DC-DC converter is degraded due to the influences of the inductances LgH, LsH and LsL parasitized on the source side of the above first field effect transistor Q1 for high side switch, the second field effect transistor Q2 for the low side switch is formed in another semiconductor chip (second semiconductor chip) 5b different from a semiconductor chip (first semiconductor chip) 5a formed with the first field effect transistor Q1 for the high side switch as shown in FIG. 7 in the first embodiment. Since the driver circuits (first and second control circuits) 3a and 3b are alternately operated in sync with each other, the first and second control circuits 3a and 3b are formed in the same semiconductor chip (third semiconductor chip) 5c in terms of stability of the whole circuit operation.

Those semiconductor chips 5a, 5b and 5c are resin-encapsulated or molded in the same package 6a. Thus, wiring inductances can be reduced. Further, the non-insulated type DC-DC converter 1 can be small-sized. If attention is paid to the wiring inductance alone here, then the first field effect transistors Q1 for the high side switch and the second field effect transistor Q2 for the low side switch may also preferably be formed in the semiconductor chip 5c. However, when they are formed in one semiconductor chip, a manufacturing process becomes complex and their element characteristics are not brought out sufficiently. Therefore, a problem also arises in that time is taken for their manufacture and the cost increases. Since the second field effect transistor Q2 for the low side switch is longer in on time than the first field effect transistor Q1 for the high side switch, the second field effect transistor Q2 is easy to generate heat. Thus, there is also a fear that if the second field effect transistor Q2 for the low side switch is formed in the same semiconductor chip as the first field effect transistor Q1 for the high side switch, heat generated at the operation of the second field effect transistor Q2 for the low side switch exerts an adverse effect on the first field effect transistor Q1 for the high side switch through a semiconductor substrate. In the present embodiment even from such a viewpoint, the semiconductor chip 5a formed with the first field effect transistor Q1 for the high side switch, the semiconductor chip 5b formed with the second field effect transistor Q2 for the low side switch, and the semiconductor chip 5c formed with the first and second control circuits 3a and 3b are formed in their corresponding discrete semiconductor chips in parts. Thus, the manufacturing process of the non-insulated type DC-DC converter 1 can be facilitated as compared with the case in which the first field effect transistor Q1 for the high side switch, the second field effect transistor Q2 for the low side switch and the first and second control circuits 3a and 3b are formed in the same semiconductor chip. It is therefore possible to bring out the element characteristics sufficiently. Therefore, the time required to manufacture the non-insulated type DC-DC converter 1 can be shortened and the cost for its manufacture can be reduced. Since the first field effect transistor Q1 for the high side switch and the first and second control circuits 3a and 3b can be prevented from being adversely affected by the heat generated at the operation of the second field effect transistor Q2 for the low side switch, the stability of operation of the non-insulated type DC-DC converter 1 can be improved.

The present inventors have found out that the parasitic inductances cannot be sufficiently reduced by merely placing the three semiconductor chips 5a, 5b and 5c in their corresponding die pads 7a1, 7a2 and 7a3 and resin-encapsulating them in the same package 6a to improve the efficiency of voltage conversion. A specific configurational example of the non-insulated type DC-DC converter 1 according to the first embodiment shown in FIG. 7 will be explained with reference to FIGS. 8 through 20.

Figure 8:
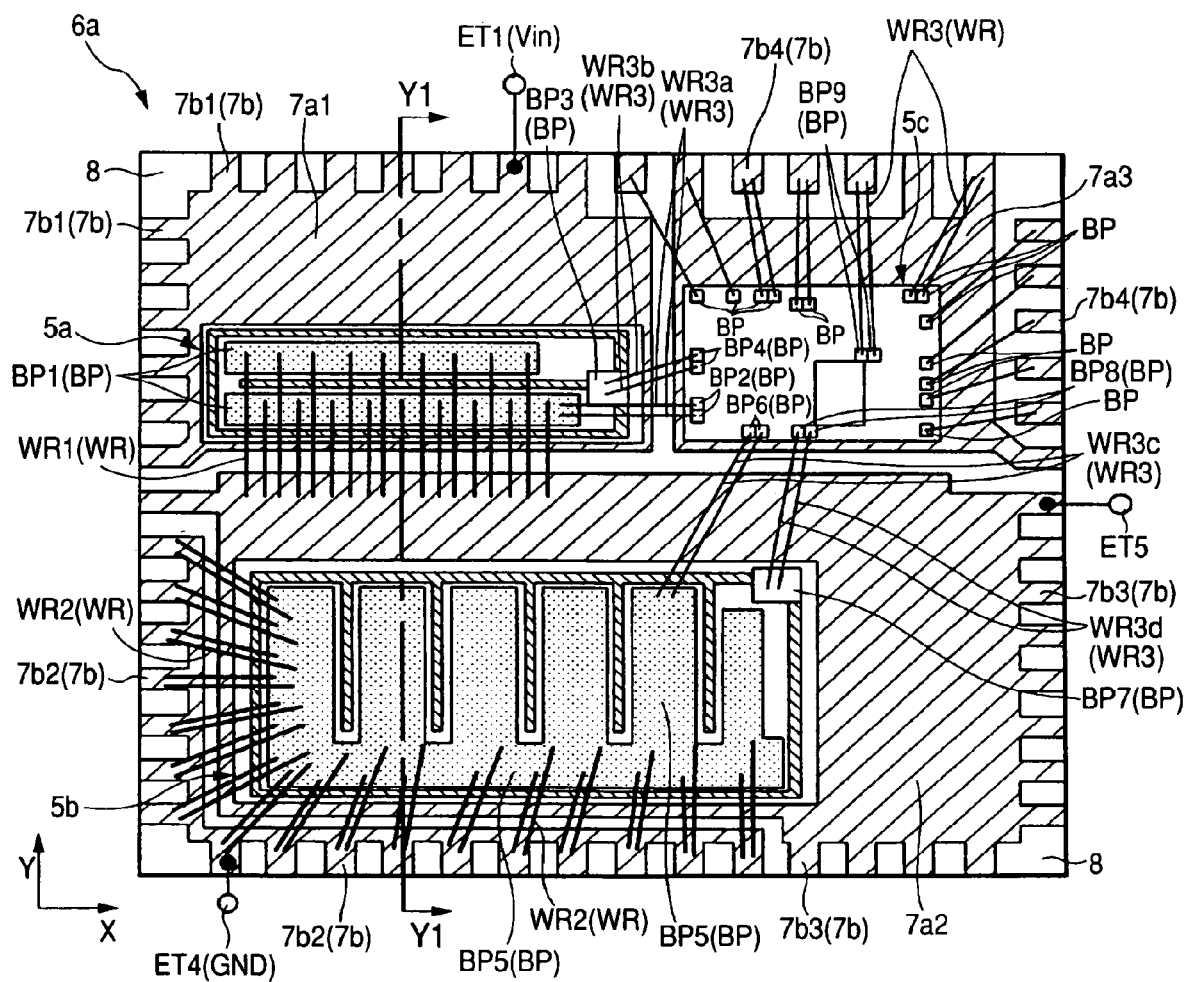
FIG. 8 is a plan view showing one example of a package configuration of the semiconductor device shown in FIG. 1.
Figure 9:
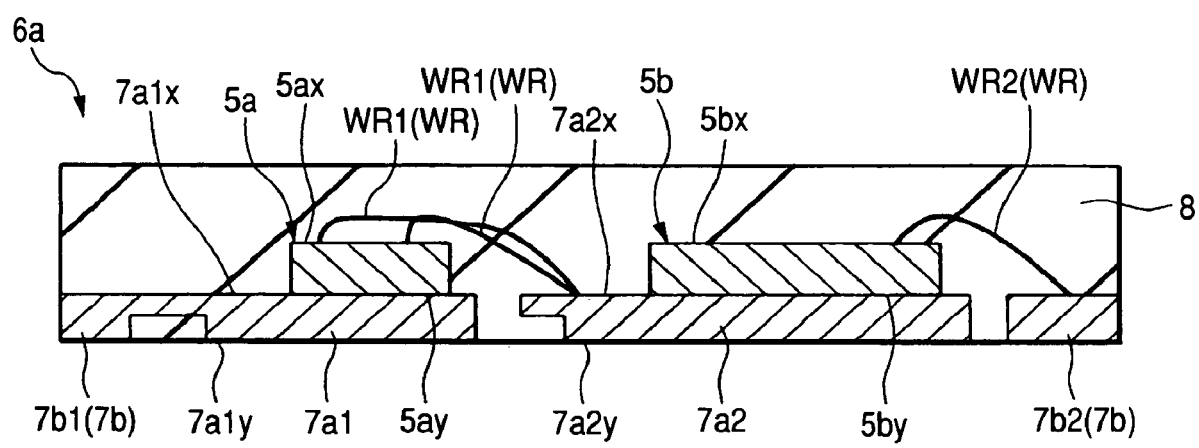
FIG. 9 is a cross-sectional view taken along line Y1-Y1 of FIG. 8.
Figure 10:
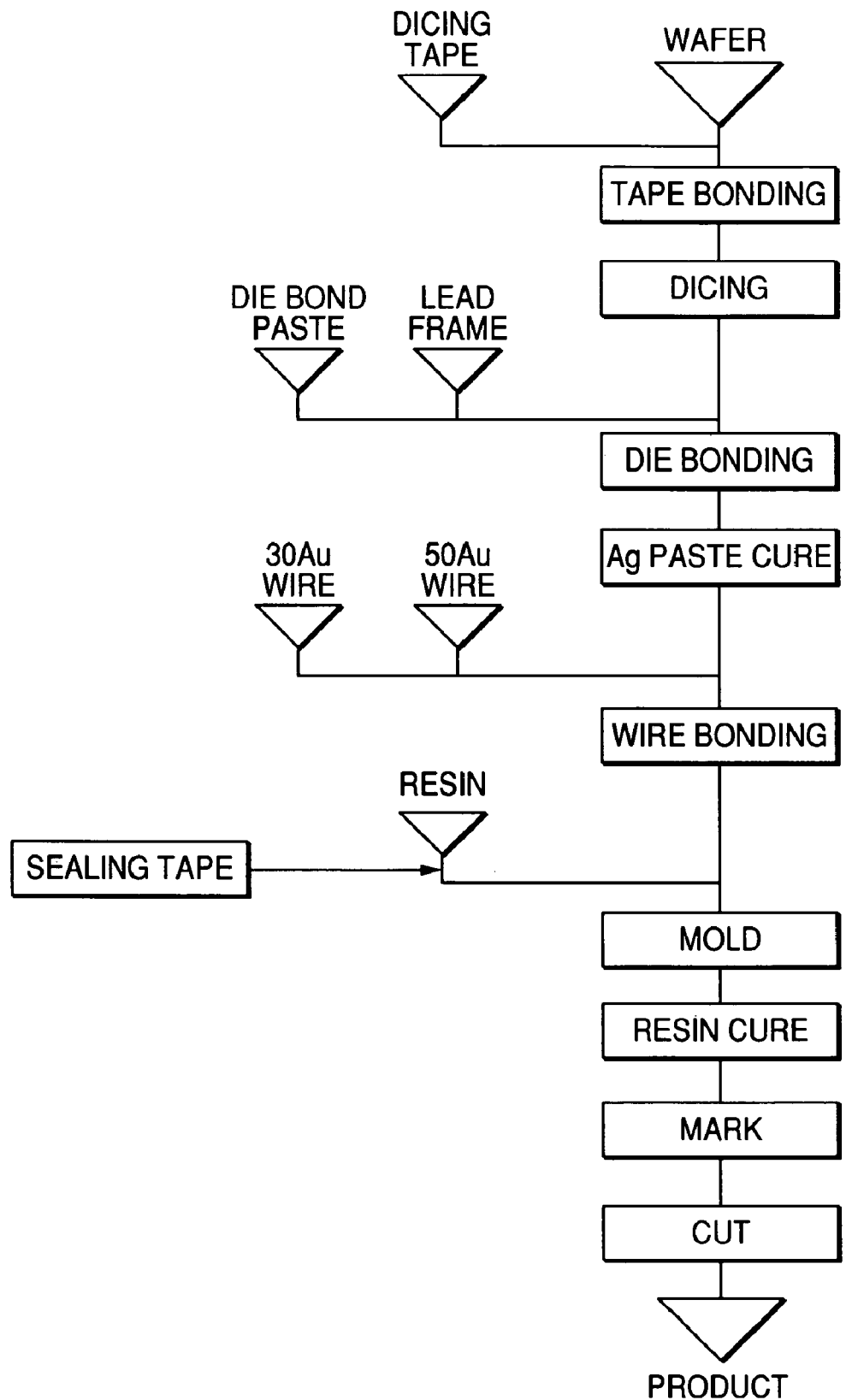
FIG. 10 is an assembly flow diagram showing a method for manufacturing the semiconductor device according to the first embodiment of the present invention.
Figure 11:
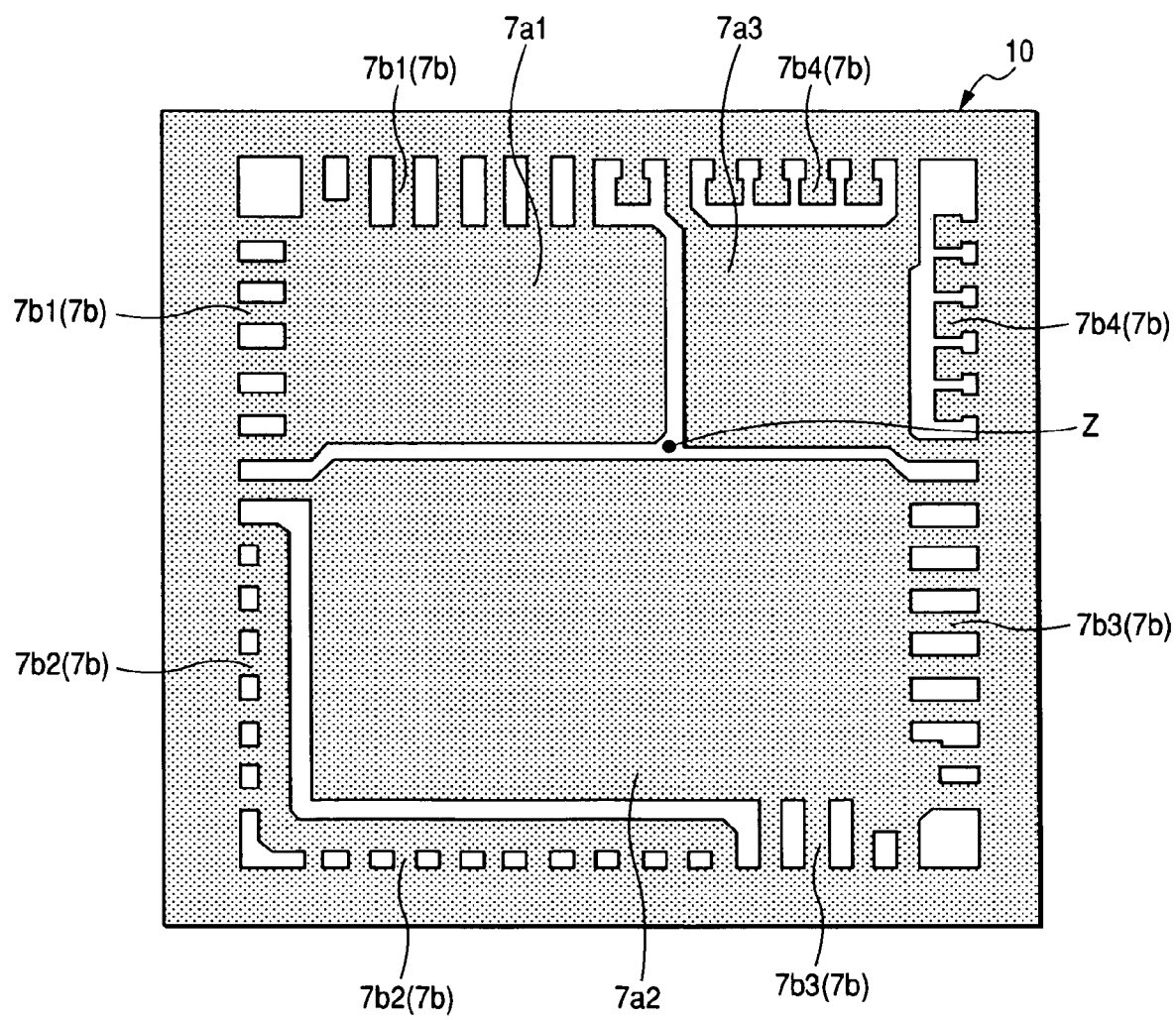
FIG. 11 is a plan view illustrating one example of a unit area of a lead frame of the semiconductor device according to the first embodiment of the present invention.
Figure 12:
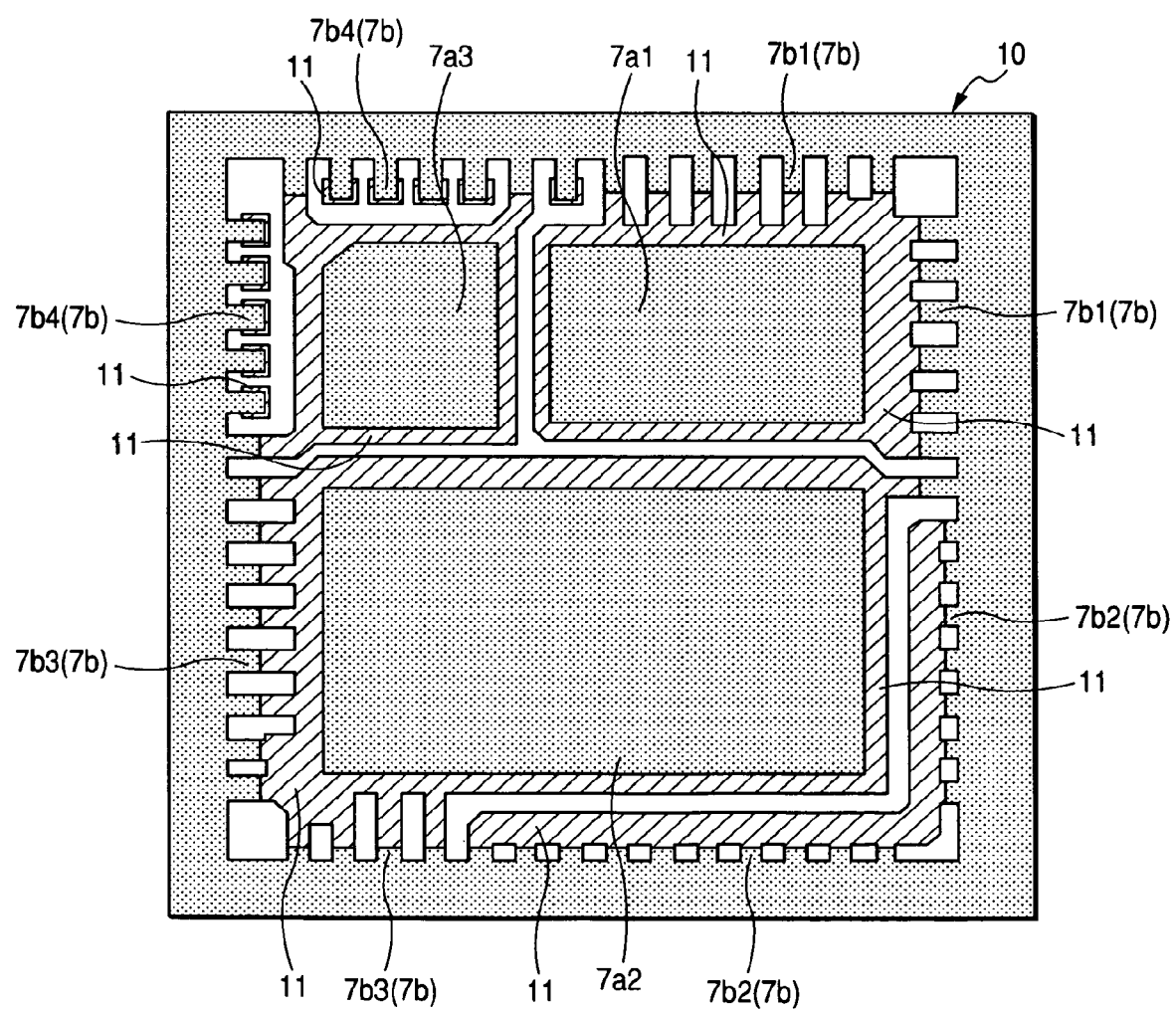
FIG. 12 is a plan view depicting the back surface of the unit area of the lead frame shown in FIG. 11.
Figure 13:
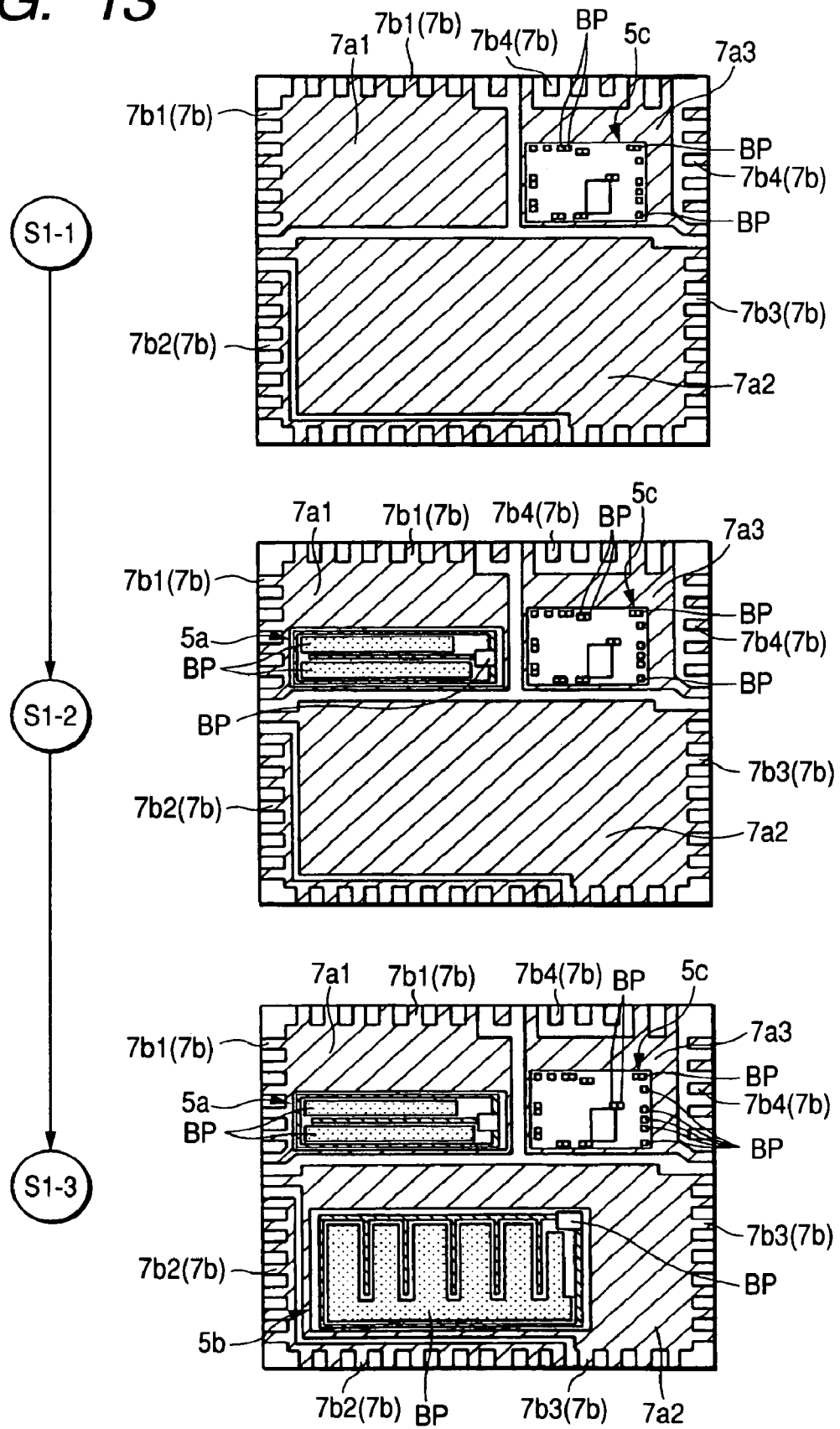
FIG. 13 is a plan view of the unit area of the lead frame, showing one example of an assembled state associated with steps of the assembly flow diagram shown in FIG. 10.
Figure 14:
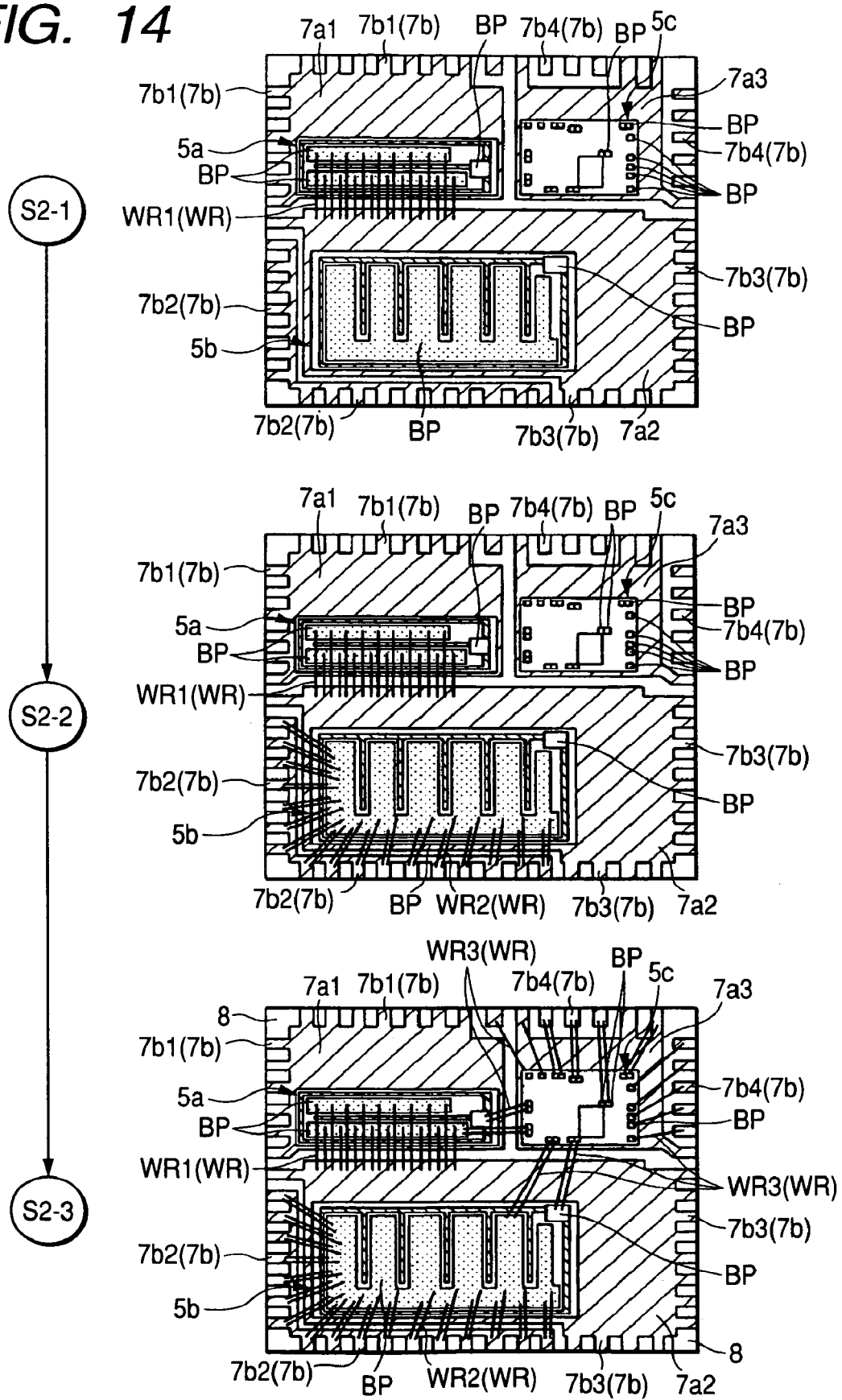
FIG. 14 is a plan view of the unit area of the lead frame, showing one example of an assembled state associated with steps of the assembly flow diagram shown in FIG. 10.
Figure 15:
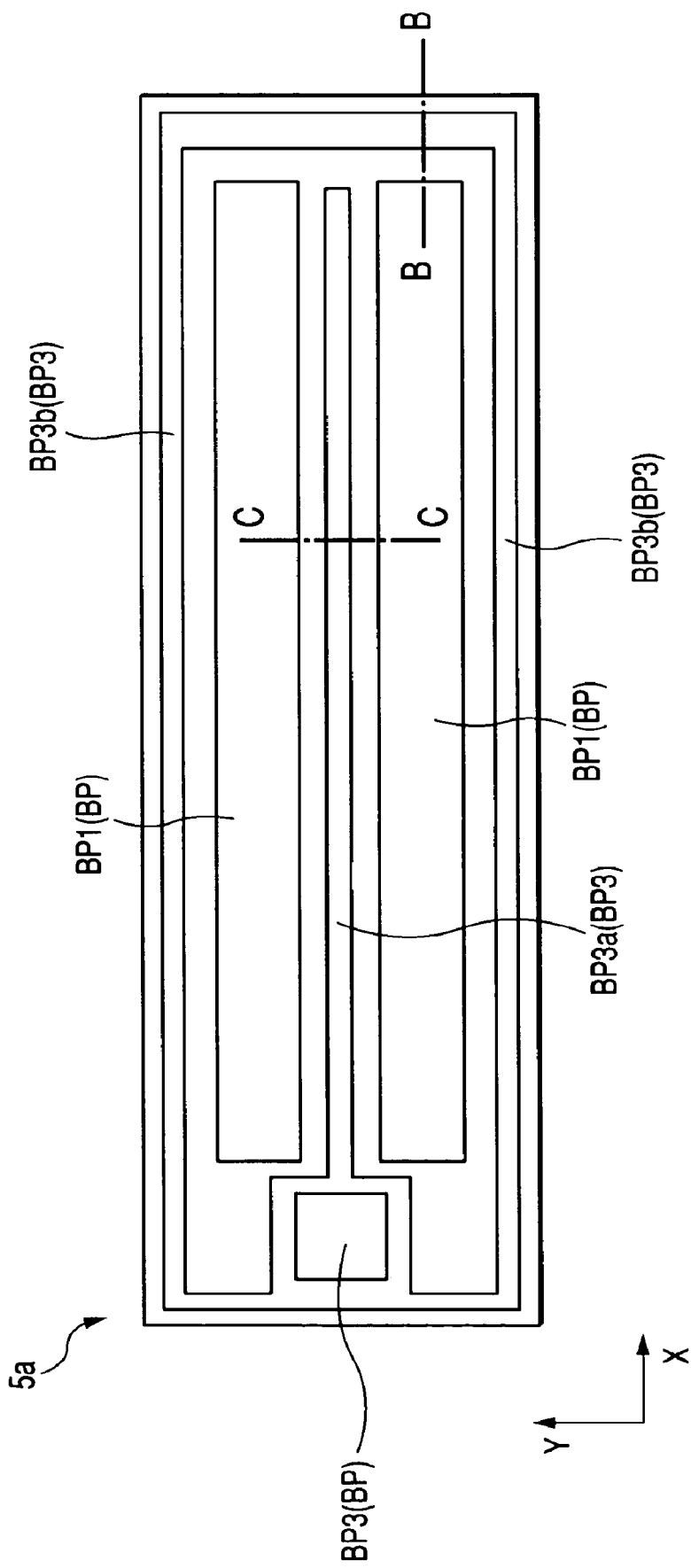
FIG. 15 is an enlarged plan view showing a semiconductor chip formed with a power MOS•FET on the high side, which is employed in the first embodiment of the present invention.
Figure 16:
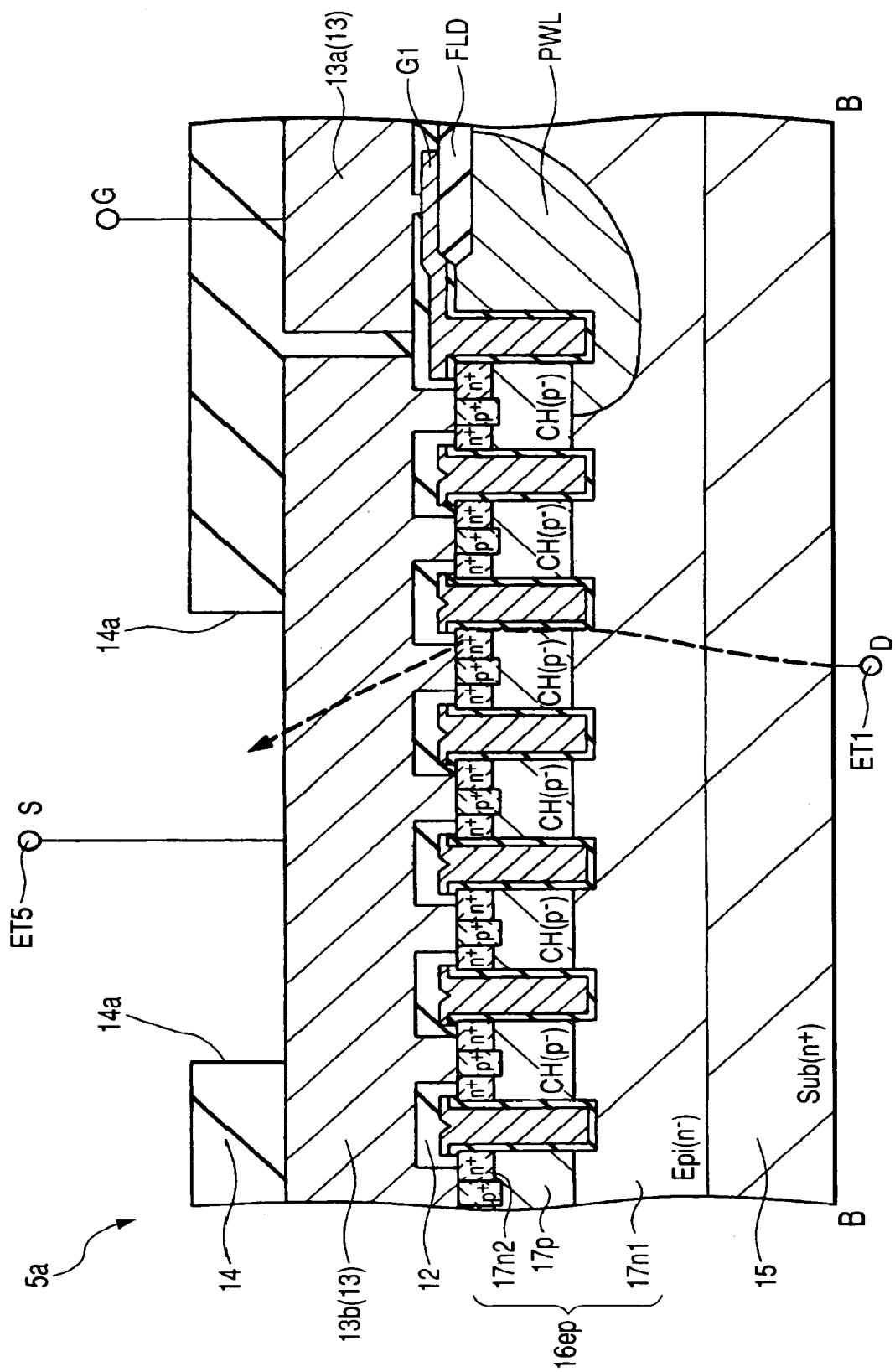
FIG. 16 is a cross-sectional view taken along line B-B of FIG. 15.
Figure 17:
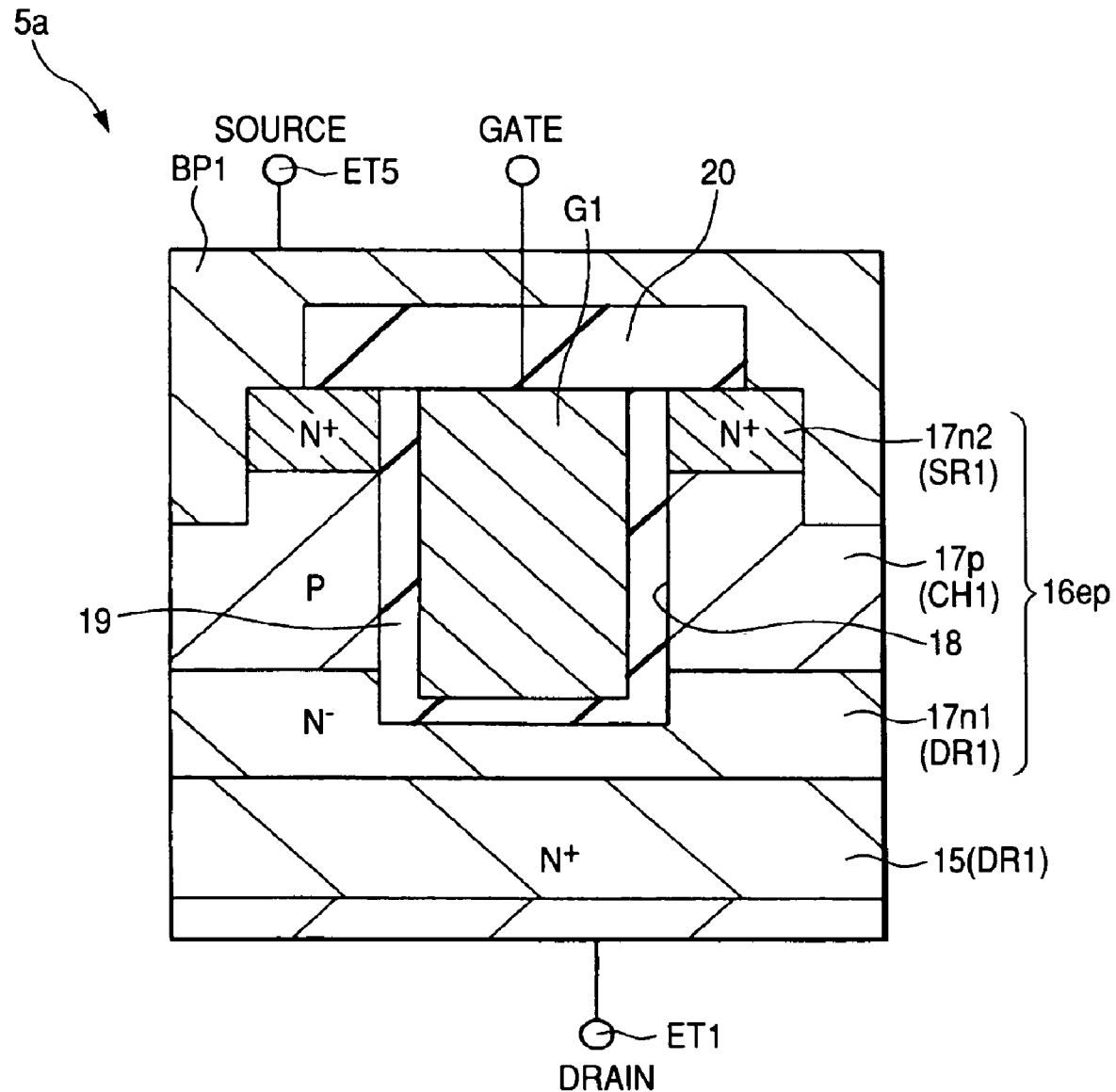
FIG. 17 is a fragmentary enlarged cross-sectional view of the semiconductor chip of the semiconductor device shown in FIG. 16.
Figure 18:
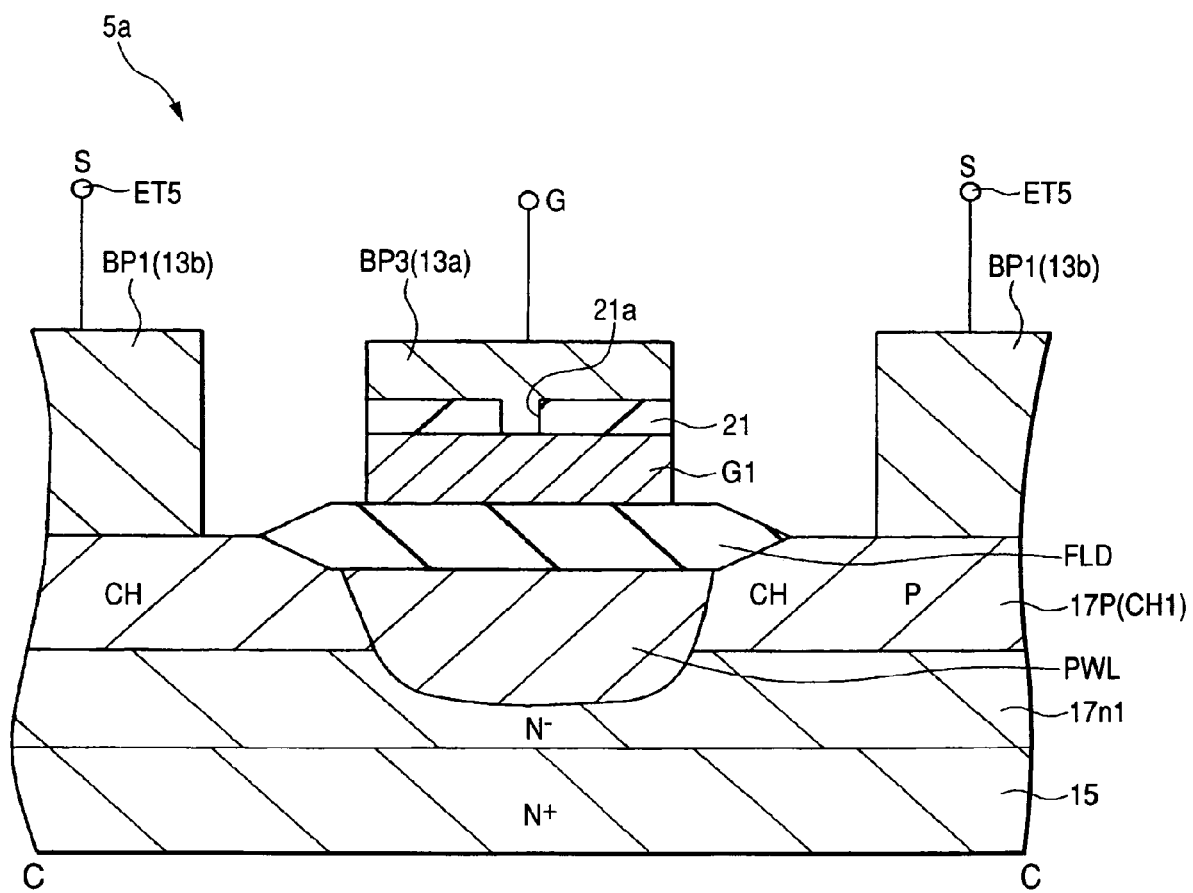
FIG. 18 is a cross-sectional view taken along line C-C of FIG. 15.
Figure 19:
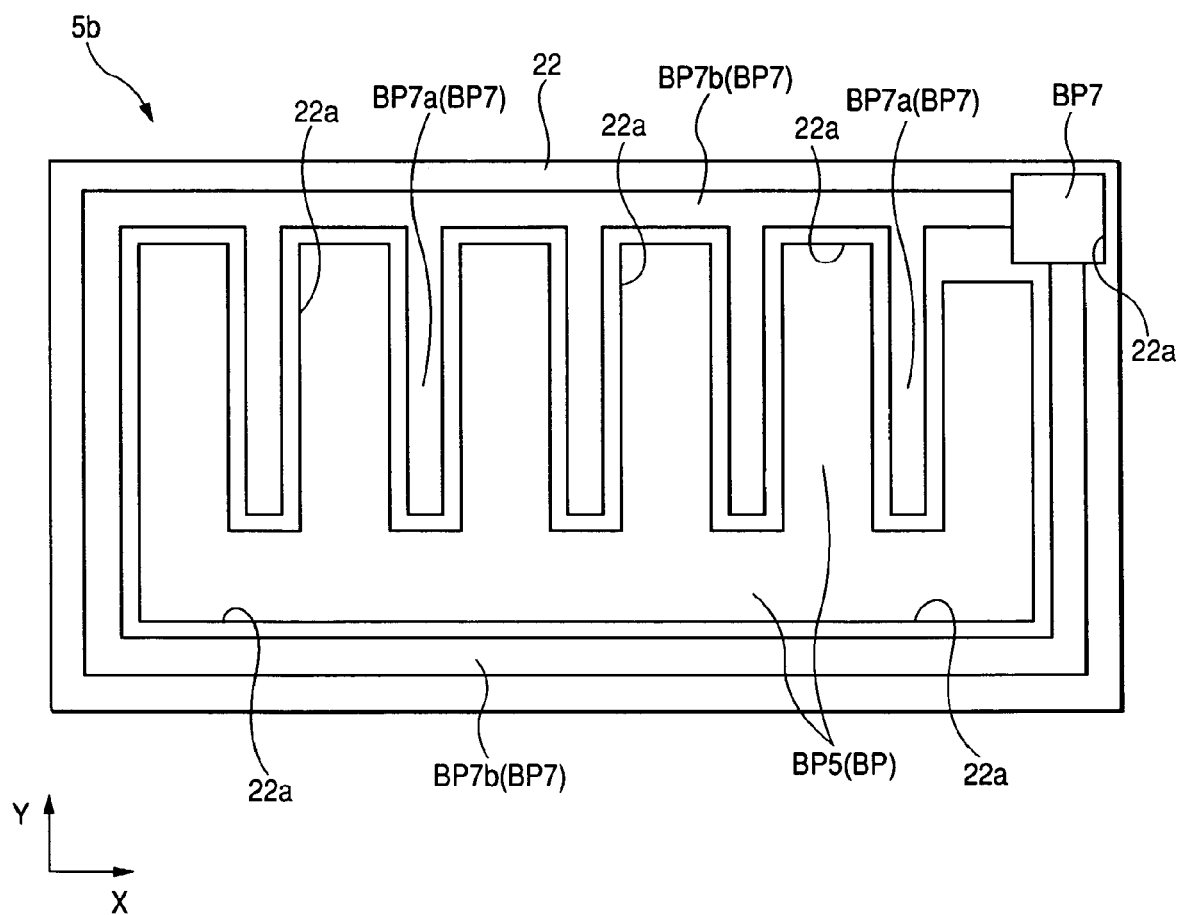
FIG. 19 is an enlarged plan view showing a semiconductor chip formed with a power MOS•FET on the low side, which is employed in the first embodiment of the present invention.
Figure 20:
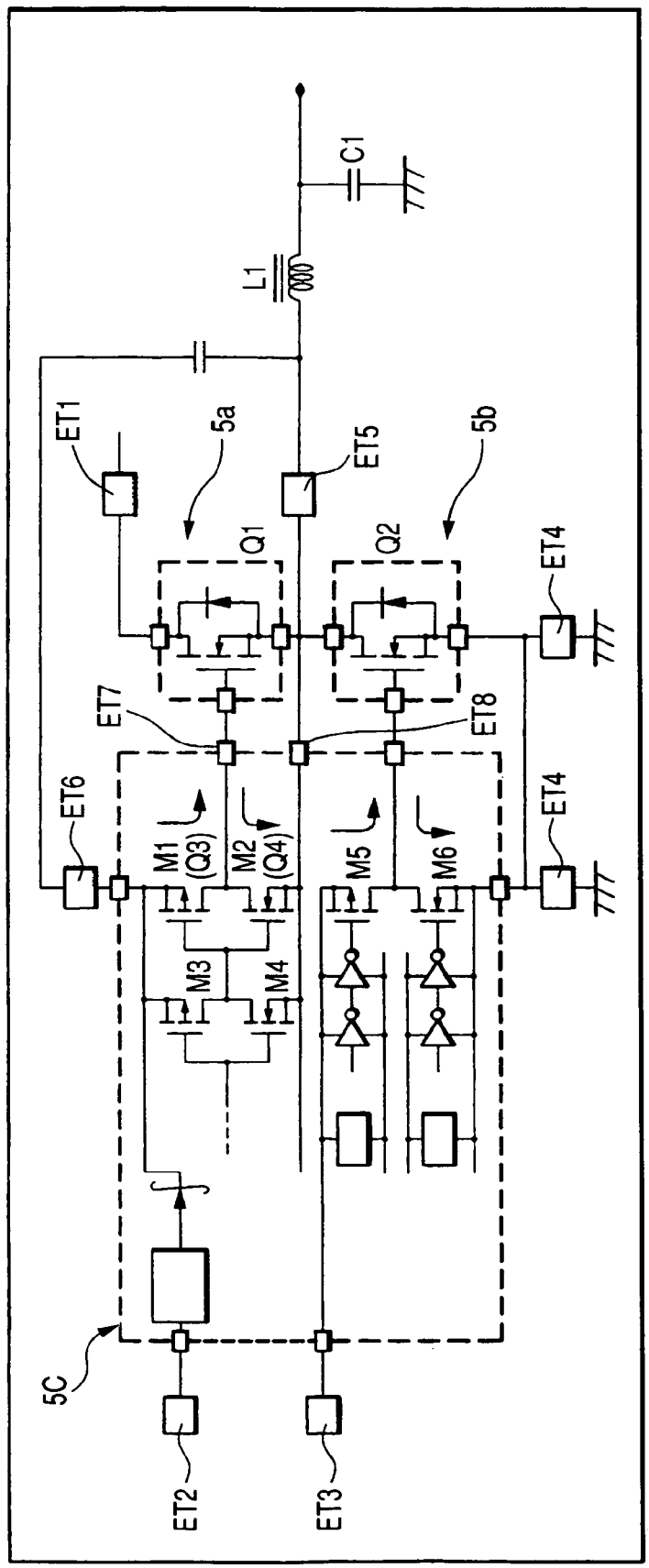
FIG. 20 is a circuit configuration diagram illustrating control circuits of the semiconductor device shown in FIG. 1.
Figure 21:
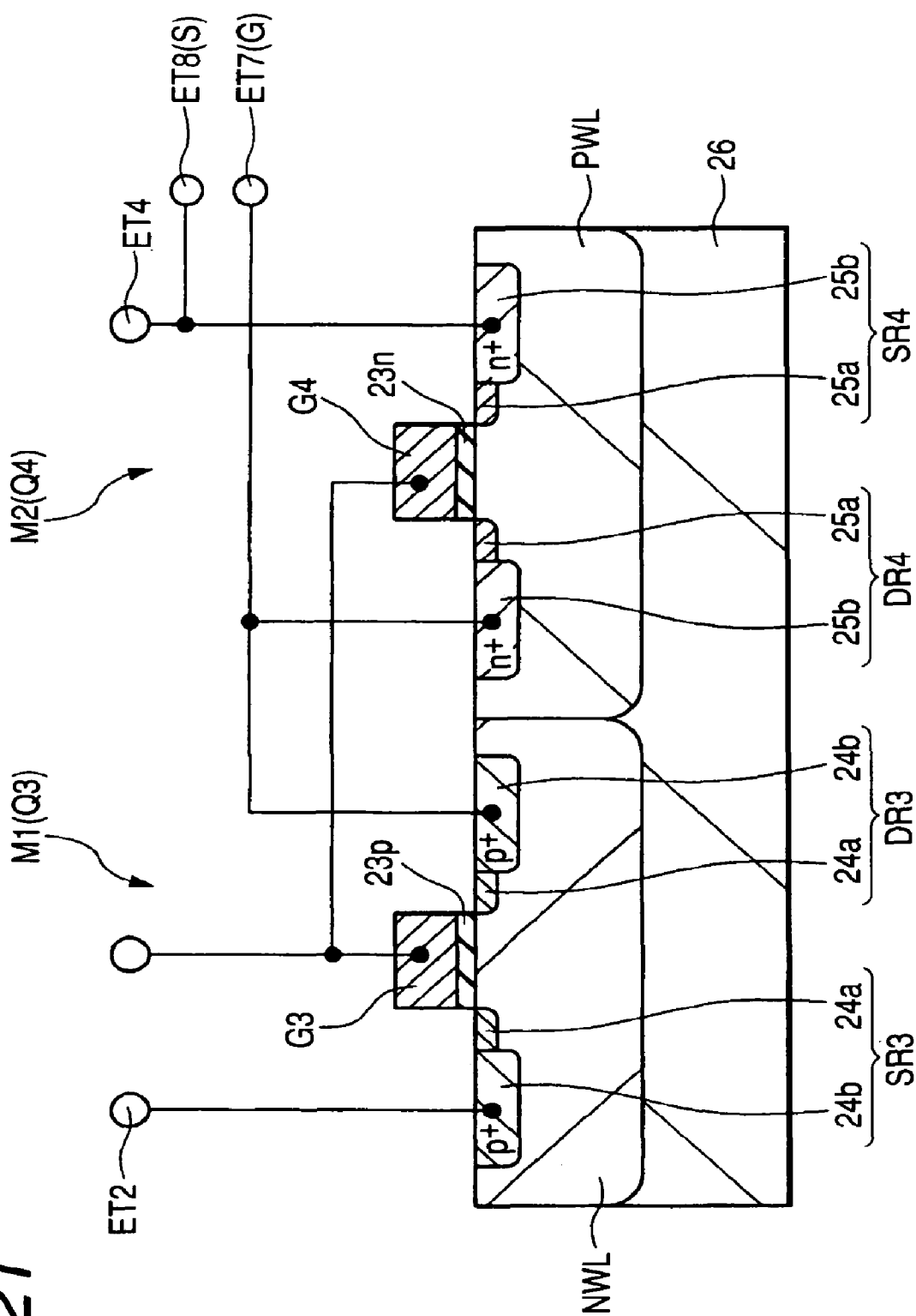
FIG. 21 is a diagram for describing a section of the control circuit of the semiconductor device shown in FIG. 1.

FIG. 8 is a plan view showing a configurational example of the package 6a including some circuits of the non-insulated type DC-DC converter 1, FIG. 9 is a cross-sectional view taken along line Y1-Y1 of FIG. 8, FIG. 10 is an assembly flow diagram showing a method for manufacturing the semiconductor device shown in FIG. 8, FIG. 11 is a plan view showing a unit area of a lead frame, FIG. 12 is a plan view showing the back surface of the lead frame shown in FIG. 11, FIG. 13 is a plan view of the unit area of the lead frame, showing one example of an assembled state associated with a die bonding step of the assembly flow diagram shown in FIG. 10, and FIG. 14 is a plan view of the unit area of the lead frame, showing one example of an assembled state associated with a wire bonding step of the assembly flow diagram shown in FIG. 10, respectively. FIG. 15 is an enlarged plan view showing the semiconductor chip 5a shown in FIG. 8, FIG. 16 is a cross-sectional view taken along line B-B of FIG. 15, FIG. 17 is a fragmentary enlarged cross-sectional view of the semiconductor chip 5b shown in FIG. 8, FIG. 18 is a cross-sectional view taken along line C-C of FIG. 15, FIG. 19 is an enlarged plan view of the semiconductor chip 5b, FIG. 20 is an output-stage circuit configurational view of the semiconductor chip 5c of FIG. 8, and FIG. 21 is a fragmentary cross-sectional view of the semiconductor chip 5c shown in FIG. 8, respectively. Incidentally, FIG. 8 is shown excepting the semiconductor chips 5a, 5b and 5c, die pads 7a1, 7a2 and 7a3 and a resin molding or encapsulation body 8 on each lead 7b to make it easy to see the drawings. Further, the die pads 7a1, 7a2 and 7a3, and leads 7b are given hatching.

The package 6a according to the first embodiment is set to, for example, a QFN (Quad Flat Non-leaded package) configuration. However, the package is not limited to the QFN but can be changed in various ways. The package may be set as flat package configurations like, for example, a QFP (Quad Flat Package), an SOP (Small Out line Package), etc. The package 6a has three die pads (chip mounting members) 7a1, 7a2 and 7a3, a plurality of leads (external terminals and inner leads) 7b1, 7b2, 7b3 and 7b4, bonding wires (hereinafter simply called wires) WR, and an encapsulating member (resin encapsulation body) 8. The die pad (first tab and first chip mounting section) 7a1, the die pad (second tab and second chip mounting section) 7a2, the die pad (third tab and third chip mounting section) 7a3 and the plural leads 7b (7b1, 7b2, 7b3 and 7b4) are respectively formed of a metal such as an alloy. The wires WR is made up of, for example, gold (Au) or the like. The encapsulating member is formed of, for example, an epoxy resin.

As shown in FIG. 8, the die pads 7a1, 7a2 and 7a3 are respectively rectangular in shape and placed at predetermined intervals, and constitute lead frames together with the plurality of leads 7b. The semiconductor chip 5a is placed (mounted) over the upper left die pad 7a1 of FIG. 8 so as to approach one side of the die pad 7a1 adjacent to one side the die pad 7a2 in a state in which the main surface of the semiconductor chip 5a is being turned up. The first field effect transistor Q1 for the high side switch is formed in the main surface of the semiconductor chip 5a as described above. A plurality of bonding pads (hereinafter simply called pads) BP are disposed in the main surface of the semiconductor chip 5a as external terminals that draw or take out electrodes for various circuits. Placing the semiconductor chip 5a so as to approach the die pad 7a2 in this way makes it possible to reduce the parasitic impedance LsH produced between the source of the first field effect transistor Q1 and the drain of the second field effect transistor Q2. The semiconductor chip 5b is placed over the relatively largest die pad 7a2 on the lower side of FIG. 8 so as to approach the corner of the die pad 7a2 closer to a second power supply terminal (terminal ET4 and plural leads 7b2 disposed along an L-letter line) than an output terminal in a state in which its main surface is being turned up. The second field effect transistor Q2 for the low side switch is formed over the main surface of the semiconductor chip 5b as described above. A plurality of electrode pads BP are disposed over the main surface of the semiconductor chip 5b as external terminals that take out electrodes for various circuits. Placing the semiconductor chip 5b so as to approach the corner of the second power supply terminal in this way makes it possible to shorten a wiring length of each wire WR formed between the source of the second field effect transistor Q2 and the second power supply terminal. It is thus possible to reduce a wiring resistance of each wire WR and further build up or strengthen a reference potential GND. Further, the semiconductor chip 5c is disposed over the upper right die pad 7a3 of FIG. 8 in such a manner that the distance between the semiconductor chip 5c and the semiconductor chip 5a becomes shorter than the distance between the semiconductor chip 5c and the semiconductor chip 5b in a state in which its main surface is being turned up. The first and second control circuits 3a and 3b are formed over the main surface of the semiconductor chip 5c as described above. A plurality of electrode pads BP are disposed over the main surface of the semiconductor chip 5c as external terminals that take out or draw electrodes for various circuits. Placing the semiconductor chip 5c in such a manner that the distance between the semiconductor chip 5c and the semiconductor chip 5a becomes shorter than the distance between the semiconductor chip 5c and the semiconductor chip 5b in this way makes it possible to reduce an inductance LgH produced between the gate of the first field effect transistor Q1 and the semiconductor chip 5c and improve a switching loss. By placing these semiconductor chips 5a, 5b and 5c in their corresponding predetermined positions of the die pads 7a1, 7a2 and 7a3, the efficiency of voltage conversion can be enhanced as compared with the simple placement of the semiconductor chips 5a, 5b and 5c in their corresponding die pads 7a1, 7a2 and 7a3. Incidentally, the semiconductor chips 5a, 5b and 5c are respectively different in outer size (area) from the difference in characteristic. The outer size of the semiconductor chip 5a is formed larger than that of the semiconductor chip 5c, whereas the outer size of the semiconductor chip 5b is formed larger than that of the semiconductor chip 5a. The plurality of electrode pads BP are respectively formed of, for example, a metal like aluminum or the like. The semiconductor chip 5c has first and second control circuits 3a and 3b. Since the first and second control circuits 3a and 3b are respectively of control circuits which control the gates of the first and second field effect transistors Q1 and Q2, the outer size of each element may preferably be set as small as possible in consideration of the size of the whole package. On the other hand, since the currents I1 and I2 flow through the first and second field effect transistors Q1 and Q2, an on resistance developed in each transistor may preferably be reduced as much as possible. In order to reduce the on resistance, its reduction can be realized by extending a channel width per unit cell area. To this end, the outer sizes of the semiconductor chips 5a and 5b are formed larger than the outer size of the semiconductor chip 5c. Further, as shown in FIG. 3, the second field effect transistor Q2 for the low side switch is longer in on time than the first field effect transistor for the high side switch. Therefore, there is a need to further reduce the on resistance of the second field effect transistor Q2 for the low side switch as compared with the on resistance of the first field effect transistor Q1 for the high side switch. Thus, the outer size of the semiconductor chip 5b is formed larger than the outer size of the semiconductor chip 5a.

The electrode pads BP of the semiconductor chips 5a, 5b and 5c are electrically connected to their corresponding parts through the wires WR. Of the electrode pads BP, for example, the corresponding source electrode pad BP1 connected to the source of the first field effect transistor Q1 of the semiconductor chip 5a is electrically connected to the die pad 7a1 through plural wires WR and electrically connected to the electrode pad BP2 electrically connected to the source of the first field effect transistor Q1, of the plurality of electrode pads BP of the semiconductor chip 5c. The gate electrode pad BP3 connected to the gate of the first field effect transistor Q1 of the semiconductor chip 5a is electrically connected to its corresponding electrode pad BP4 electrically connected to the gate of the first field effect transistor Q1, of the plural electrode pads BP of the semiconductor chip 5c through plural wires WR. The source electrode pad BP5 connected to the source of the second field effect transistor Q2 of the semiconductor chip 5b is electrically connected to plural leads (second power supply terminal) 7b2 through plural wires WR and electrically connected to the electrode pad BP6 electrically connected to the source of the second field effect transistor Q2, of the plurality of electrode pads BP of the semiconductor chip 5c. The gate electrode pad BP7 connected to the gate of the second field effect transistor Q2 of the semiconductor chip 5b is electrically connected to its corresponding electrode pad BP8 electrically connected to the gate of the second field effect transistor Q2, of the plural electrode pads BP of the semiconductor chip 5c. The plural leads 7b2 are supplied with the reference potential GND through the terminal ET4. The respective back surfaces of the semiconductor chips 5a and 5b are configured as drain electrodes connected to the drains of the first and second field effect transistors and electrically connected to the die pads 7a1 and 7a2. The die pad 7a1 is electrically connected to the leads 7b1 formed integrally with it. The leads 7b1 are electrically connected to their corresponding terminal ET1 supplied with an input power supply potential Vin. The die pad 7a2 is electrically connected to leads 7b3 formed integrally with it. The leads 7b3 is electrically connected to their corresponding output terminal ET5 that supplies an output power supply potential to the outside. The coil L1 is electrically connected to the terminal ET5. Incidentally, for example, ultrasonic thermocompression bonding is used in wire bonding for the wires WR. Therefore, since there is a fear that if an ultrasonic wave is not successfully transferred to bonding portions of the die pads 7a1, 7a2 and 7a3, then a bonding failure will occur, the wiring bonding is made in avoidance of a half etch area as shown in FIG. 9. It is thus possible to suppress the bonding failure.

Although the semiconductor chips 5a, 5b and 5c and the wires WR are sealed with the resin encapsulation body 8, the back surfaces (surfaces on the sides opposite to the chip mounting sections) of the die pads 7a1, 7a2 and 7a3 and some of the plural leads 7b are exposed to the outside. Heat generated when the semiconductor chips 5a, 5b and 5c are operated, is radiated from the back surfaces of the semiconductor chips 5a, 5b and 5c to the outside through the die pads 7a1, 7a2 and 7a3 as viewed from their back surface sides. The respective die pads 7a1, 7a2 and 7a3 are formed larger than the areas of the semiconductor chips 5a, 5b and 5c. It is thus possible to improve dissipation of the non-insulated type DC-DC converter 1. Incidentally, the back surfaces (surfaces on the sides opposite to the surfaces over which the semiconductor chips 5a, 5b and 5c are mounted) of the die pads 7a1, 7a2 and 7a3, and the back surfaces (surfaces on the sides opposite to the surfaces to which the wires WR are connected, and joint surfaces bonded to terminals of a wiring board) of the leads 7b also exist in the mounting surface (surface opposite to the wiring board when the package 6a is mounted over the wiring board) of the package 6a in such a structure.

A method for manufacturing the semiconductor device according to the first embodiment will next be described using the assembly flow diagram shown in FIG. 10.

First, a dicing tape is bonded onto a back surface of a semiconductor wafer. The semiconductor wafer is brought into fractionization by a dicing blade to divide it into individual semiconductor chips 5a, 5b and 5c.

On the other hand, a lead frame 10 is prepared which has die pads 7a1, 7a2 and 7a3 over which such semiconductor chips 5a, 5b and 5c as shown in FIGS. 11 and 12 are mountable, and a plurality of leads 7b placed therearound, and in which peripheral portions of the back surfaces of the die pads 7a1, 7a2 and 7a3 are formed thin by half etching processing or the like.

Next, a die bonding step is performed. The semiconductor chips 5a, 5b and 5c are fixedly secured to the surface sides of the die pads 7a1, 7a2 and 7a3 of the lead frame through a die bond material.

On the other hand, wires WR1 and WR2, which are 50 μm in thickness, for example and which electrically connect the electrodes of the semiconductor chips 5a and 5b and respective parts (leads and chip mounting sections) associated with the electrodes respectively, and wires WR3 which are 30 μm in thickness, for example and electrically connect the semiconductor chip 5c and its corresponding respective parts (leads and chip's electrodes) respectively.

Next, a wire bonding step is carried out. The semiconductor chips 5a, 5b and 5c and their corresponding respective parts are connected (crimped) using wires (metal thin lines) WR such as a gold line by an ultrasonic wave.

Thereafter, a resin encapsulating (mold) step is performed. At this time, an encapsulating or sealing tape is first disposed over the surface of a lower mold of a resin-molded die as shown in FIG. 10. Further, the lead frame 10 is placed over the sealing tape and thereafter the resin-molded die is clamped in such a manner that some of the plural leads 7b and the die pads 7a1, 7a2 and 7a3 are adhered onto the sealing tape. Incidentally, one having high viscosity greater than or equal to, for example, 0.5N as the adhesive strength or force of the sealing tape is used as the sealing tape.

Subsequently, an encapsulating resin is injected into an upper mold (cavity), and the semiconductor chips 5a, 5b and 5c and the plurality of wires WR are resin-sealed in such a manner that some of the die pads 7a1, 7a2 and 7a3 and some of the plurality of leads 7b are exposed from a resin encapsulation body 8 (sealing member) to thereby form the resin encapsulation body 8 (mold step).

Finally, the implanted sealing resin is cured (resin cure step). After execution of a mark step, product parts are divided from the lead frame 10.

In the first embodiment, the sealing tape is bonded to the back surface of the lead frame 10 prior to the resin sealing step in the assembly flow diagram shown in FIG. 10. This is done to prevent that in the resin sealing step of one having such a configuration that the plurality of die pads 7a1, 7a2 and 7a3 are provided within one package 6a as in the first embodiment, the leakage of a resin is apt to occur in an intersecting portion Z of slits that form a boundary among the three die pads 7a1, 7a2 and 7a3 shown in FIG. 11, the resin (resin burrs) intruded into the back surfaces (mounting surfaces at the time that the package 6a is packaged or mounted in the wiring board) of the die pads 7a1, 7a2 and 7a3 through the intersecting portion Z, interferes with the mounting of the package 6a to thereby incur a failure in packaging. Thus, in the first embodiment, the sealing tape is firmly bonded to the back surface sides (including the slits that form the boundary among the three die pads) of the three die pads prior to the sealing step so as not to cause the above resin leakage, thereby preventing the encapsulating resin from leaking to the back surfaces of the die pads 7a1, 7a2 and 7a3 through the intersecting portion Z or the like. It is therefore possible to prevent a failure in the mounting of the package 6a due to the resin burrs. Since it is preferable to firmly adhere the sealing tape to the die pads 7a1, 7a2 and 7a3 or the like upon the sealing step as described above, one capable of obtaining a high viscosity strength of, for example, 0.5N or more from such a viewpoint as the adhesive strength or force of the sealing tape is preferable as the sealing tape. On the other hand, a lead frame 10 given nickel (Ni)/palladium (Pd)/gold (Au) flush plating, for example, has recently been used. This is because the lead frame 10 given Pd (palladium) plating has the advantage that the use of lead-free solder can be realized and good in environment upon mounting the package 6a to the wiring board, and while the commonly-used lead frame needs to apply silver (Ag) paste onto wire bonding portions of the lead frame for the purpose of wiring bonding in advance, the present lead frame 10 has the advantage that wires can be connected even if such Ag paste is not applied. Since, however, a problem about the failure in packaging due to the above resin burrs arises even in the case of the Pd-plated lead frame 10, the removal of the resin burrs by a cleaning process or the like is carried out where the resin burrs are formed. However, the Pd-plated lead frame 10 is accompanied by a problem in that since the lead frame 10 is given plating prior to the resin sealing step to reduce the number of manufacturing process steps, the pre-plated Pd plating film is also peeled off when an attempt to peel away the resin burrs by the cleaning process or the like is made. That is, there is a possibility that the Pd-plated lead frame 10 cannot be used. In contrast, the first embodiment can prevent the formation of the resin burrs as described above and may not use a powerful cleaning process after the sealing step. Therefore, the Pd-plated lead frame 10 having the satisfactory effect referred to above can be used.

Next, the lead frame 10 having such a unit area as shown in FIGS. 11 and 12 is used in the first embodiment. As shown in FIG. 11, the die pads 7a1, 7a2 and 7a3 are respectively rectangular in shape and placed at predetermined intervals. The die pad 7a1 is electrically connected to its corresponding leads 7b1 formed integrally with it. The leads 7b1 are electrically connected to their corresponding terminal ET1 (first power supply terminal and first source or power supply potential) supplied with an input power supply potential Vin. The die pad 7a2 is electrically connected to its corresponding leads 7b3 formed integrally with it. The leads 7b3 are electrically connected to their corresponding output terminal ET5 (second power supply terminal and second source or power supply potential) that supplies an output power supply potential to the outside. A plurality of leads (second power supply terminal) 7b2 are formed so as to be connected in an L-shaped fashion along the periphery of the resin encapsulation body 8. Thus, since the volume increases as compared with division into the plural leads 7b owing to the formation of the leads 7b2 in the L form, a reference potential GND can be enhanced or stepped up. Further, a half etch area 11 is formed around the back surfaces of the die pads 7a1, 7a2 and 7a3 as shown in FIG. 12. Forming the half etch area 11 (area given oblique hatching) in this way makes it possible to strengthen adhesion between the lead frame 10 and the resin encapsulation body 8. That is, it is possible to suppress or prevent lead omission. In particular, the thickness of the lead frame is also getting thin with a demand for a reduction in thickness and weight of a semiconductor device. In addition to it, the leads 7b are thin as compared with other portions and their leading ends are in a floating state without being connected to other portions. Therefore, the lead portions might be deformed or peeled where resin encapsulation is carried out without execution of any means. Thus, the outer peripheral portions of the back surfaces of the leads 7b on the leading end sides thereof are also half-etched to form steps at the outer peripheries of the back surfaces of the leads 7b on their leading end sides. Thus, the encapsulating resin flows into the half-etched portions upon the sealing step and then covers the half-etched portions and holds down the tip outer peripheral portions of the leads 7b. It is therefore possible to suppress or prevent deformation and peeling of the leads 7b.

The die bonding step shown in FIG. 10 will be explained with reference to FIG. 13 using the lead frame 10. As shown in S1-1 Step, a semiconductor chip 5c is first die-bonded to its corresponding die pad 7a3. Next, as shown in S1-2 Step, a semiconductor chip 5a is disposed in its corresponding die pad 7a1. Finally, as shown in S1-3 Step, a semiconductor chip 5b is placed in its corresponding die pad 7a3. Mounting the semiconductor chips 5a, 5b and 5c small in outer size to the die pads 7a3, 7a1 and 7a2 in that order in this way enables an improvement in productivity. Incidentally, although, for example, solder paste is used to dispose the semiconductor chips 5a, 5b and 5c in the die pads 7a1, 7a2 and 7a3 respectively, it is omitted to make it easy to see the drawings.

The wire bonding step shown in FIG. 10 will next be described with reference to FIG. 14. As shown in S2-1 Step, the semiconductor chip 5a and the die pad 7a2 are first electrically connected by a plurality of wires WR1 (first wire). Next, as shown in S2-2 Step, the semiconductor chip 5b and the leads 7b2 (second power supply terminal) are electrically connected by a plurality of wires WR2 (second wire). Finally, as shown in S2-3 Step, the semiconductor chip 5c and its associated parts are electrically connected by a plurality of wires WR3 (third wire). The wires WR1, WR2 and WR3 are respectively formed of, for example, gold (Au) or the like. The wires WR1 and WR2 are 50 μm in thickness, for example. The thickness of each wire WR3 is 30 μm, for example.

With an improvement in the efficiency of voltage conversion as a main object, the first embodiment provides a reduction in parasitic inductance LsH produced between the semiconductor chip 5a and the output terminal and a reduction in parasitic inductance LsL produced between the semiconductor chip 5b and each lead 7b2 (second power supply terminal) for the purpose of its attainment. Thus, the plural wires WR1 thicker than the wires WR3 are arranged to electrically connect the semiconductor chip 5a and the die pad 7a2. The plurality of wires WR2 thicker than the wires WR3 are arranged to electrically connect the semiconductor chip 5b and the leads 7b2 (second power supply terminal). Connecting them by arranging the thick wires WR1 and WR2 in plural form in this way makes it possible to reduce the parasitic inductances LsH and LsL produced in their wiring paths and also enhance the reference potential GND. However, when the thick wires WR are bonded by an ultrasonic wave, a load larger than each thin wire WR3 is required. There is a fear that when the thick wires WR1 and WR2 are connected after the thin wires WR3 are connected on ahead, the previously-connected thin wires WR3 will break due to the large load. When the die pads (chip mounting sections) 7a1, 7a2 and 7a3 are separated from one another as in the first embodiment, a problem about this breaking in particular arises remarkably. Therefore, in the first embodiment, the wires WR2 are connected after the connection of the thick wires WR1 as shown in FIG. 14, and the thin wires WR3 are connected after the connection of the wires WR2. It is thus possible to suppress breaking of the wires WR1, WR2 and WR3. Incidentally, since the wires WR1 and the wires WR2 are identical in thickness, the wires WR1 may be connected after the wires WR2 are previously connected.

Next, FIG. 15 is an enlarged plan view of the semiconductor chip 5a, FIG. 16 is a cross-sectional view taken along line B-B of FIG. 15, FIG. 17 is a cross-sectional view taken along line C-C of FIG. 15 and is a fragmentary enlarged sectional view of the semiconductor chip 5a, and FIG. 18 is a cross-sectional view taken along line C-C of FIG. 15, respectively.

The semiconductor chip 5a is rectangular in flat shape intersecting its thickness direction and is shaped in the form of, for example, a rectangle in the first embodiment. Although the semiconductor chip 5a is not limited to it, it has, for example, a semiconductor substrate 15, a plurality of transistor elements formed in a main surface 5ax (see FIG. 9 and the like) of the semiconductor substrate 15, a multilayer wiring layer in which an insulating layer 12 and a wiring layer 13 are respectively stacked over the main surface of the semiconductor substrate 15 in plural stages, a surface protection film (final protection film) 14 formed so as to cover the wiring layer 13, etc. The wiring layer 13 is constituted of a metal material like aluminum (Al), for example. The surface protection film 14 is formed of an organic film like a polyimide film (PiQ), for example.

The semiconductor chip 5a has the main surface (circuit forming surface) 5ax and a back surface 5ay both placed on the sides opposite to each other (see FIG. 9 and the like). An integrated circuit is configured on the main surface 5ax side of the semiconductor chip 5a. The integrated circuit comprises transistor elements formed in the main surface 5ax of the semiconductor substrate 15 and wirings formed in the multilayer wiring layer.

A plurality of electrode pads (electrodes) BP are formed in the main surface 5ax of the semiconductor chip 5a. The plural electrode pads BP include source electrode pads BP1 connected to the source and gate of a first field effect transistor Q1, and a gate electrode pad BP3. They are exposed through bonding apertures 14 formed in the wiring layer 13 corresponding to a top layer of the multilayer wiring layer of the semiconductor chip 5a and formed in the surface protection film 14 of the semiconductor chip 5a in association with the respective electrode pads BP. As shown in FIG. 17, each source electrode pad BP1 is formed along a pair of long sides (X direction) of the semiconductor chip 5a. In the first embodiment, for example, two source electrodes extend face-to-face with each other. The gate electrode pad BP3 is formed in a position near the center of one of a pair of short sides of the semiconductor chip 5a. A further description will be made. As shown in FIG. 8, the gate electrode pad BP3 is formed in a position near the center of the side closest to the output stage of the first control circuit 3a of the semiconductor chip 5c. In the first embodiment, the shape of the gate electrode pad BP3 is square and 280 μm, for example. The semiconductor chip 5a has a gate electrode pattern electrically connected to the gate electrode pad BP3. The gate electrode pattern extends from one (side connected to the gate electrode pad BP3) of the pair of short sides of the semiconductor chip 5a to the other in the X direction and comprises a portion (first wiring and first portion) BP formed between the two source electrode pads BP1, and a portion (second wiring and second portion) BP3b formed along the periphery of the main surface of the semiconductor chip 5a. In the first wiring BP3a of the gate electrode pattern, an end thereof on the side opposite to one end (side connected to the gate electrode pad BP3) of one pair of short sides is formed so as not to be connected to some of the second wiring BP3b. The width of the gate electrode pattern is 25 µm, for example. The gate electrode pattern is formed of a metal like aluminum (Al), for example. When the semiconductor chip 5a and the die pad 7a2 are electrically connected by the plural wires WR1, they are placed in a zigzag form in a Y direction with the first wiring interposed therebetween as shown in FIG. 8.

Since the semiconductor chip 5a is shaped in the form of a rectangle extending in the X direction in this way, the source electrode pads BP1 can also be disposed so as to approach the die pad 7a2 and along a pair of long sides in addition to the viewpoint that the semiconductor chip 5a is placed near the die pad 7a2 as described above (the long side of the semiconductor chip 5a is placed in a state of extending along the long side of the die pad 7a2). Thus, since the wires WR1 for electrically connecting the source electrodes BP1 and the die pad 7a2 can be individually formed short in length, and more wires WR1 can be placed side by side, the parasitic inductance LsH can be reduced. Since the end on the side opposite to one end (side connected to the gate electrode BP3) of the pair of short sides in the first wiring BP3a of the gate electrode pattern is formed so as not to be connected to part of the second wiring BP3b, the source region SR1 of the first field effect transistor Q1 can be formed without separation. That is, since the source region SR1 is formed without separation, the on resistance can be reduced.

The two types of wires WR are electrically connected to the source electrode pads BP1 of the semiconductor chip 5a. The first type corresponds to the wires WR1 electrically connected to the die pad 7a2. The second type corresponds to wires WR3a (WR3) that connect the source of the first field effect transistor Q1 and the pads BP2 (BP) electrically connected thereto, of the plurality of electrode pads BP of the semiconductor chip 5c. That is, the wires WR electrically connected to the source electrode pads BP1 of the semiconductor chip 5a are separated into the die pad 7a2 side and the first control circuit 3a side.

Thus, since paths for a current I11 (I1) that flows from the source of the first field effect transistor Q1 to the output terminal through the die pad 7a2, and a current I12 (I1b) that flows toward the first control circuit 3a, can be dispersed, current loads developed in the respective wires WR can be reduced. Therefore, a further improvement in switching loss can be performed since the parasitic inductance produced between the first field effect transistor Q1 and the first control circuit 3a ca be reduced.

Next, FIG. 16 is a cross-sectional view taken along line B-B of the semiconductor chip 5a. The semiconductor substrate 15 of the semiconductor chip 5a comprises, for example, $n^+$ type silicon (Si) monocrystalline. A drain electrode (external terminal) connected to the drain region DR1 of the first field effect transistor Q1 is formed in its back surface. The drain electrode is formed by evaporating a metal such as gold (Au) and connected to the die pad 7a2 as described above. On the other hand, an epitaxial layer 16ep formed of, for example, n type silicon monocrystalline is formed in the main surface of the semiconductor substrate 15. The epitaxial layer 16ep is formed with an $n^-$ type semiconductor region 17n1, p type semiconductor regions 17p formed thereover, and $n^+$ type semiconductor regions 17n2 formed thereover. For example, an n channel type vertical first field effect transistor Q1 having a trench gate structure is formed in such a semiconductor substrate 15 and an epitaxial layer 16ep. Further, a wiring layer 13b for a source region SR1 and a wiring layer 13a for a gate region G1 are formed thereover. A surface protection film 14 for protecting the wiring layers 13a and 13b each corresponding to the top layer is formed. Furthermore, a bonding aperture 14a is defined in the surface protection film 14, and each source electrode pad (external terminal) BP1 connected to the source region SR1 exposed from the bonding aperture 14a is formed. The gate region G1 is formed of, for example, polysilicon (poly-Si). The source electrode pad BP1 is formed by evaporating a metal such as gold (Au) and connected with the wires WR1 for electrically connecting to the die pad 7a2 as described above.

As shown in FIG. 17, the first field effect transistor Q1 has the $n^+$ type semiconductor region 17n2 having a function as the source region SR1, the $n^-$ type semiconductor region 17n1 having a function as the drain region DR1, the p type semiconductor region 17p having a function as a channel forming region CH1, a gate insulating film 19 formed over an inner wall of a trench 18 dug or defined in the direction of thickness of the epitaxial layer 16ep, and a gate region G1 embedded into the trench 18 through the gate insulating film 19. The gate region G1 is electrically connected to the gate electrode pad BP3. Owing to the adoption of such a trench gate structure, the unit area of the first field effect transistor Q1 can be miniaturized or scaled down and brought into high integration. A cap insulating film 20 is formed over the gate region G1 and insulates the source electrode pad BP1 and the gate region G1 from each other. The electrode pad BP1 is electrically connected even to the p type semiconductor region 17p for channel formation as well as being connected to the $n^+$ type semiconductor region 17n2 for the source. The current I1 at the operation of the first field effect transistor Q1 flows between the source region SR1 and the drain region DR1 along the depth direction of the trench 18 (flows in the direction of thickness of drift layer) and along the side surfaces of the gate insulating film 19. Such a vertical first field effect transistor Q1 is large in gate area per unit cell area and large in area of junction of the gate region G1 and the drift layer of the drain as compared with the horizontal field effect transistor in which the channel is formed in the horizontal direction. Therefore, the parasitic capacitance between the gate and drain becomes large, whereas a channel width per unit cell area can be increased and hence the on resistance can be reduced.

The semiconductor chip 5a is formed by arranging such a field effect transistor as described in FIG. 17 in plural form as shown in FIG. 16.

Next, FIG. 18 is a cross-sectional view taken along line C-C (see FIG. 15) of the semiconductor chip 5a. The semiconductor substrate 15 of the first field effect transistor Q1 comprises, for example, $n^+$ type silicon monocrystalline. An epitaxial layer 16ep constituted of, for example, n type silicon monocrystalline is formed in the main surface of the semiconductor substrate 15. Since the epitaxial layer 16ep is substantially identical in configuration to the above epitaxial layer, the description thereof will be omitted. Further, a $p^-$ type well region PWL is formed over the epitaxial layer 16ep. A gate region (G-poly) G1 is formed over the $p^-$ type well region PWL with a field oxide film FLD interposed therebetween. An insulating oxide film ($SiO_2$) 21 is formed in the surface of the gate region G1. An aperture 21a is defined in the insulating oxide film 21, and a wiring layer 13a connected to the gate region G1 is formed through the aperture. The wiring layer 13a is of a gate electrode pad BP3. Further, a gate electrode (external terminal) connected to the gate electrode pad BP3 is formed. On the other hand, a channel region CH1 is formed in the side surface of the $p^-$ type well region PWL, and a wiring layer 13b for each source region SR1 is formed over the channel region CH1. The wiring layer 13b is of a source electrode pad BP1. Further, each source electrode (external terminal) ET5 connected to the source electrode pad BP1 is formed. The wiring layer 13a of the gate region G1 and the wiring layer 13b of the source region SR1 are respectively of wiring layers each corresponding to a top layer. Incidentally, the wiring layers 13a and 13b are respectively formed of a metal like aluminum (Al), for example.

Next, FIG. 19 shows an enlarged plan view of the semiconductor chip 5b. Incidentally, since the semiconductor chip 5b is substantially identical in device configuration to the semiconductor chip 5a, the description thereof will be omitted because it has already been described in FIG. 15. Since the semiconductor chip 5b is substantially identical to FIGS. 16 through 18 in device's sectional configuration, the description thereof will be omitted because it has already been described in FIGS. 16 through 18.

The semiconductor chip 5b has a flat shape intersecting its thickness direction, which is rectangular. In the first embodiment, the semiconductor chip 5b is shaped in the form of a rectangle, for example. A pair of long sides of the semiconductor chip 5b and a pair of short sides thereof are respectively substantially the same size in XY ratio as two sides of plural leads 7b2 (second power supply terminal) formed with being connected in an L-shaped fashion (see FIG. 8). The semiconductor chip 5b has a main surface (circuit forming surface) 5bx and a back surface 5by located on the sides opposite to each other. An integrated circuit is configured on the main surface 5bx side of the semiconductor chip 5b. The integrated circuit is principally configured of transistor elements formed in the main surface 5bx of the semiconductor substrate, and wirings formed in a multilayer wiring layer.

As shown in FIG. 19, a plurality of pads (electrodes) BP are formed in the main surface 5bx of the semiconductor chip 5b. The plural electrode pads BP include source electrode pads BP5 connected to the source of the second field effect transistor Q2 for the low side switch and gate electrode pads BP7 connected to the gate of the second field effect transistor Q2. They are exposed through bonding apertures 22a defined in a wiring layer corresponding to a top layer of the multilayer wiring layer of the semiconductor chip 5b and defined in a surface protection film 22 of the semiconductor chip 5b in association with the respective electrode pads BP. The gate electrode pad BP7 electrically connected to the gate of the second field effect transistor Q2, of the plural electrode pads BP of the semiconductor chip 5b is placed in a position near the corner most adjacent to the semiconductor chip 5c within the main surface of the semiconductor chip 5b. Further, the semiconductor chip 5b has gate electrode patterns electrically connected to the gate electrode pads BP7. The gate electrode patterns extend in a Y direction from one (first power supply terminal ET1 side) of the pair of long sides of the semiconductor chip 5b to the other (second power supply terminal ET4 side) thereof. The source electrode pads BP5 are placed among the plural gate electrode patterns and extend in the Y direction from the other of the pair of long sides of the semiconductor chip 5b to one thereof. A further description will be made. The gate electrode patterns comprise portions (third wiring and third portion) BP7a formed among the source electrode pads BP5 and portions (fourth wiring and fourth portion) BP7b formed along the periphery of the main surface of the semiconductor chip 5b. In the third wiring BP7a of each gate electrode pattern, the end of the other (second power supply terminal ET4 side) on the side opposite to a pair of long sides thereof is formed so as not to be connected to part of the fourth wiring BP7b. The width of each gate electrode pattern is 25 μm, for example. The gate electrode pattern is constituted of a metal like aluminum (Al), for example. The source electrode pads BP5 and the plural leads (second power supply terminal) 7b2 are electrically connected by a plurality of wires WR2.

A current supplied from the second control circuit 3b flows to the second power supply terminal through the gate of the second field effect transistor Q2. Therefore, when the gate electrode patterns are formed in the X direction from one of the pair of short sides to the other thereof, paths for the current flowing toward the plural leads 7b2 placed along the long side are cut off or blocked. On the other hand, since the gate electrode patterns are formed so as to extend from one of the pair of long sides to the other thereof in the first embodiment, their current paths can be ensured. It is therefore possible to suppress degradation of the efficiency of voltage conversion. Extensively forming the source electrode pads BP5 over the semiconductor chip 5b as shown in FIG. 19 makes it possible to connect a large number of the wires WR2 electrically connected to the plural leads 7b2 that supply the reference potential GND. That is, parasitic impedance or inductance LsL produced in each wiring path can further be reduced by connecting the large number of wires WR2. By making the outer size of the semiconductor chip 5b substantially identical to the plural leads 7b2 formed in the L shape, the length of the connected plural wires WR2 can be shortened. That is, since they can be connected by the plural wires WR2 substantially identical in length, variations in parasitic impedance LsL developed in the wires WR2 can be suppressed. Thus, since a variation in the magnitude of current flowing through each wire WR2 is hard to occur, the efficiency of voltage conversion can be improved.

A phenomenon (self turn-on) occurs wherein when the first field effect transistor Q1 for the high side switch is switched to the second field effect transistor Q2 for the low side switch, a current (through current) flows from the first power supply terminal ET1 to the second power supply terminal. Therefore, in the first embodiment, a threshold voltage VthH of the second field effect transistor Q2 for the low side switch is controlled by a value higher than a threshold voltage VthL of the first field effect transistor Q1 for the high side switch. Consequently, the path for the through current can be cut off. That is, the self turn-on can be suppressed.

Next, FIG. 20 is a circuit configurational diagram showing control circuits of the semiconductor device according to the first embodiment, and FIG. 21 is a cross-sectional view showing the corresponding control circuit of the semiconductor device shown in FIG. 20.

The semiconductor chip 5c has first and second control circuits 3a and 3b. The first control circuit 3a is of a circuit which controls the gate of the first field effect transistor Q1 for the high side switch. The first control circuit 3a comprises a plurality of field effect transistors M1, M2, M3 and M4. Of the plural field effect transistors M1, M2, M3 and M4, a section which controls the gate of the first field effect transistor Q1 for the high side switch, corresponds to the field effect transistors M1 and M2 equivalent to an output stage. The gate of the field effect transistor Q1 for the high side switch is controlled by signals outputted from the field effect transistors M1 and M2. The section is supplied with a potential from the corresponding terminal (VCIN) ET2 that inputs a gate control voltage for the first field effect transistor Q1 electrically connected to the drain of the field effect transistor M1 of the output stage, and outputs a control signal. A terminal ET6 for a bootstrap circuit, for controlling the gate of the first field effect transistor Q1 is connected to the drain of the field effect transistor M1. Since the potential of the source of the first field effect transistor Q1 is a value (floating) higher than the reference potential GND, the voltage is supplied from the terminal ET6 with respect to its voltage. Incidentally, although the first embodiment has been explained using the four field effect transistors M1, M2, M3 and M4, the present invention is transistors may be provided in the present embodiment.

The second control circuit 3b is of a circuit for controlling the gate of the second field effect transistor Q2 for the low side switch and comprises plural field effect transistors M5 and M6. The drain of the field effect transistor M5 is supplied with a potential from its corresponding terminal (VLDRV) ET3 that inputs a gate control voltage for the second field effect transistor Q2, so that a control signal is outputted. The second control circuit 3b is substantially identical to the first control circuit 3a in circuit operation and the description thereof will therefore be omitted.

Next, FIG. 21 shows a device structure of the control circuit described in FIG. 20. Incidentally, since the second control circuit 3b shown in FIG. 21 is substantially identical to the first control circuit 3a in device configuration, the first control circuit 3a is explained here and the description of the second control circuit 3b is therefore omitted.

The first field effect transistor Q1 is formed with a first control circuit 3a formed of, for example, a CMOS (Complementary MOS) inverter circuit. The first control circuit 3a is formed of a p channel type horizontal third field effect transistor Q3 (whose channel is formed in the horizontal direction (direction horizontal to the main surface of the semiconductor substrate)) formed in an n well NWL, and an n channel type horizontal fourth field effect transistor Q4 formed in a p well PWL. The third field effect transistor Q3 has a source region SR3, a drain region DR3, a gate insulating film 23p and a gate region G3. The source region SR3 and the drain region DR3 respectively have p⁻ type semiconductor regions 24a and p⁺ type semiconductor regions 24b. The fourth field effect transistor Q4 has a source region SR4, a drain region DR4, a gate insulating film 23n and a gate region G4. The source region SR4 and the drain region DR4 respectively have n⁻ type semiconductor regions 25a and n⁺ type semiconductor regions 25b. The drain regions DR3 and DR4 are respectively connected to an output terminal ET7 and electrically connected to the gate of the first field effect transistor for the high side switch through the output terminal ET7. The source region SR4 is connected to an output terminal ET8 and electrically connected to the source of the first field effect transistor through the output terminal ET8.

The semiconductor chip 5c has a square-shaped main surface and a plurality of pads (electrodes) BP disposed along the sides of the square-shaped main surface. Of the plural electrode pads BP of the semiconductor chip 5c, the electrode pads BP2, BP4, BP6 and BP8 respectively electrically connected to the sources and gates of the first and second field effect transistors Q1 and Q2 are disposed along the two sides that define the corners of the main surface, most adjacent to the semiconductor chips 5a and 5b.

Thus, since the length of each of wires WR3a, WR3b, WR3c and WR3d can further be shortened, the parasitic inductances LgH, LsH, LgL and LsL produced in the wiring paths can further be reduced. Since it is desired to reduce the switching loss rather than the on resistance, the semiconductor chips 5 are disposed in such a manner that the distance between the semiconductor chip 5c and the semiconductor chip 5a becomes shorter than the distance between the semiconductor chip 5c and the semiconductor chip 5b. Even with respect to the wires WR3a, 3b, 3c and 3d in addition to such a viewpoint, the wires WR3a and 3b respectively electrically connected to the source and gate of the first field effect transistor Q1 are formed shorter than the wires WR 3c and 3d respectively electrically connected to the source and gate of the second field effect transistor Q2.

The second control circuit 3b is of a circuit that controls the gate of the second field effect transistor Q2 for the low side switch. Further, the output stage of the second control circuit 3b comprises plural field effect transistors M5 and M6 (fifth and sixth field effect transistors). The fifth field effect transistor M5 is placed on the side of one of the four sides of the semiconductor chip 5c, most adjacent to the semiconductor chip 5b. Of the plural electrode pads BP of the semiconductor chip 5c, the source electrode pads BP9 (BP) connected to the source of the fifth field effect transistor M5 are placed inside the semiconductor chip 5c as compared with other electrode pads BP.

Since the wiring resistance of each wire WR3 is lower than that of wiring formed within each chip, the source electrode pads BP9 (BP) connected to the source of the fifth field effect transistor M5 are formed over the semiconductor chip 5c. The wires WR3 are drawn and connected up to the neighborhood of the source of the fifth field effect transistor M5 so that the parasitic inductances developed in the wiring paths can further be reduced.

Figure 22:
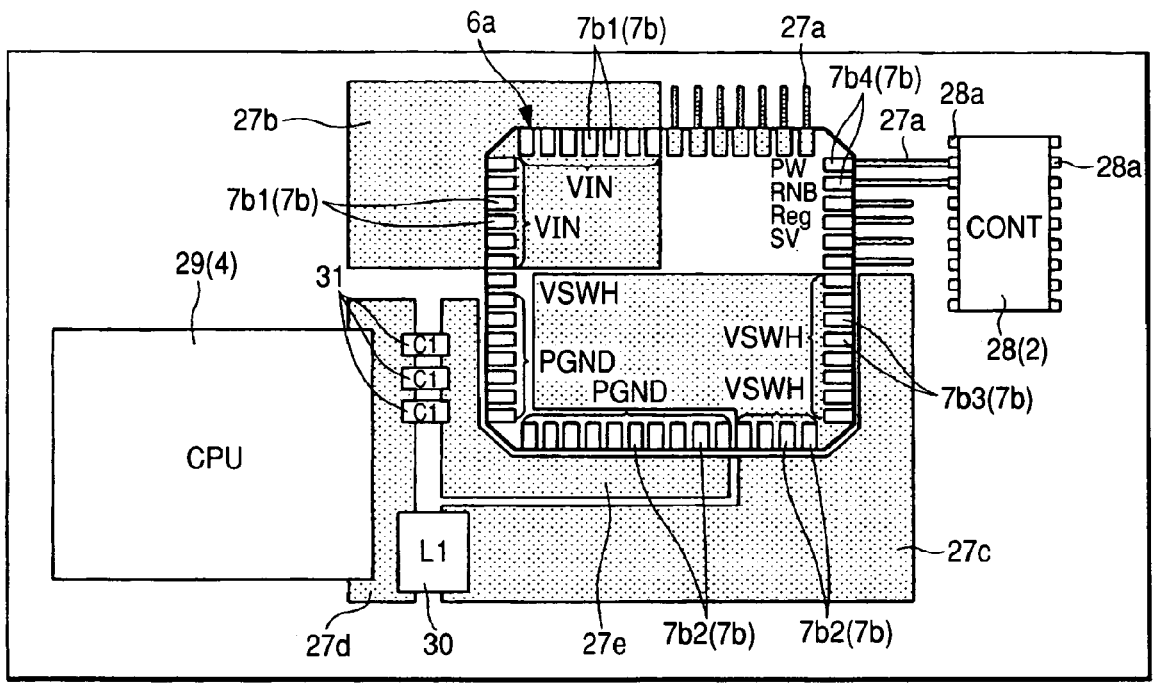
FIG. 22 is a plan view showing one example of a packaged state of the semiconductor device according to the first embodiment of the present invention.
Figure 23:
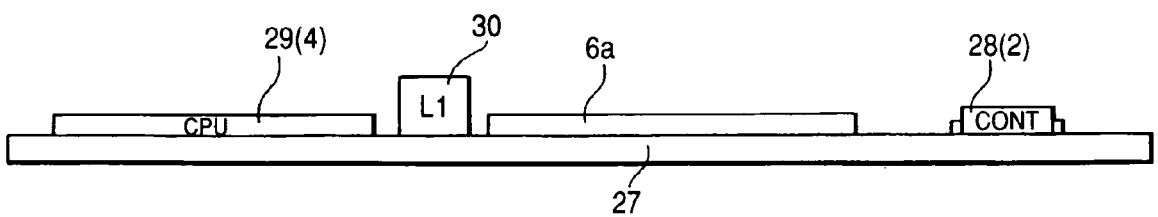
FIG. 23 is a side view illustrating the semiconductor device shown in FIG. 21.

Next, FIG. 22 is a plan view showing one example of a state of mounting of the package 6a, and FIG. 23 is a side view of FIG. 22, respectively.

The wiring board 27 is formed of, for example, a printed wiring board and has a main surface over which packages 6a, 28 and 29, and chip parts 30 and 31 are mounted. The control circuit 2 is formed in the package 28 and the load circuit 4 is formed in the package 29. The coil L1 is formed as the chip part 30 and the condenser C1 is formed as each chip part 31. Leads 28a of the package 28 are electrically connected to their corresponding leads 7b (7b4) of the package 6a through wirings 27a of the wiring board 27. Leads 7b1 of the package 6a are electrically connected to a wiring 27b of the wiring board 27. Output leads (output terminal) 7b3 of the package 6a are electrically connected to one end of the coil L1 of the chip part 30 through a wiring (output wiring) 27c of the wiring board 27. The other end of the coil L1 is electrically connected to the load circuit 4 through a wiring (output wiring) 27d of the wiring board 27. Leads 7b2 for a reference potential GND, of the package 6a are electrically connected to one ends of the condensers C1 corresponding to the plural chip parts 31 through a wiring 27e of the wiring board 27. The other ends of the condensers C1 are electrically connected to the load circuit 4 through the wiring 27d of the wiring board 27.

Figure 24:
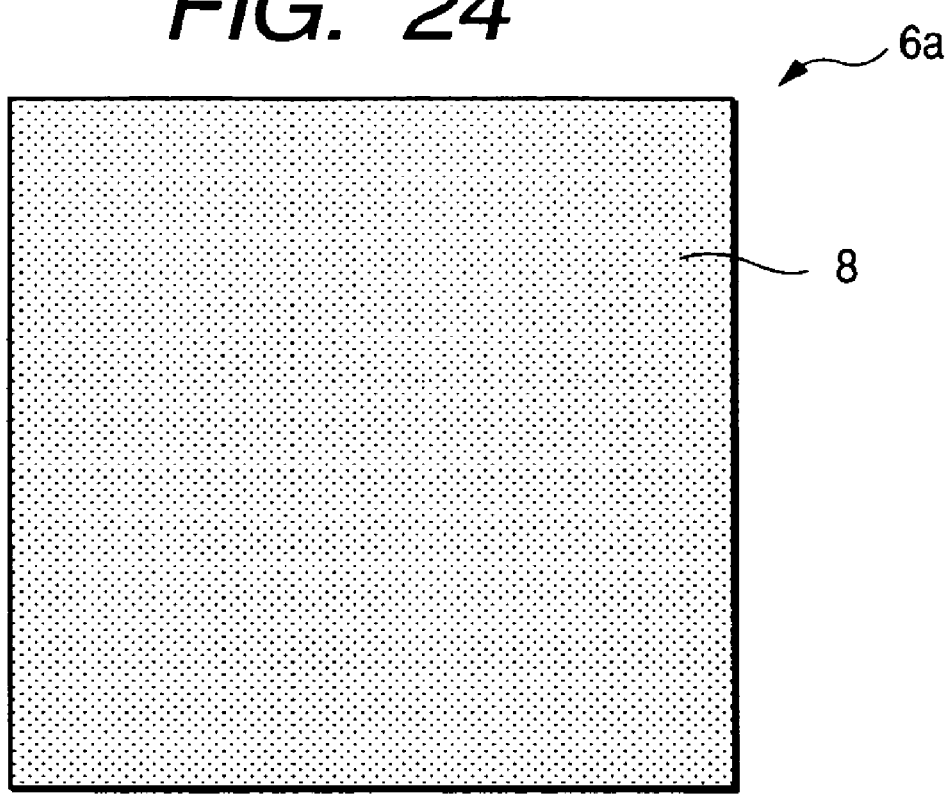
FIG. 24 is an overall plan view showing a surface side of a semiconductor device according to one embodiment of the present invention.
Figure 25:
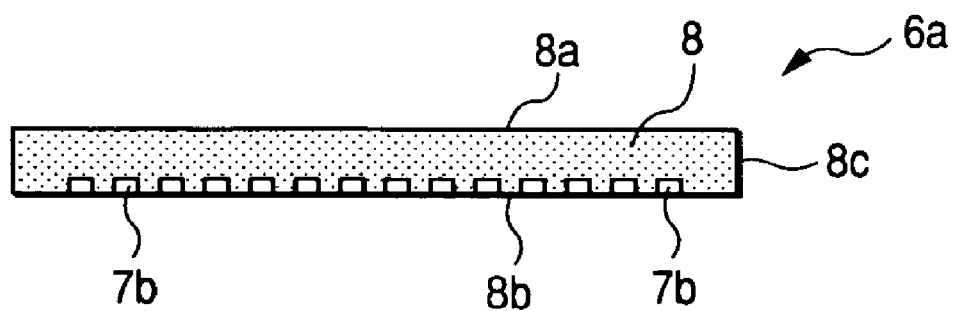
FIG. 25 is a side view illustrating the semiconductor device shown in FIG. 24.
Figure 26:
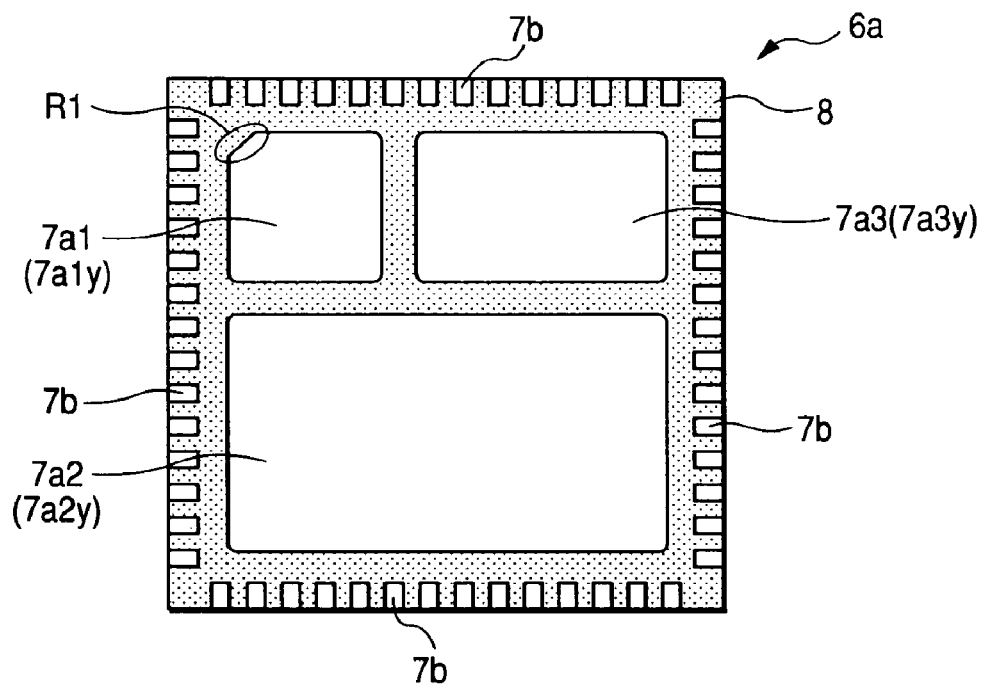
FIG. 26 is an overall plan view showing the back surface side of the semiconductor device shown in FIG. 24.
Figure 27:
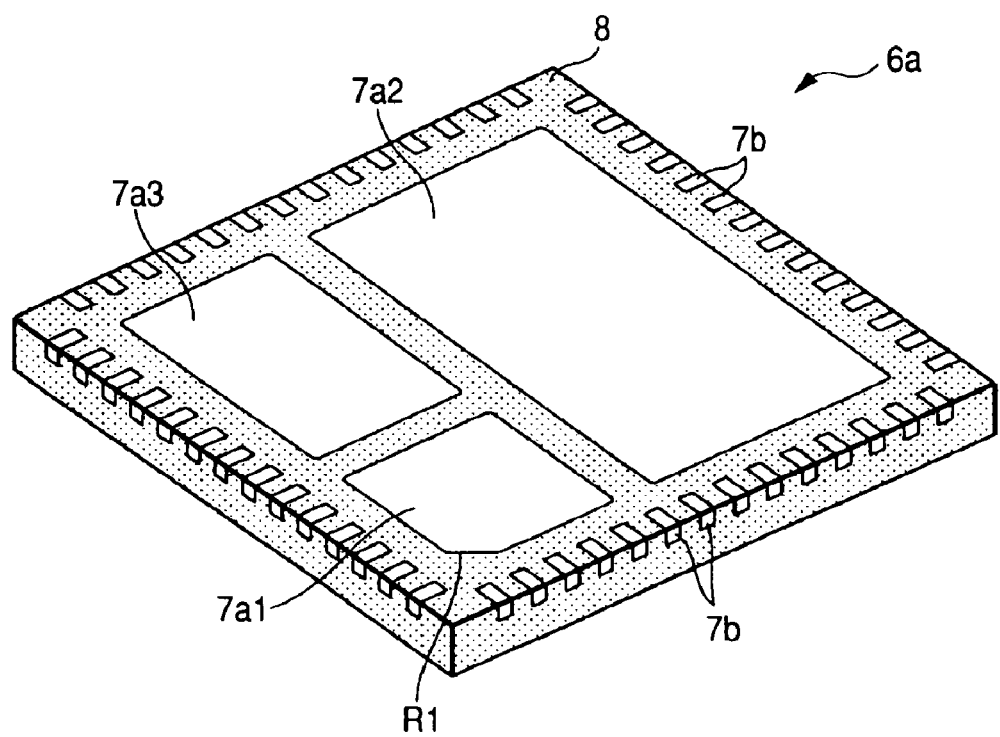
FIG. 27 is an overall perspective view illustrating an external appearance of the semiconductor device according to the one embodiment of the present invention.

Next, FIG. 24 is a plan view showing an overall surface of a semiconductor device according to one embodiment of the present invention, FIG. 25 is a side view of the semiconductor device shown in FIG. 24, FIG. 26 is a plan view showing a back surface of the semiconductor device shown in FIG. 24, and FIG. 27 is an overall perspective view showing an external appearance of the semiconductor device according to the one embodiment of the present invention, respectively.

As shown in FIG. 24, a resin encapsulation body 8 has a flat shape intersecting its thickness direction, which is rectangular. In the first embodiment, the resin encapsulation body 8 is shaped in the form of a square identical in shape to the lead frame 10, for example. With the objective of achieving a reduction in stress, the resin encapsulation body 8 is formed of, for example, a biphenyl thermosetting resin added with a phenol curing agent, silicon rubber and filler or the like. As a method for forming the resin encapsulation body, a transfer molding method suitable for mass production is used. The transfer molding method is a method of using a molding die (mold die) provided with a pot, a runner, a resin injection gate and a cavity or the like and injecting a thermosetting resin into the cavity from the pot through the runner and the resin injection gate to thereby form the resin encapsulation body 8.

Upon manufacture of an QFN type semiconductor device, there has been used an individual type transfer molding method for using a multicavity wiring board having a plurality of product forming areas (device forming areas and product acquisition areas) and resin-encapsulating semiconductor chips mounted in the respective product forming areas every product forming areas, or a batch type transfer molding method for using a multicavity wiring board having a plurality of product forming areas and collectively resin-encapsulating semiconductor chips mounted in the respective product forming areas. In the first embodiment, for example, the individual type transfer molding method is adopted.

As shown in FIGS. 25 and 26, some of plural leads 7b are exposed from the side surfaces 8c and back surface 8b of the resin encapsulation body 8. Back surfaces 7a1y, 7a2y and 7a3y of die pads 7a1, 7a2 and 7a3 are exposed from the back surface 8b of the resin encapsulation body 8. Further, since the outer shapes of the die pads 7a1, 7a2 and 7a3 are rectangular and lead frames placed at predetermined intervals, the resin encapsulation body 8 is formed even among the die pads 7a1, 7a2 and 7a3. In addition, a positioning taper R1 (index mark) is formed at one corner in the die pad 7a3. There is a fear that when the outer shapes of the die pads 7a1 and 7a2 become small where one attempts to form the positioning taper R1 in the die pads 7a1 and 7a2, it will exert an influence on current characteristics because the currents I1 and I2 are supplied from the first and second power supply terminals. On the other hand, since no dynamic current flows in the die pad 7a3 and the potential is being fixed, there is no need to worry about the current characteristics. Thus, the positioning taper R1 may preferably be formed in part of the die pad 7a3. Incidentally, the taper R1 is used when the main and back surfaces of the package 6a are distinguished from each other, in the case of, for example, face-to-face alignment at the shipment of the package 6a and printing of a trademark on the package 6a. The taper R1 is formed by etching, for example.

Second Preferred Embodiment

Figure 28:
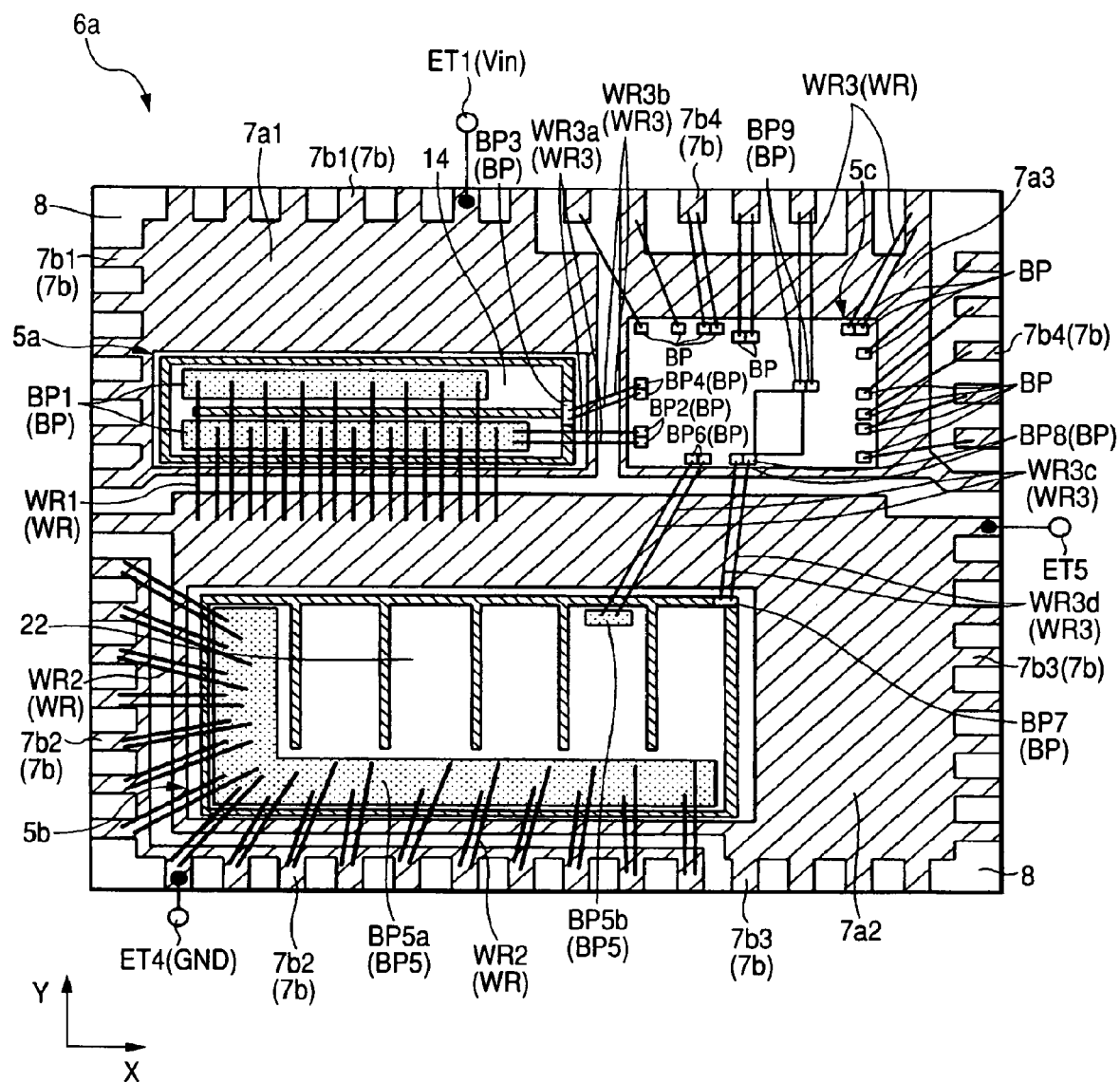
FIG. 28 is a plan view showing one example of a package configuration of a semiconductor device according to a second embodiment of the present invention.

FIG. 28 is a plan view showing one example of a package configuration of a semiconductor device according to a second embodiment of the present invention. The semiconductor device described in FIG. 28 is substantially similar to the semiconductor device shown in FIG. 8 in configuration but principally different therefrom in terms of the shape of a gate electrode pad BP3 in a semiconductor chip 5a, the shapes of a gate electrode pad BP7 and a source electrode pad BP5b in a semiconductor chip 5b, portions covered with surface protection films 14 and 22 in the semiconductor chips 5a and 5b, the shape of a source cell area, etc. Incidentally, FIG. 28 is also shown excepting the semiconductor chips 5a, 5b and 5c, die pads 7a1, 7a2 and 7a3 and resin encapsulation body 8 placed over leads 7b in order to make it easy to see the drawing. Further, the die pads 7a1, 7a2 and 7a3 and leads 7b are given hatching.

In the second embodiment, a source electrode pad BP5 (BP5a) connected to the source of a second field effect transistor Q2 for a low side switch is shaped in an L-shaped fashion, for example along the sides adjacent to a plurality of leads (second power supply terminal) 7b2 as shown in FIG. 28. That is, the source electrode pad BP5a is formed only at a bonding section for wires WR2 electrically connected to the plurality of leads (second power supply terminal) 7b2. The source electrode pad BP5b of the semiconductor chip 5b electrically connected to a second control circuit 3b of the semiconductor chip 5c by wires WR3 is formed on the side opposite to the side adjacent to the plural leads (second power supply terminal) 7b2, of a pair of long sides of the semiconductor chip 5b. Further, the outer size of the source electrode pad BP5b is formed in the same size as the outer size of an electrode pad BP6 electrically connected to the source of the second field effect transistor Q2, of a plurality of electrode pads BP of the semiconductor chip 5c.

Thus, in the second embodiment, the ratio between the occupied areas of the source electrode pads BP5a and BP5b in the source cell area of the semiconductor chip 5a is reduced so that the major part of the source cell area, at least more than its half can be formed as an area covered with the surface protection film 22.

There is a possibility that since the force of adhesion between each of the source electrode pads BP5 formed of a metal like aluminum (Al), for example and a resin encapsulation body 8 is lower than that between the surface protection film 22 and the resin encapsulation body 8, they will be peeled after the formation of the resin encapsulation body 8. However, according to the second embodiment in this way, the surface protection film 22 is formed large and the areas of the source electrode pads BP5a and BP5b, which are exposed from the surface protection film 22, are set smaller than the first embodiment. It is thus possible to reduce the area for contact between the source electrode pad BP5 and the resin encapsulation body 8. Therefore, the peeling of the resin encapsulation body 8 can be suppressed.

As shown in FIG. 28, the gate electrode pads BP3 and BP7 electrically connected to the gates of the first and second field effect transistors Q1 and Q2 are formed in the same size as electrode pads BP4 and BP8 electrically connected via the wires WR3 to the gates of the first and second field effect transistors Q1 and Q2, of the plural electrode pads BP of the semiconductor chip 5c. Incidentally, the gate electrode pads BP3 and BP7 are respectively formed of a metal like aluminum (Al), for example.

Thus, the outer sizes of the gate electrode pads BP3 and BP7 are set identical to or smaller than the outer sizes of the electrode pads BP4 and BP8 electrically connected the gates of the first and second field effect transistors Q1 and Q2, of the plural electrode pads BP of the semiconductor chip 5c to thereby make it possible to increase the cell areas of the source regions SR1 and SR2 of the first and second field effect transistors Q1 and Q2. It is therefore possible to further reduce the on resistance. That is, the efficiency of voltage conversion can be improved.

Third Preferred Embodiment

Figure 29:
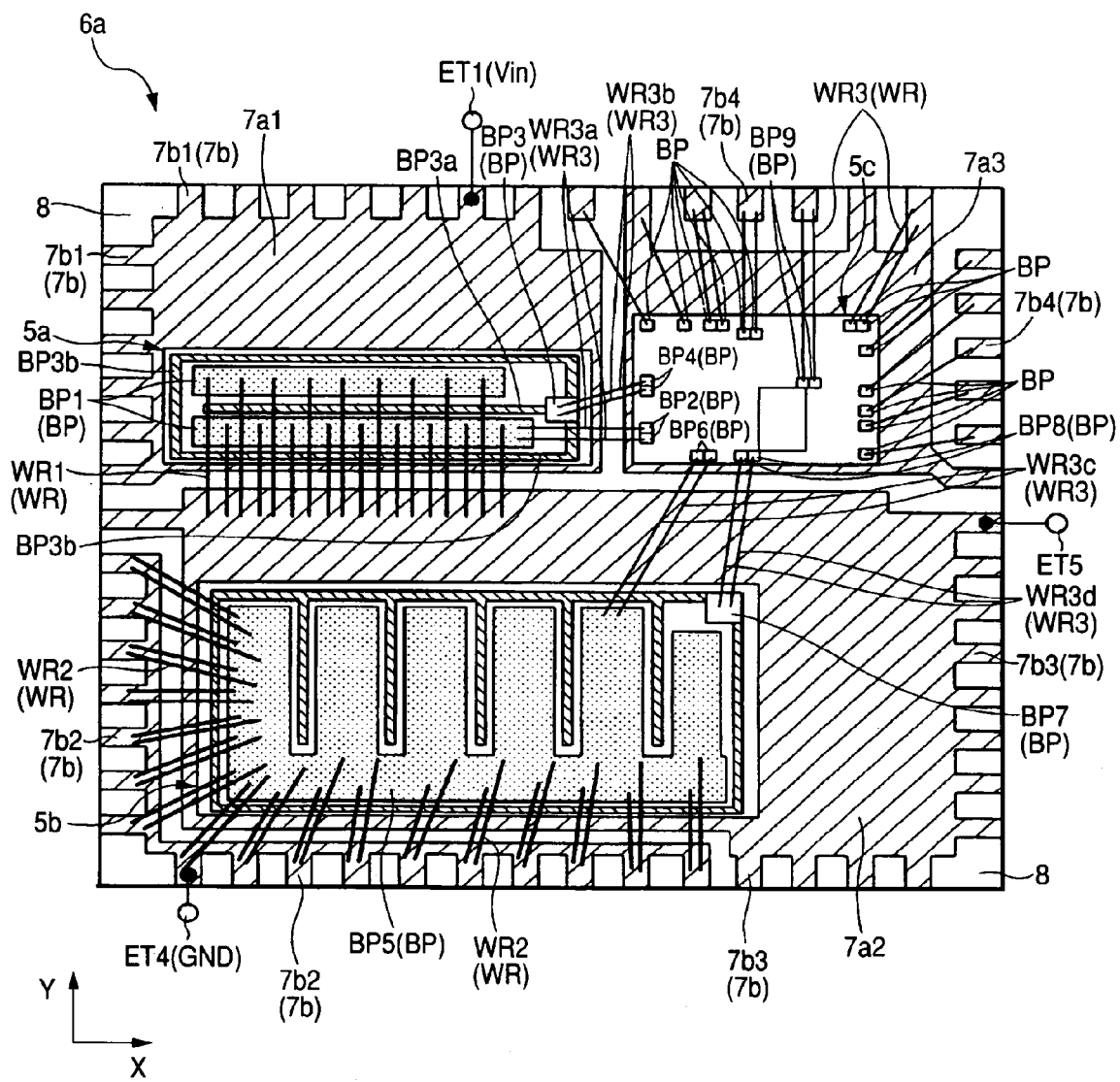
FIG. 29 is a plan view illustrating one example of a package configuration of a semiconductor device according to a third embodiment of the present invention.

FIG. 29 is a plan view showing one example of a package configuration of a semiconductor device according to a third embodiment of the present invention. The semiconductor device described in FIG. 29 is substantially similar to the semiconductor device shown in FIG. 8 in configuration but principally different therefrom in terms of a gate electrode pattern in a semiconductor chip 5a. Incidentally, FIG. 29 is also shown excepting the semiconductor chips 5a, 5b and 5c, die pads 7a1, 7a2 and 7a3 and resin encapsulation body 8 placed over leads 7b in order to make it easy to see the drawing. Further, the die pads 7a1, 7a2 and 7a3 and leads 7b are given hatching.

In the third embodiment, the width of a portion (first wiring and first portion) BP3a formed between two source electrode pads BP1 in the gate electrode pattern electrically connected to a gate electrode pad BP3 of a first field effect transistor Q1 for a high side switch is formed thicker than the width of a portion (second wiring and second portion) BP3b formed along the periphery of a main surface of the semiconductor chip 5a. Incidentally, the width of the first wiring BP3a of the gate electrode pattern is 50 µm, for example. The width of the second wiring BP3b of the gate electrode pattern is 25 µm, for example.

The first wiring BP3a of the gate electrode pattern, which is formed between the two source electrode pads BP1, is a wiring which constitutes the shortest gate current path of gate current paths from the gate electrode pad BP3 to a channel forming area of a trench gate G1 in the first field effect transistor Q1.

Thus, since the width of the first wiring BP3a is formed thicker than that of the second wiring BP3b in the gate electrode pattern, a gate resistance can be reduced. If attention is paid only to the viewpoint that the gate resistance is reduced, then the width of the second wiring BP3b of the gate electrode pattern may be expanded. However, when the width of the gate electrode pattern is increased, a source cell area is reduced. Since the on resistance of the first field effect transistor Q1 increases due to the reduction in source cell area, the efficiency of voltage conversion is degraded. Thus, in the third embodiment, the width of the first wiring BP3 constituting the shortest gate current path of the gate current paths from the gate electrode pad BP3 to the channel forming area of the trench gate G1 in the first field effect transistor Q1 is made larger than that of the second wiring BP3b constituting other gate current path to thereby enable a reduction in the resistance of the shortest gate current path. Reducing the resistance of the shortest gate current path from the gate electrode pad BP3 in this way makes it possible to improve fast responsivity at the turn-on operation of the first field effect transistor Q1 and enhance the efficiency of voltage conversion.

Fourth Preferred Embodiment

Figure 30:
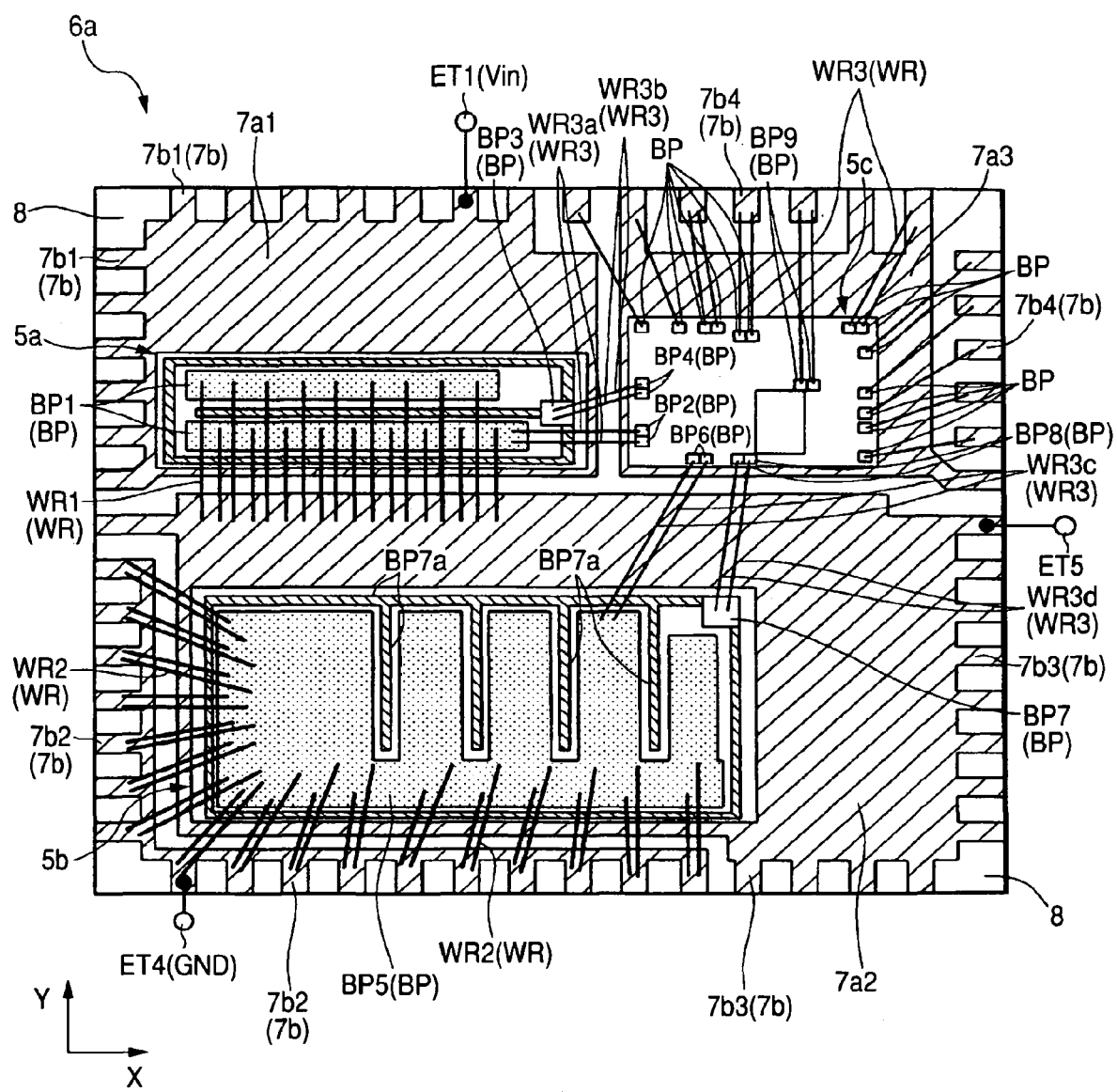
FIG. 30 is a plan view showing one example of a package configuration of a semiconductor device according to a fourth embodiment of the present invention.

FIG. 30 is a plan view showing one example of a package configuration of a semiconductor device according to a fourth embodiment of the present invention. The semiconductor device described in FIG. 30 is substantially similar to the semiconductor device shown in FIG. 8 in configuration but principally different therefrom in terms of gate electrode patterns in a semiconductor chip 5b. Incidentally, FIG. 30 is also shown excepting the semiconductor chips 5a, 5b and 5c, die pads 7a1, 7a2 and 7a3 and resin encapsulation body 8 placed over leads 7b in order to make it easy to see the drawing. Further, the die pads 7a1, 7a2 and 7a3 and leads 7b are given hatching.

The fourth embodiment has the feature that as shown in FIG. 30, the interval or spacing of a third wiring BP7a placed in a position farther from a gate electrode pad BP7, in a plurality of third wirings BP7a for the gate electrode patterns is made wider than the interval of the corresponding third wiring BP7a placed in a position close to the gate electrode pad BP7. A further description will be made. In source electrode pads BP5 formed among the gate electrode patterns, the width of the source electrode pad BP5 formed in a position far from the gate electrode pad BP7 and adjacent to a second power supply terminal ET4 (plural leads 7b2 disposed along an L-shaped line) is formed wider than that of the source electrode pad BP5 formed near the gate electrode pad BP7.

Thus, since the path of current that flows toward the second power supply terminal ET4 adjacent to a pair of short sides in the semiconductor chip 5b can be expanded, the on resistance can be reduced. That is, the efficiency of voltage conversion can be improved.

Fifth Preferred Embodiment

Figure 31:
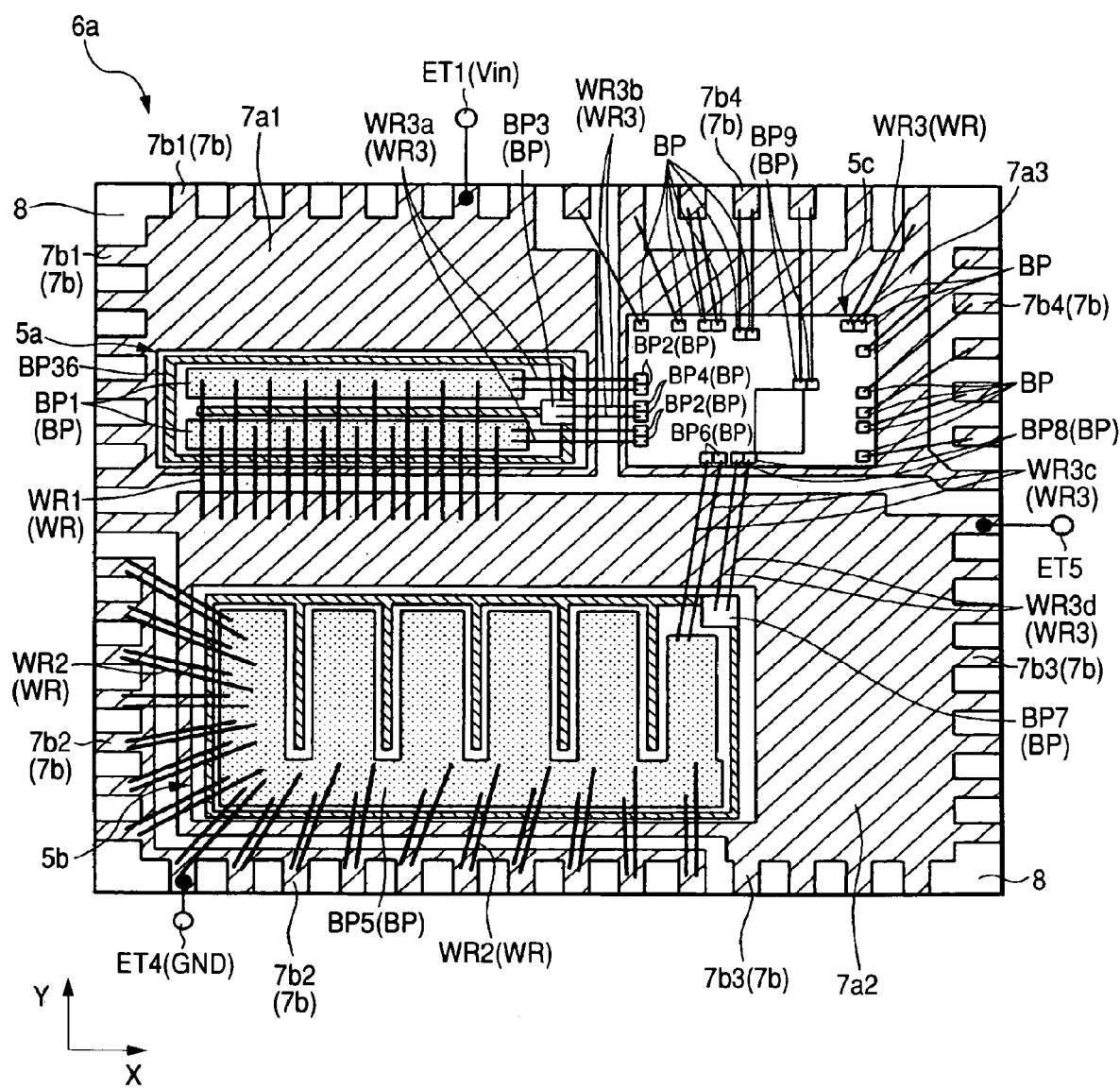
FIG. 31 is a plan view depicting one example of a package configuration of a semiconductor device according to a fifth embodiment of the present invention.

FIG. 31 is a plan view showing one example of a package configuration of a semiconductor device according to a fifth embodiment of the present invention. The semiconductor device described in FIG. 31 is substantially similar to the semiconductor device shown in FIG. 8 in configuration but principally different therefrom in terms of the layout and number of wires WR connected to the source of a semiconductor chip 5a. Incidentally, FIG. 31 is also shown excepting the semiconductor chips 5a, 5b and 5c, die pads 7a1, 7a2 and 7a3 and resin encapsulation body 8 placed over leads 7b in order to make it easy to see the drawing. Further, the die pads 7a1, 7a2 and 7a3 and leads 7b are given hatching.

In the fifth embodiment as shown in FIG. 31, pads BP2 electrically connected to the source of the semiconductor chip 5a, of a plurality of electrode pads BP of the semiconductor chip 5c are disposed on both sides adjacent to electrode pads BP4 electrically connected to the gate of the semiconductor chip 5a.

Thus, the number of plural wires WR3a that connect source electrode pads BP1 of the semiconductor chip 5a and the electrode pads BP2 electrically connected to the source of a first field effect transistor Q1, of the plural electrode pads BP of the semiconductor chip 5c can further be increased. It is therefore possible to further reduce a parasitic inductance LsH produced in a wiring path between the source of the first field effect transistor Q1 and a first control circuit 3a. The plural wires WR3a that connect the source electrode pads BP1 of the semiconductor chip 5a and the electrode pads BP2 of the semiconductor chip 5c, are formed substantially in parallel to a plurality of wires WR3b that connect the gate electrode pads BP4 of the semiconductor chip 5a and the electrode pads BP4 of the semiconductor chip 5c. Therefore, a current feedback rate between the first field effect transistor Q1 and the first control circuit 3a can be increased. Therefore, the parasitic inductance LsH produced in the wiring path between the source of the first field effect transistor Q1 and the first control circuit 3a can be reduced, and fast responsivity of the first field effect transistor Q1 is improved, thereby making it possible to enhance the efficiency of voltage conversion.

The source electrode pad BP5b (BP5) of the semiconductor chip 5b and the gate electrode pad BP7 are disposed so as to adjoin each other. That is, a plurality of wires WR3c that connect the source electrode pad BP5b (BP5) of the semiconductor chip 5b and the electrode pads BP6 of the semiconductor chip 5c, are formed side by side substantially in parallel to a plurality of wires WR3d that connect the gate electrode pad BP7 of the semiconductor chip 5b and the electrode pads BP8 of the semiconductor chip 5c.

Thus, since a current feedback rate between the second field effect transistor Q2 and a second control circuit can be increased, the self turn-off phenomenon can be suppressed. That is, the efficiency of voltage conversion can be enhanced.

Sixth Preferred Embodiment

Figure 32:
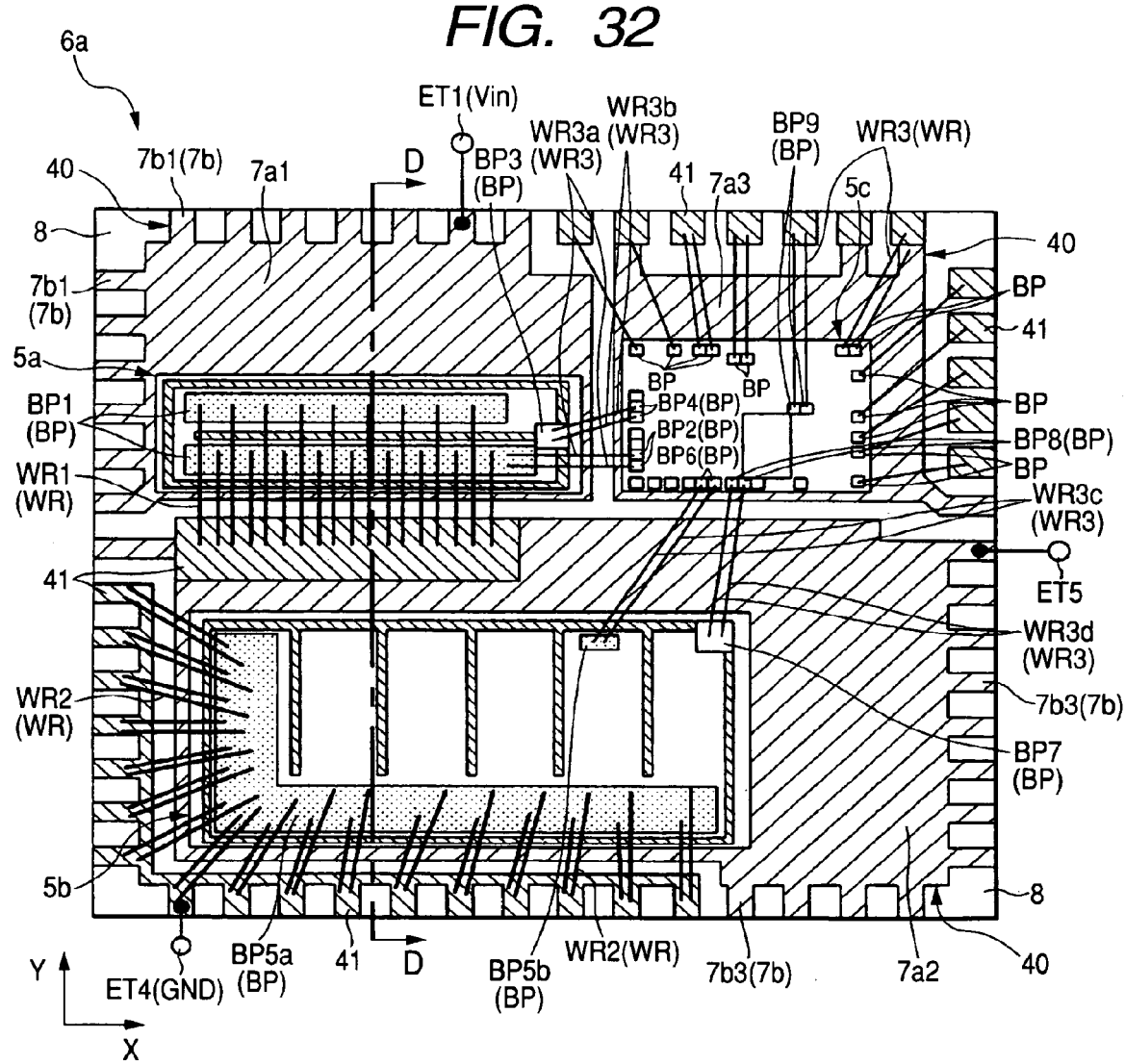
FIG. 32 is a plan view illustrating one example of a package configuration of a semiconductor device according to a sixth embodiment of the present invention.
Figure 33:
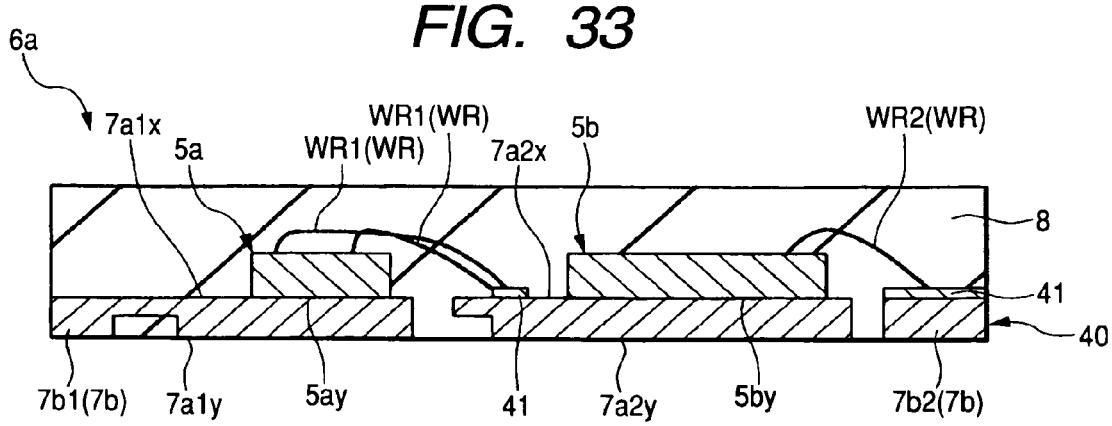
FIG. 33 is a cross-sectional view taken along line D-D of FIG. 32.
Figure 34:
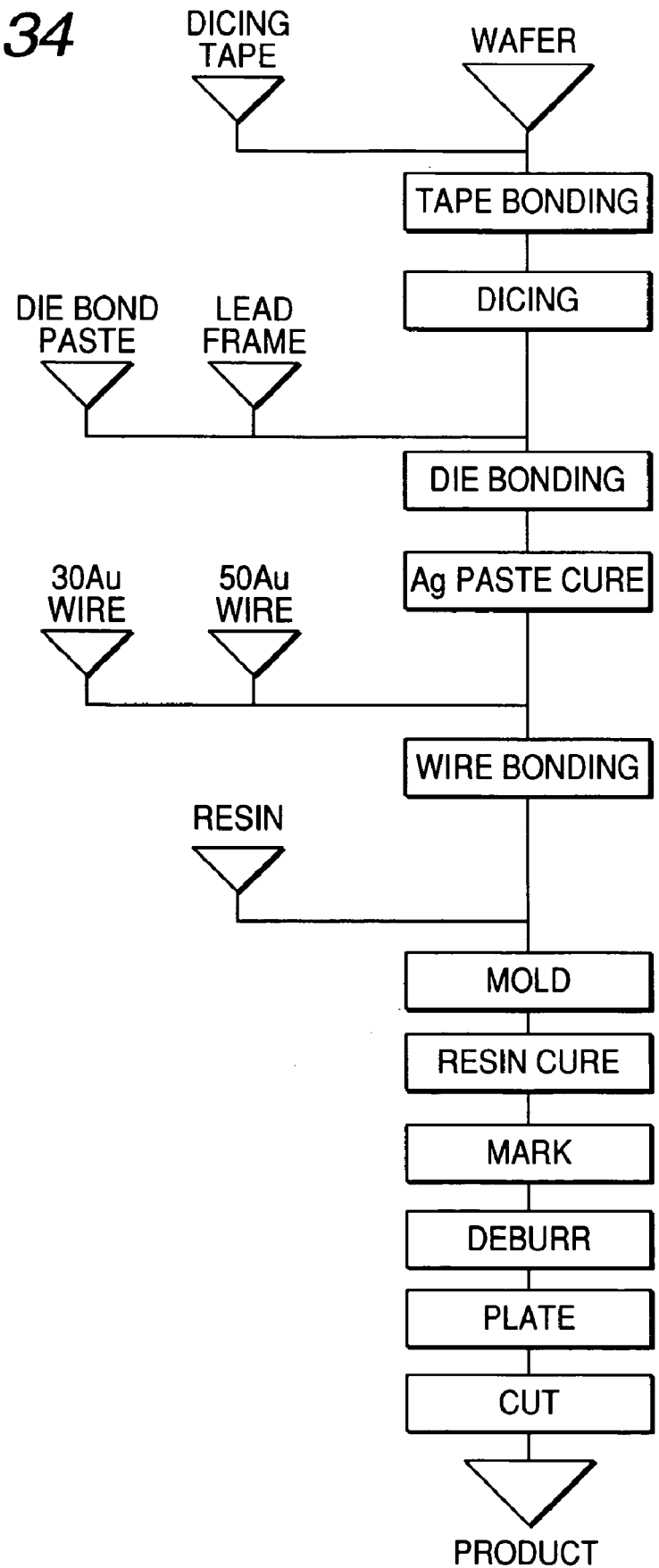
FIG. 34 is an assembly flow diagram showing a method for manufacturing the semiconductor device according to the sixth embodiment of the present invention.

FIG. 32 is a plan view showing one example of a package configuration of a semiconductor device according to a sixth embodiment of the present invention, FIG. 33 is a cross-sectional view taken along line D-D of FIG. 32, and FIG. 34 is an assembly flow diagram showing a method of manufacturing the semiconductor device according to the sixth embodiment, respectively. The semiconductor device described in FIG. 32 is substantially similar to the semiconductor device shown in FIG. 8 in configuration but principally different therefrom in that surface processing using silver paste is partly effected on the surface of a lead frame 40. Incidentally, FIG. 32 is also shown excepting semiconductor chips 5a, 5b and 5c, die pads 7a1, 7a2 and 7a3 and a resin encapsulation body 8 placed over leads 7b in order to make it easy to see the drawings. Further, the die pads 7a1, 7a2 and 7a3 and leads 7b are given hatching.

In the sixth embodiment, a paste material 41 constituted of, for example, silver (Ag) is applied only onto a portion to be subjected to wire boding in the lead frame 40 whose material comprises, for example, copper (Cu). Wires WR are formed of, for example, gold (Au).

Thus, the application of the paste material 41 like, for example, (Ag) onto the lead frame 40 enables wire bonding of the wires WR formed of, for example, gold (Au). Although the area to which silver paste is applied, might be weak in the force of adhesion to the resin encapsulation body 8 as compared with copper or the like used as a base or raw material for the lead frame 40, the area for contact between the lead frame 40 and the resin encapsulation body 8 can be sufficiently ensured owing to the application of the paste material 41 onto the wire bonding portion alone. It is therefore possible to improve the force of adhesion between copper constituting the lead frame 40 and the resin encapsulation body 8.

When such a lead frame 40 as described in the sixth embodiment is used, a process step for removing resin burrs formed in back surfaces 7a1y, 7a2y and 7a3y of the die pads 7a1, 7a2 and 7a3 after the formation of the resin encapsulation body 8 is performed as shown in FIG. 34.

Next, a plating process step for effecting solder plating for packaging a semiconductor substrate on the plural leads 7b and the back surfaces 7a1y, 7a2y and 7a3y of the die pads 7a1, 7a2 and 7a3 all exposed from the resin encapsulation body 8 is performed.

When the lead frame 40 formed of a copper (Cu) frame is used in this way, a failure in the substrate packaging of the semiconductor device due to the resin burrs can be suppressed because plating is done after the formation of the resin encapsulation body 8. That is, the reliability of the semiconductor device can be enhanced.

Seventh Preferred Embodiment

As another problem caused by increases in current and frequency of a non DC-DC converter, there is a problem about the reliability of the semiconductor device subsequent to the formation of the resin encapsulation body 8. Since, in particular, the first through fifth embodiments respectively have explained such a configuration that the plurality of die pads 7a1, 7a2 and 7a3 given lead-free plating like, for example, Ni/Pd/Au flush plating are accommodated or held in one package 6a, a high adhesive force is required. The present embodiment will explain a configuration which considers its adhesive force and takes into consideration preventive measures against lead omission.

Figure 35:
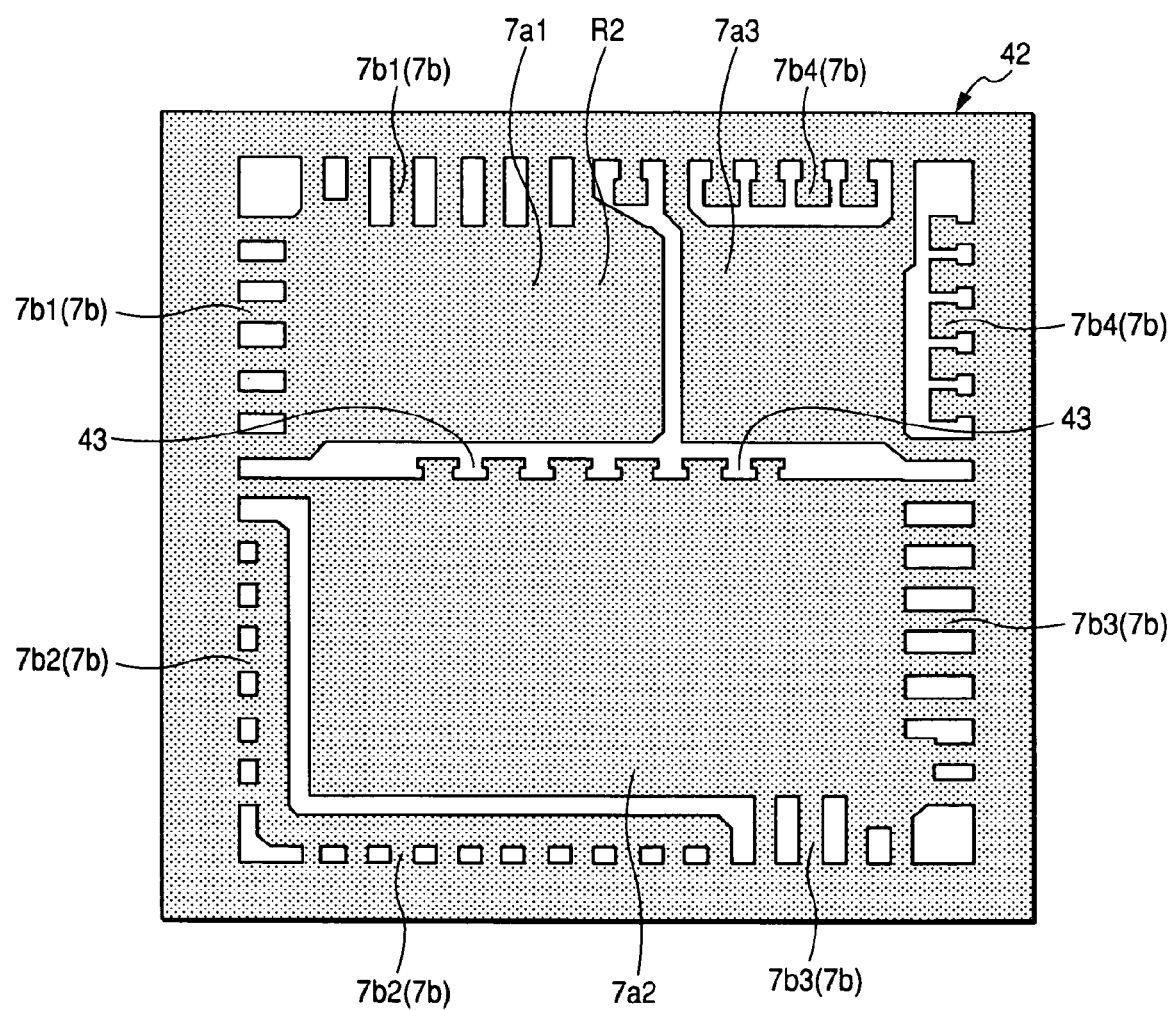
FIG. 35 is a plan view illustrating one example of the surface side of a unit area of a lead frame employed in a semiconductor device according to a seventh embodiment of the present invention.
Figure 36:
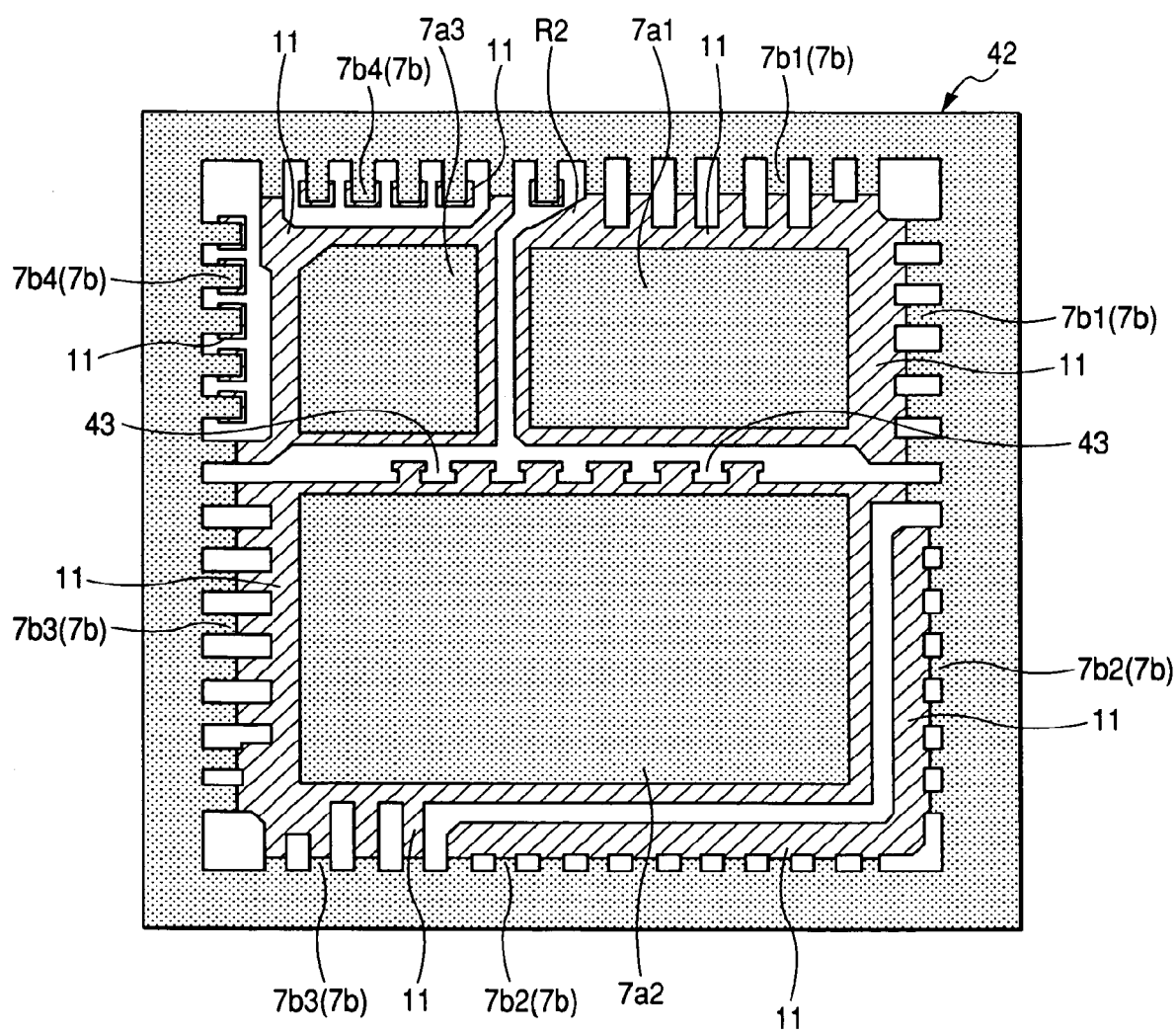
FIG. 36 is a plan view showing one example of the back surface side of the unit area of the lead frame shown in FIG. 35.

FIG. 35 is a plan view illustrating one example of the surface side of a unit area of a lead frame 42 employed in a semiconductor device according to the seventh embodiment of the present invention, and FIG. 36 is a plan view showing the back surface side of the lead frame shown in FIG. 35, respectively. Incidentally, half-etched areas are given hatching in order to make it easy to see the drawings even in the case of FIG. 36.

In the seventh embodiment, half etching is effected along peripheral portions of the back surfaces of the die pads 7a1, 7a2 and 7a3 in which their corresponding semiconductor chips 5a, 5b and 5c are placed. Further, cut-away portions (depressions and projections, recesses) 42 are formed in part of the half-etched area of the die pad 7a2 and portions faced with a slit that forms the boundary among the three die pads 7a1, 7a2 and 7a3. This is because the adhesion between the resin encapsulation body 8 and the lead frame is required in particular at the slit that forms the boundary among the three die pads 7a1, 7a2 and 7a3. Also this is done to enhance the force of adhesion to the resin encapsulation body 8 by forming the cut-away portions 43 so that a plurality of flat concavo-convex portions are formed in the slit. The cut-away portions are formed by etching, for example.

According to the seventh embodiment in this way, the peripheral portions of the die pads 7a1, 7a2 and 7a3 are half-etched and the cut-away portions 43 are formed in some of the half-etch area of the die pad 7a2. Consequently, the force of adhesion between the die pad 7a3 and the resin encapsulation body 8 becomes strong and the reliability of the semiconductor device can further be improved as compared with the first embodiment. That is, this results in a preventive measure against lead omission. Incidentally, the cut-away portions 43 are not limited to some of the half-etch area of the die pad 7a3. The cut-away portions 43 may be formed in parts of the half-etch areas of the die pads 7a2 and 7a3.

In the seventh embodiment, a taper R2 is formed at one corner on the surface side of the die pad 7a1. The taper R2 is formed by etching, for example.

Thus, since a path for an input power supply potential Vin supplied from a first power supply terminal (leads 7b1) extends, parasitic impedance LdH produced between the first power supply terminal and the drain of a first field effect transistor Q1 for a high side switch can be reduced. That is, the efficiency of voltage conversion can be enhanced.

Eighth Preferred Embodiment

An eighth embodiment will explain a modification of the configuration for the preventive measure against the lead omission.

Figure 37:
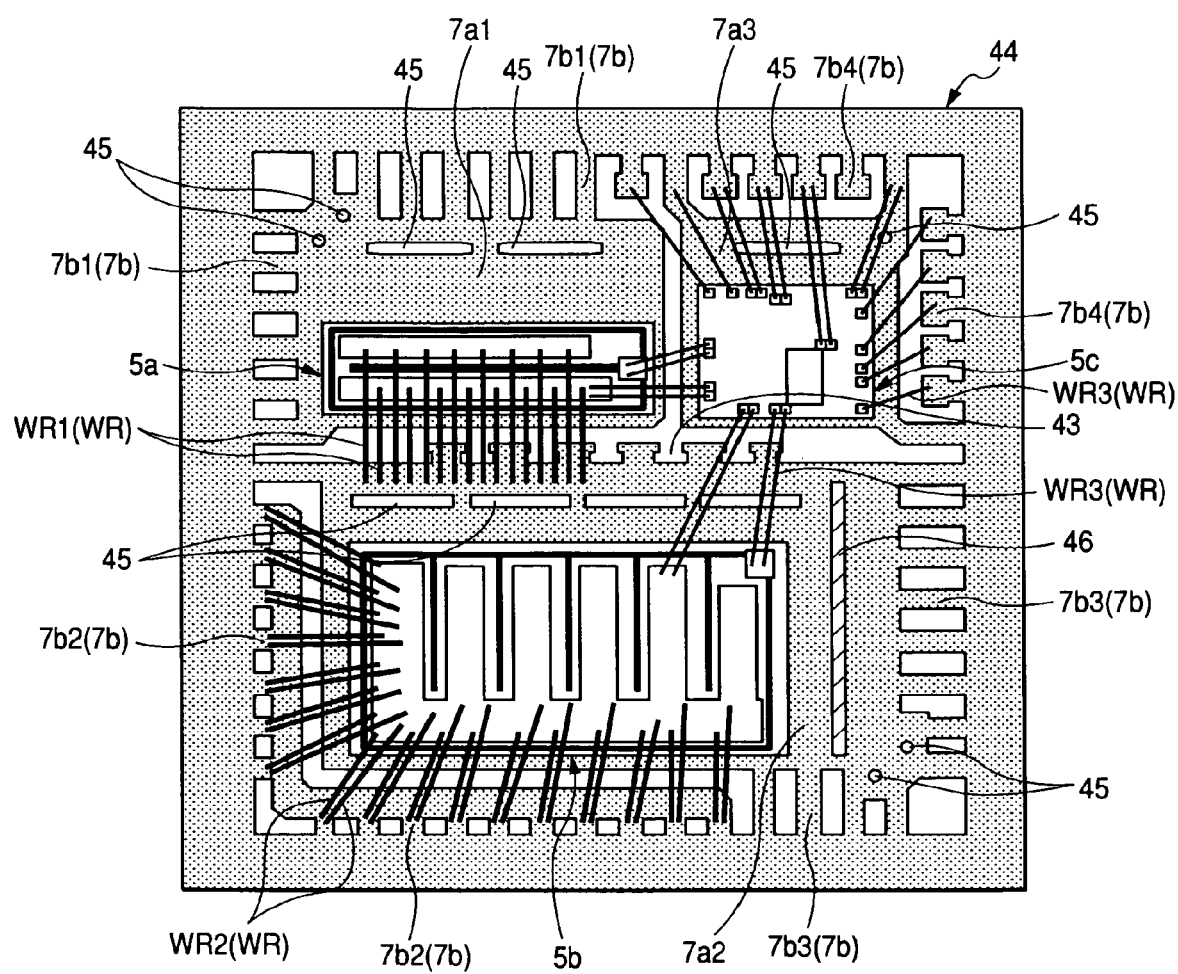
FIG. 37 is a plan view illustrating one example of the surface side of a unit area of a lead frame employed in a semiconductor device according to an eighth embodiment of the present invention.
Figure 38:
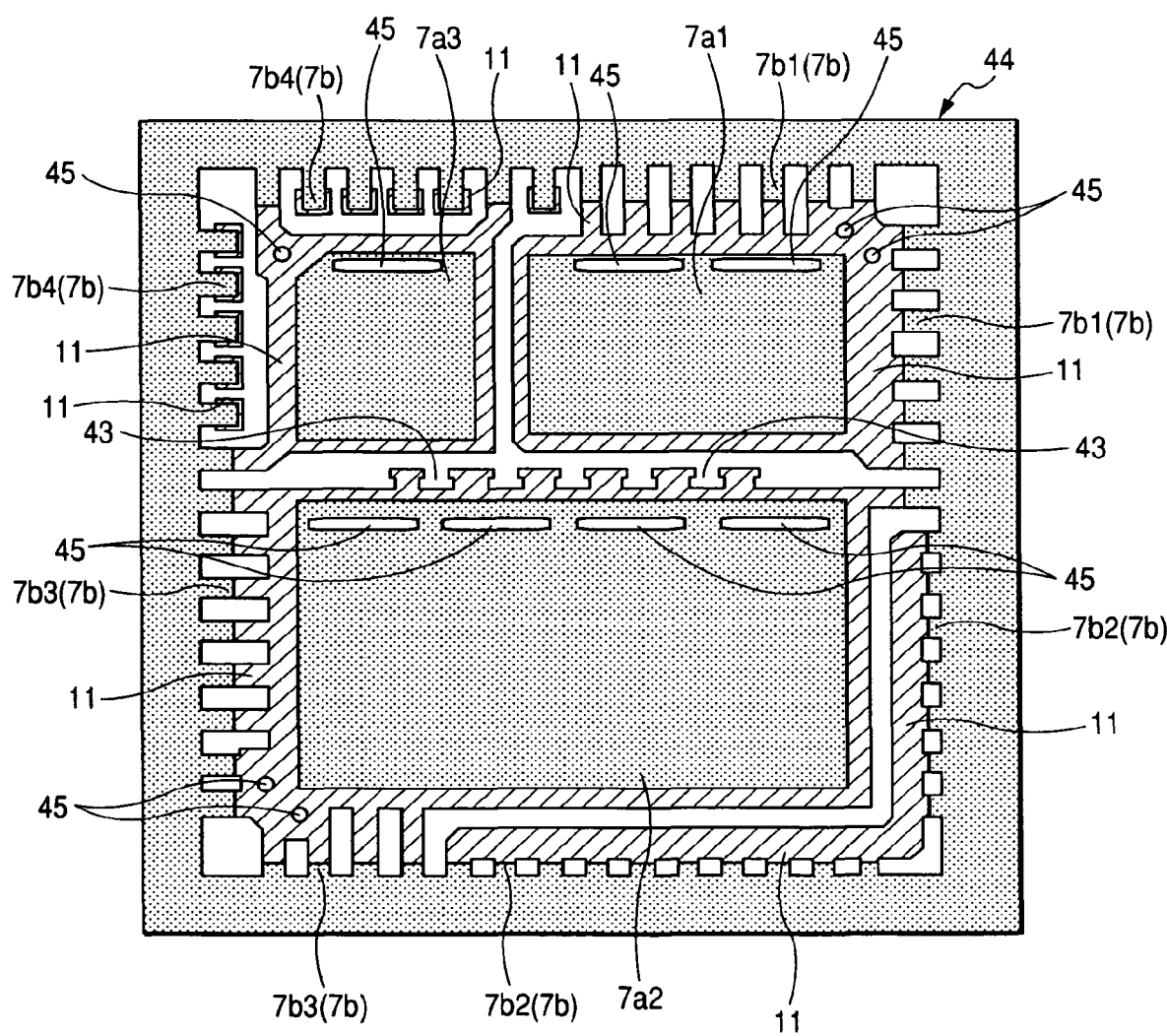
FIG. 38 is a plan view showing the back surface side of the unit area of the lead frame shown in FIG. 37.

FIG. 37 is a plan view illustrating one example of the surface side of a unit area of a lead frame 44 employed in a semiconductor device according to the eighth embodiment of the present invention, and FIG. 38 is a plan view showing the back surface side of the unit area of the lead frame 44 shown in FIG. 37, respectively. Incidentally, half-etched areas are given hatching in order to make it easy to see the drawings even in the case of FIG. 38.

In the eighth embodiment, half etching is effected along peripheral portions of the back surfaces of the die pads 7a1, 7a2 and 7a3 in which their corresponding semiconductor chips 5a, 5b and 5c are placed. Further, cut-away portions (depressions and projections, recesses) 43 are formed in part of the half-etched area of the die pad 7a3 and through holes (slits) 45 are defined in some of the die pads 7a1, 7a2 and 7a3. The cut-away portions 43 are formed by etching, for example. A trench 46 is defined in part of the surface of the die pad 7a2. The trench 46 is formed by etching or punching, for example.

Thus, according to the eighth embodiment, the through holes 45 are defined in the parts of the die pads 7a1, 7a2 and 7a3 to thereby make it possible to further strengthen the force of adhesion between each of the die pads 7a1, 7a2 and 7a3 and the resin encapsulation body 8 and further enhance the reliability of a semiconductor device as compared with the seventh embodiment. A phenomenon (self turn-on) occurs wherein when a first field effect transistor Q1 for a high side switch is switched to a second field effect transistor Q2 for a low side switch, a current (through current) flows from a first power supply terminal ET1 to a second power supply terminal. Therefore, the path for the through current can be cut off by forming the through holes 45 between a portion to be wire-bonded from the semiconductor chip 5a to the die pad 7a2 and the semiconductor chip 5b. It is therefore possible to suppress the self turn-on. Further, a current (first current) I1 that flows when the first field effect transistor Q1 for the high side switch is turned on, becomes easy to flow toward an output terminal. Since the strengths of the die pads 7a1, 7a2 and 7a3 are reduced as the number of the through holes 45 increases, the through holes 45 may preferably be formed only at the positions where the self turn-on is suppressed, as in the present embodiment.

On the other hand, since the trench 46 is formed on the side of the output terminal ET5 that supplies an output power supply potential to the outside in the die pad 7a2, the force of adhesion between the die pad 7a2 and the resin encapsulation body 8 can also be improved without cutting off the path for the current (first current) I1 supplied to the outside. It is therefore possible to further enhance the reliability of the semiconductor device as compared with the seventh embodiment. This is effective in improving the adhesive force when the through holes 45 are formed. Since, however, the path for the current (first current) I1 supplied to the outside becomes narrow, the resistance increases. Thus, it is not preferable to form the through holes 45 on the side of the output terminal ET5 that supplies the output power supply potential to the outside because the efficiency of voltage conversion is degraded.

Since the area of the die pad 7a2 is larger than that of the semiconductor chip 5b, the area for contact between the die pad 7a2 and the resin encapsulation body 8 becomes large. Since the force of adhesion between the die pad 7a2 and the resin encapsulation body 8 is lower than that between the semiconductor chip 5b and the resin encapsulation body 8, the formation of these through holes 45 and the trench 46 are effective when the die pad 7a2 is larger than the semiconductor chip 5b. Incidentally, the trench 46 is not limited to some of the surface of the die pad 7a2 but may be formed in respective parts on the surface sides of the die pads 7a1 and 7a3. The through holes 45 and the trench 46 are not limited to such shapes as shown in FIG. 37.

Ninth Preferred Embodiment

A ninth embodiment will explain a modification of the configuration for the preventive measure against the lead omission.

Figure 39:
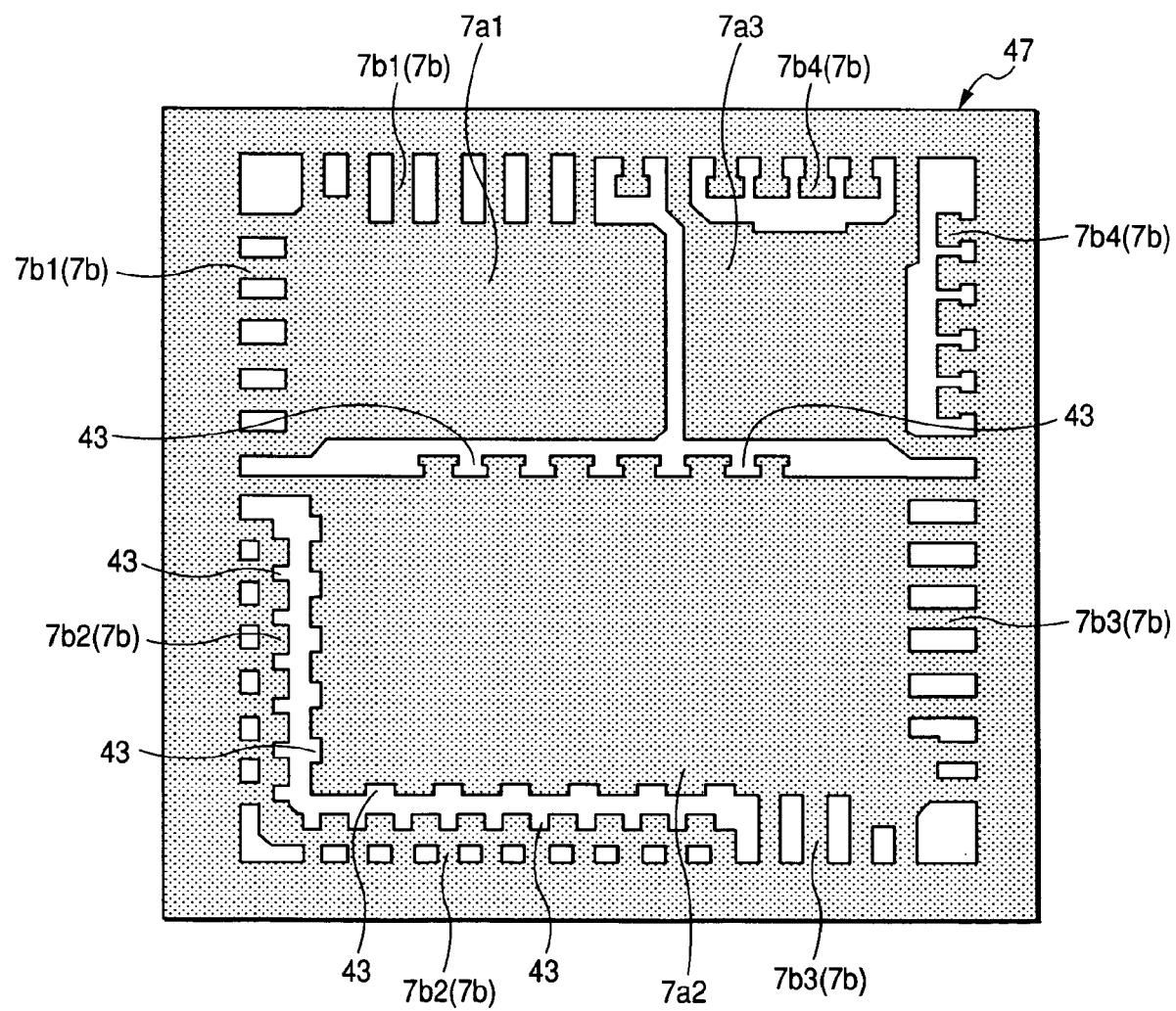
FIG. 39 is a plan view illustrating one example of the surface side of a unit area of a lead frame employed in a semiconductor device according to a ninth embodiment of the present invention.
Figure 40:
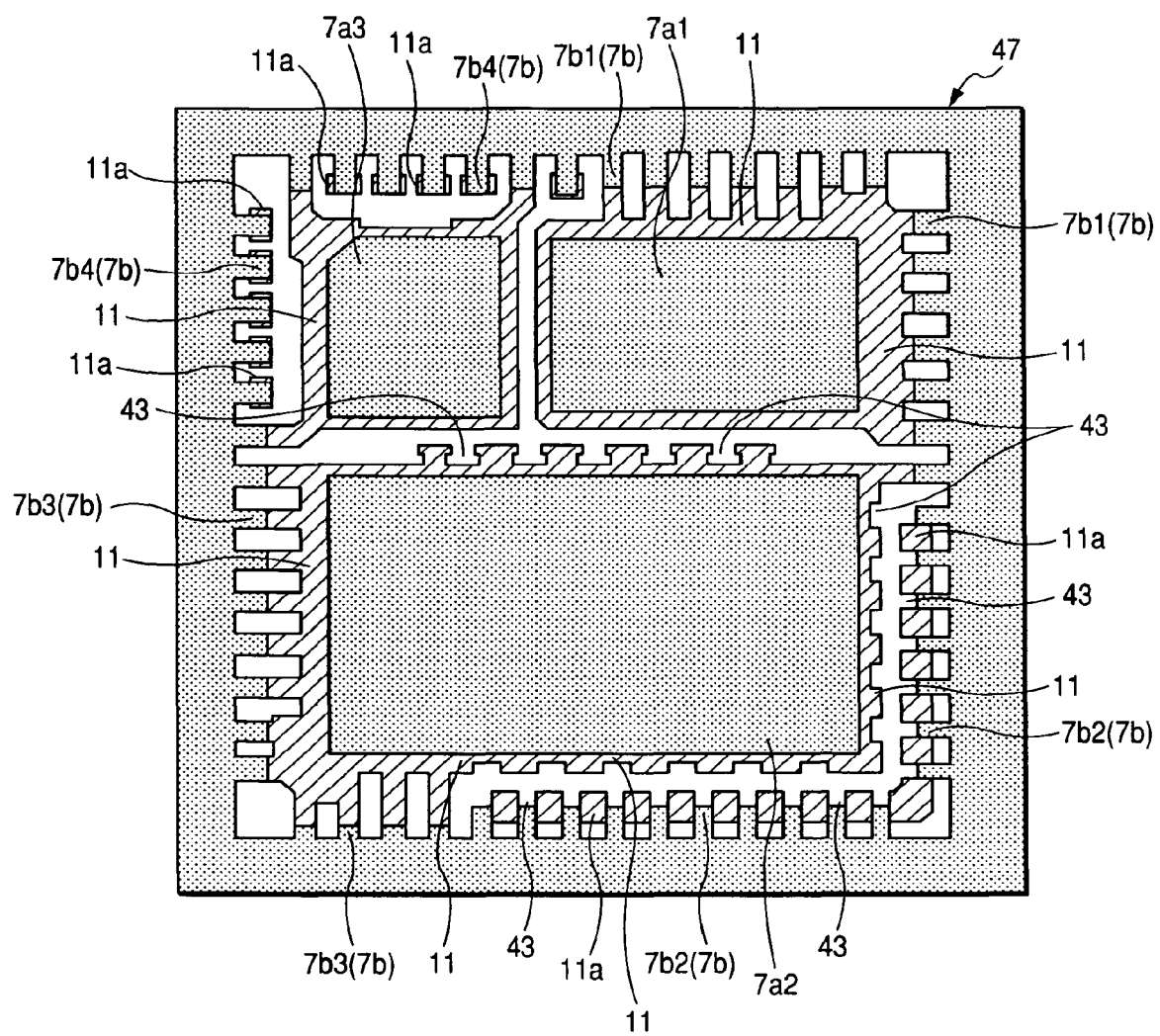
FIG. 40 is a plan view showing the back surface side of the unit area of the lead frame shown in FIG. 39.

FIG. 39 is a plan view illustrating one example of the surface side of a unit area of a lead frame 47 employed in a semiconductor device according to the ninth embodiment of the present invention, and FIG. 40 is a plan view showing the back surface side of the unit area of the lead frame 47 shown in FIG. 39, respectively. Incidentally, half-etched areas are given hatching in order to make it easy to see the drawings even in the case of FIG. 40.

In the ninth embodiment, half etching is effected along peripheral portions on the back surface sides of die pads 7a1, 7a2 and 7a3. Further, cut-away portions are formed in part of the half-etched areas. Cut-away portions are defined even in some of a second power supply terminal formed in an L-shaped fashion and subjected to half etching. At some of plural leads 7b, only side surface portions 11a of their leading ends are half-etched. The cut-away portions are formed by etching, for example.

According to the ninth embodiment in this way, the force of adhesion between each of the plural leads 7b and a resin encapsulation body 8 can also be further strengthened as well as enhancement of the force of adhesion between each of the die pads 7a1, 7a2 and 7a3 and the resin encapsulation body 8. This means that engagement with the resin encapsulation body 8 is improved by forming the cut-away portions in half-etched areas of the die pads 7a1, 7a2 and 7a3 and plural leads 7b.

There is a fear that since an ultrasonic wave is not successfully transferred to the half-etched areas upon wire bonding when the leading ends of the plural leads 7b are also half-etched, a bonding failure will occur. Therefore, only the side surfaces 11a of the leading ends are half-etched without half-etching the leading ends of the plural leads 7b. Consequently, the force of adhesion to the resin encapsulation body 8 can be strengthened and the bonding failure can further be suppressed.

Tenth Preferred Embodiment

Figure 41:
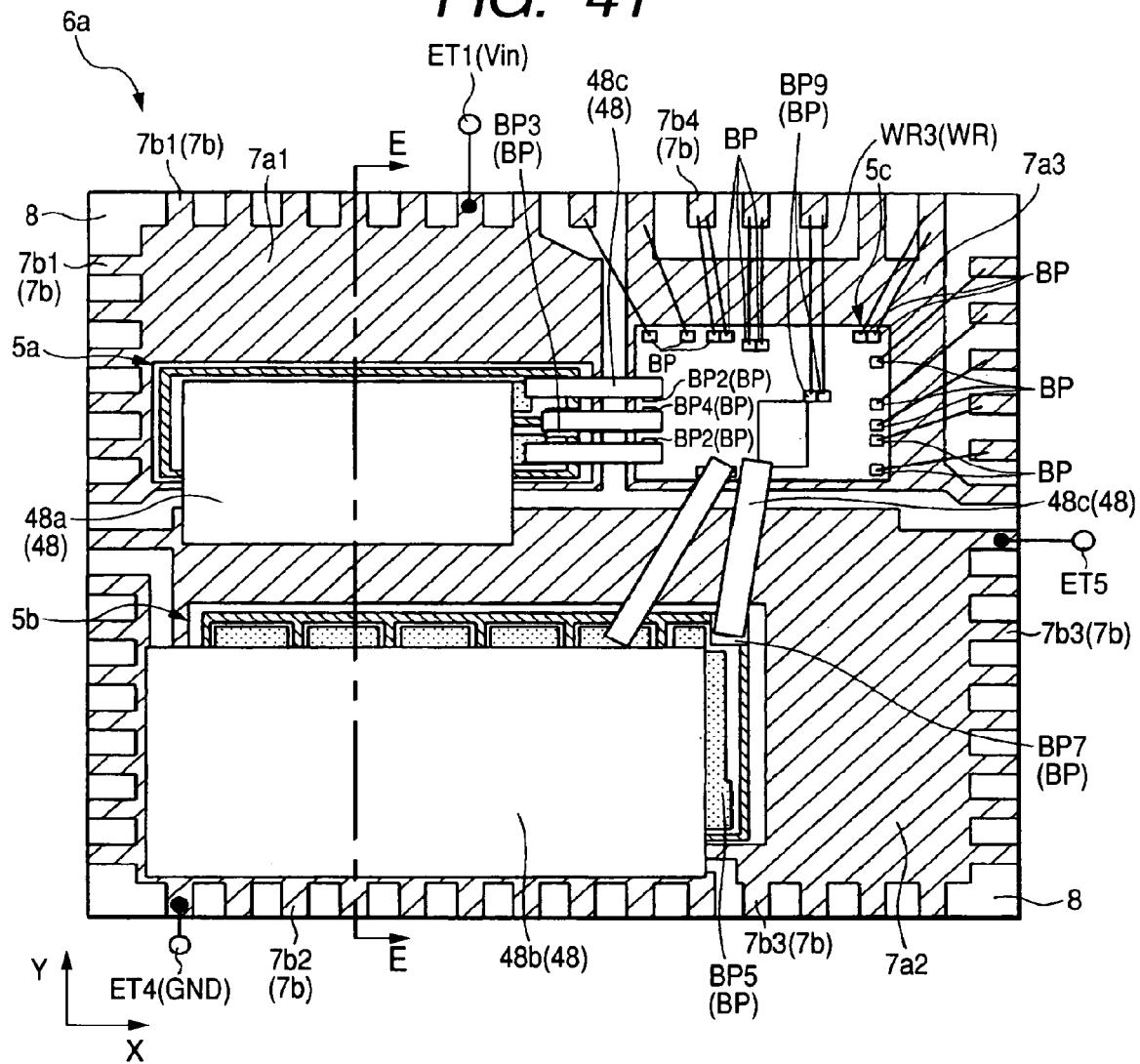
FIG. 41 is a plan view illustrating one example of a package configuration of a semiconductor device according to a tenth embodiment of the present invention.
Figure 42:
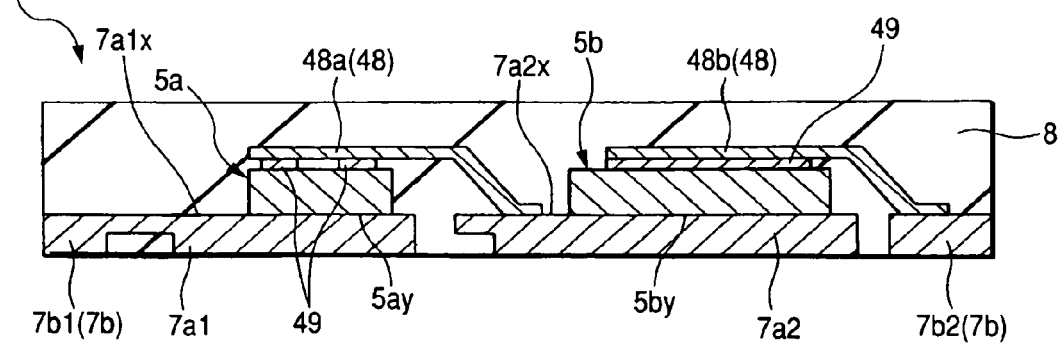
FIG. 42 is a cross-sectional view taken along line E-E of FIG. 41.

FIG. 41 is a plan view illustrating a configurational example of a package 6a including some circuits of a non-insulated type DC-DC converter 1 according to a tenth embodiment of the present invention, and FIG. 42 is a cross-sectional view taken along line E-E of FIG. 41, respectively. Incidentally, FIG. 41 is also shown excepting a partial resin encapsulation body 8 in order to make it easy to see the drawing. Further, die pads 7a1, 7a2 and 7a3 and leads 7b are given hatching.

In the tenth embodiment, some of wirings for electrically connecting electrode pads BP and respective parts are configured as metal plate wirings 48 in place of the wires WR. That is, source electrode pads BP1 of a first field effect transistor Q1 of a semiconductor chip 5a are electrically connected to the die pad 7a2 through-one metal plate wiring 48a. Source electrode pads BP5 of a second field effect transistor Q2 of a semiconductor chip 5b are electrically connected to leads 7b2 (7b) through one metal plate wiring 48b. The metal plate wiring 48 is formed of a metal like, for example, copper (Cu) or aluminum (Al) or the like and electrically connected to electrode pads BP and leads 7b through bump electrodes 49. The bump electrodes 49 are formed of a metal like, for example, solder or gold (Au) or the like. A conductive resin may be used in place of the bump electrodes 49. The metal plate wiring 48 is also covered with a resin encapsulation body 8 over its entirety.

According to the tenth embodiment in this way, the inductance parasitized on each wiring path can further be reduced owing to the use of the metal plate wiring 48 in place of the wires WR. Therefore, a switching loss can further be reduced and the efficiency of voltage conversion of the non-insulated type DC-DC converter 1 can be further improved as compared with the first embodiment.

When attention is given only to the inductance parasitized on each wiring path, the wires WR3 (WR) that electrically connect the plural electrode pads BP of first and second control circuits 3a and 3b and their respective parts, may preferably be formed of a metal plate wiring 48c (48). However, at the plural electrode pads BP of the first and second control circuits 3a and 3b, apertures therefor are narrow like 90 μm, for example. Even if they are connected by the metal plate wirings 48 in place of the wires WR, the metal plate wirings 48 narrow in width are used. Therefore, this does not lead to a reduction in parasitized inductance as compared with the wires WR. It is further hard to manufacture the metal plate wirings 48 of, for example, 100 μm or less. It is also difficult to connect the same as compared with the wires WR. Therefore, the cost of each product increases and the yield thereof is reduced. Thus, it is not preferable to electrically connect the plural electrode pads BP of the first and second control circuits 3a and 3b and their respective parts by the metal plate wirings 48.

However, since it is desired to reduce the inductances parasitized on the wiring paths between the first and second field effect transistors Q1 and Q2 and the first and second control circuits 3a and 3b as shown in FIG. 8, a plurality of wires WR are connected side by side. In this case, the plurality of wires WR are combined into one metal plate wiring 48. Consequently, the width of the metal plate wiring 48 is also expanded to 200 μm, for example and the metal plate wiring may also electrically be connected. Thus, the first and second field effect transistors Q1 and Q2 and the first and second control circuits 3a and 3b are electrically connected to one another by the metal plate wirings 48 to reduce the parasitized inductances, so that the switching loss can be improved.

Eleventh Preferred Embodiment

Figure 43:
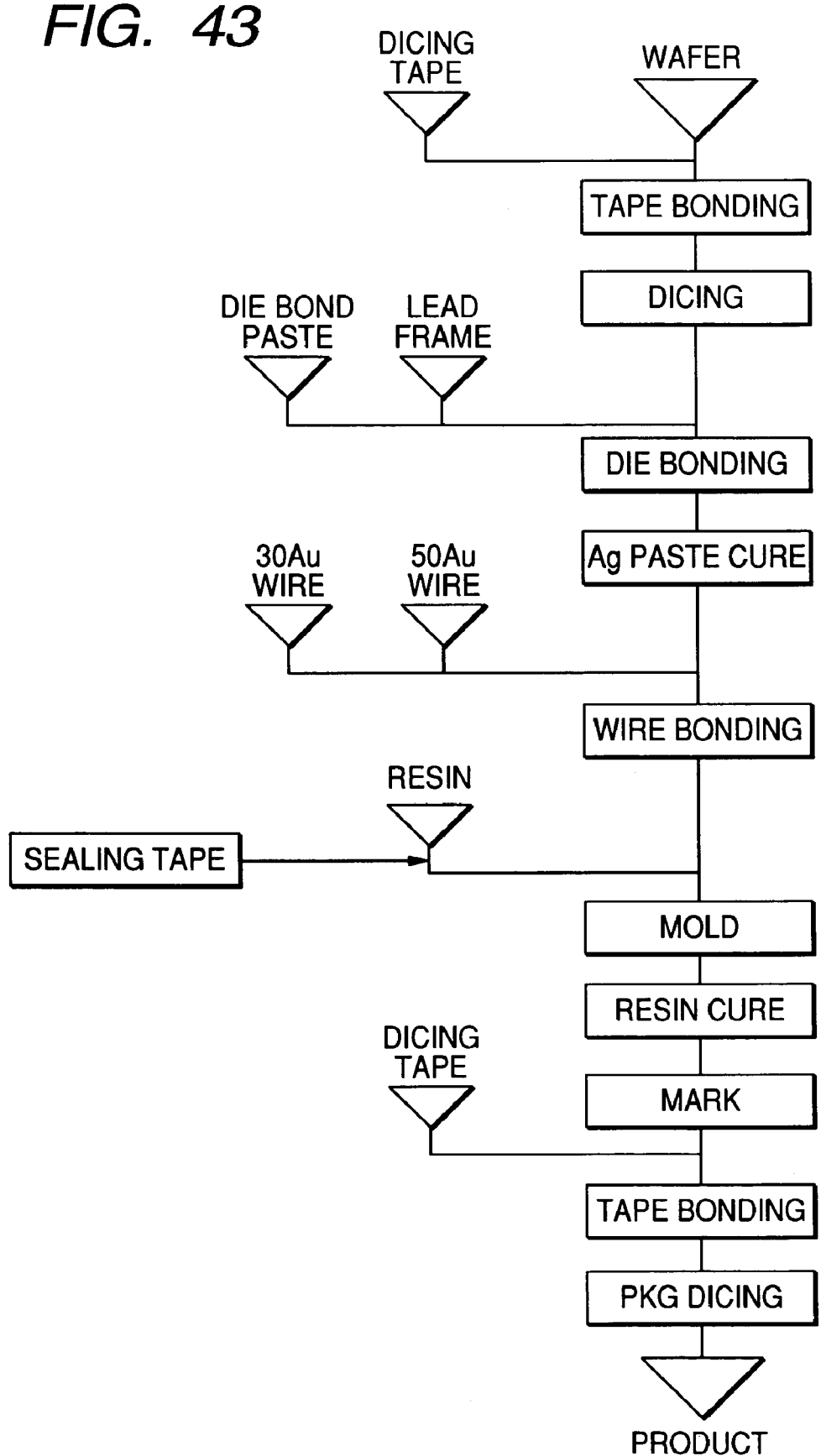
FIG. 43 is an assembly flow diagram showing a method for manufacturing a semiconductor device according to an eleventh embodiment of the present invention.

FIG. 43 is an assembly flow diagram showing a method for manufacturing the semiconductor device according to the tenth embodiment of the present invention.

The eleventh embodiment adopts a batch type transfer molding method for using a multicavity lead frame having a plurality of product forming areas and collectively resin-encapsulating the semiconductor chips 5a, 5b and 5c mounted in the respective product forming areas.

In the batch type transfer molding method, a resin encapsulation body 8 is formed and thereafter the multicavity lead frame and the resin encapsulation body 8 are divided into plural pieces or fractions by dicing, for example. Accordingly, the resin encapsulation body 8 and lead frame employed in the eleventh embodiment are substantially identical in outer size.

According to the eleventh embodiment as described above, a plurality of semiconductor devices can be obtained by one resin encapsulation. It is therefore possible to enhance product yields and reduce the cost of each product as compared with the first embodiment.

Twelfth Preferred Embodiment

Figure 44:
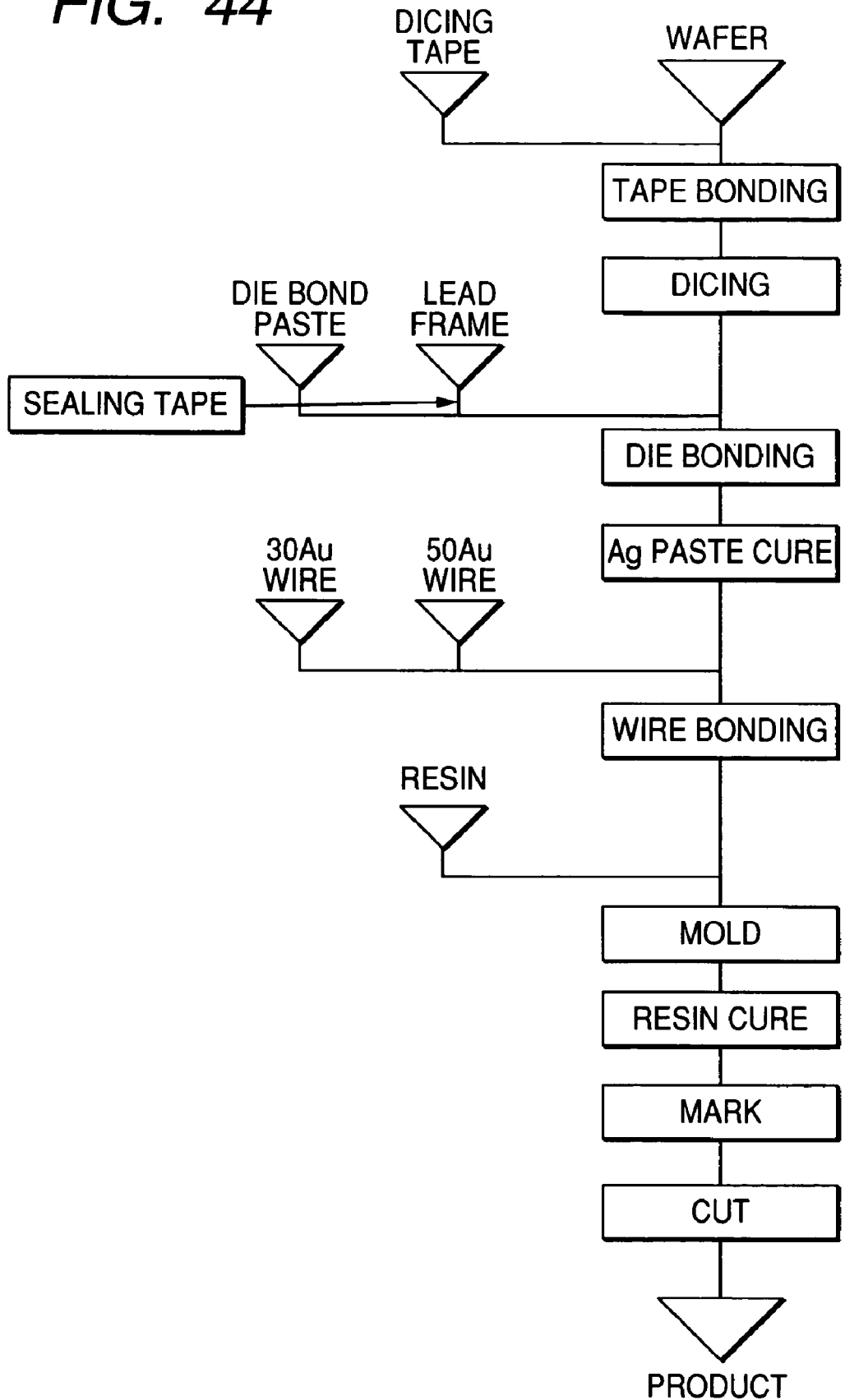
FIG. 44 is an assembly flow diagram illustrating a method for manufacturing a semiconductor device according to a twelfth embodiment of the present invention.

FIG. 44 is an assembly flow diagram showing a method for manufacturing the semiconductor device according to the eleventh embodiment of the present invention.

In the present embodiment, a lead frame 10 is placed on a sealing tape prior to at least a wiring bonding step. When the lead frame 10 having the die pads divided into plural form is used as in each of the above embodiments, the die pads become instable upon wire bonding, thereby causing a fear that a bonding failure will occur. Further, when the thick wires WR are wire-bonded as in the first embodiment, they are placed under a higher load and connected by an ultrasonic wave, and hence the bonding failure is easy to further take place. There is a fear that even upon a die bonding step, the die pads become instable and hence a failure in packaging will occur.

Thus, according to the twelfth embodiment, the lead frame 10 is placed over the sealing tape prior to the die bonding step to thereby stabilize the respective die pads, whereby the failure in packaging and the failure in wire bonding can be suppressed.

Thirteenth Preferred Embodiment

As a problem caused by increases in current and frequency of a non DC-DC converter 1, may be mentioned a problem about heat at its operation. Since, in particular, the first through tenth embodiments respectively have explained such a configuration that the three semiconductor chips 5a, 5b and 5c are accommodated or held in one package 6a, high dissipation is required. The present embodiment will explain a configuration that has taken into consideration its dissipation.

Figure 45:
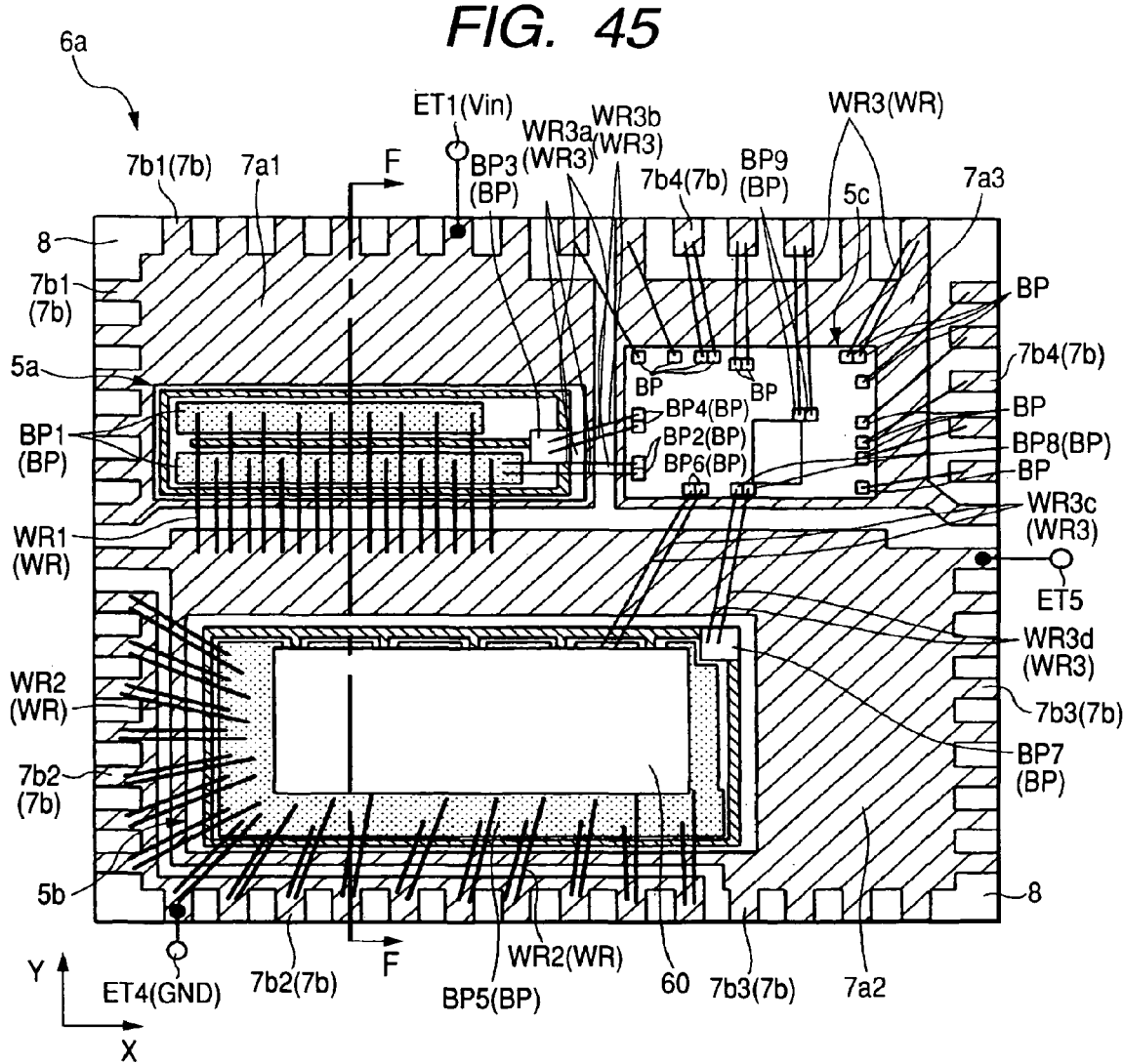
FIG. 45 is a plan view depicting one example of a package configuration of a semiconductor device according to a thirteenth embodiment of the present invention.
Figure 46:
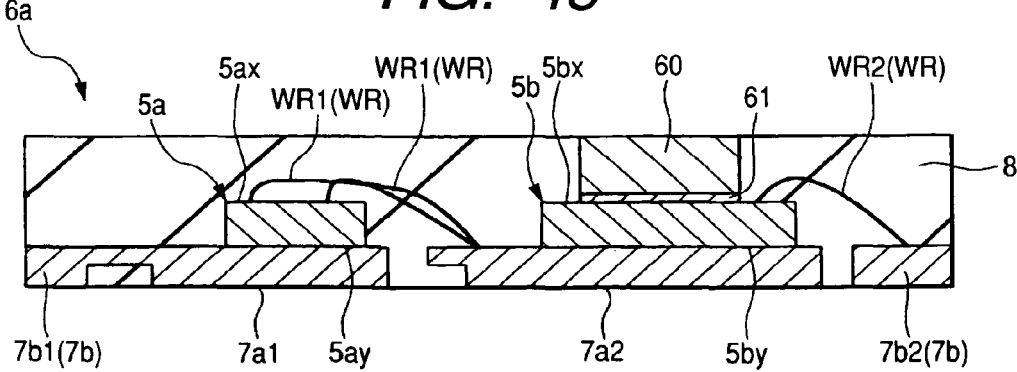
FIG. 46 is a cross-sectional view taken along line F-F of FIG. 45.
Figure 47:
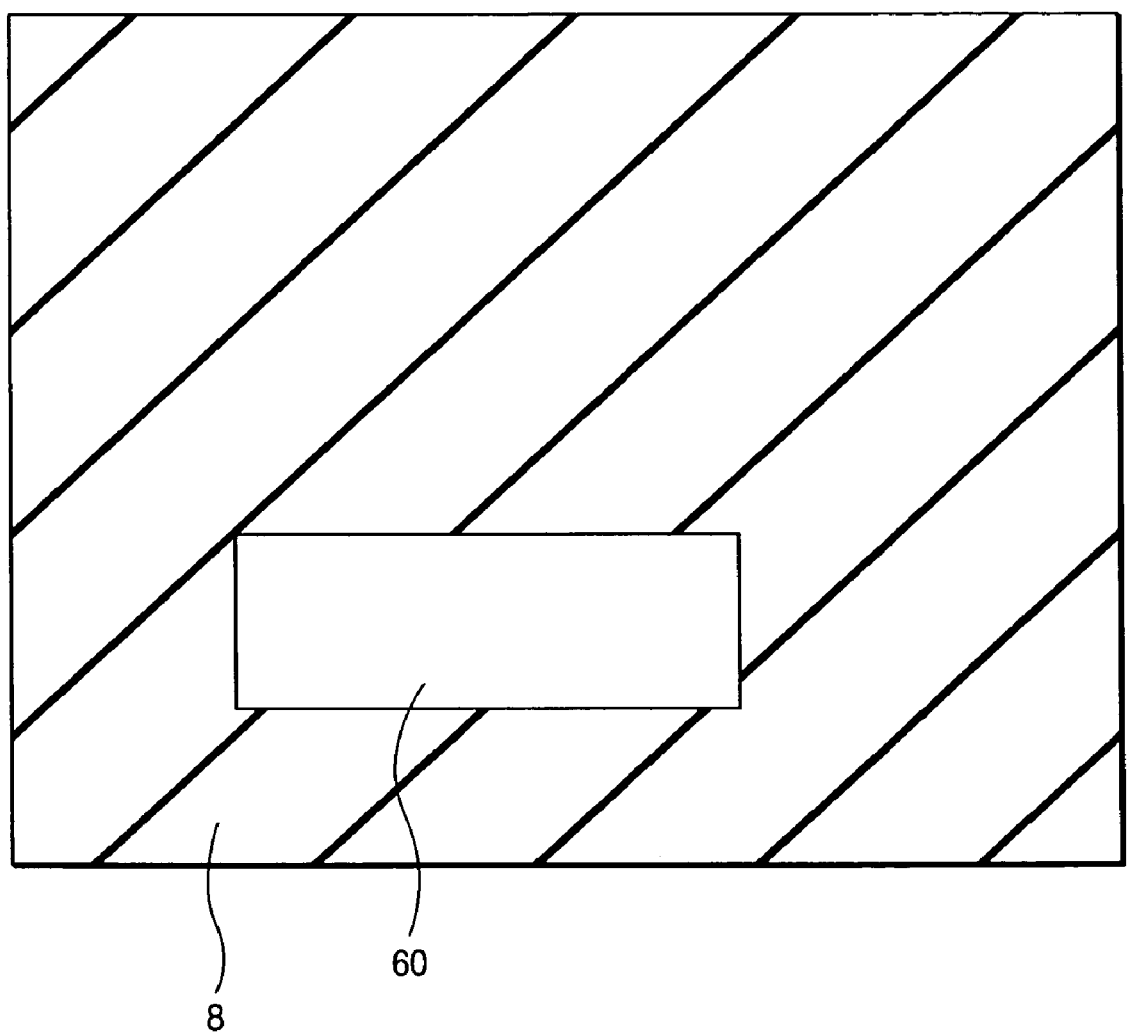
FIG. 47 is an overall plan view showing the surface side of the semiconductor device shown in FIG. 45.

FIG. 45 is a plan view illustrating a configurational example of a package 6a including some circuits of a non-insulated type DC-DC converter 1 according to a thirteenth embodiment of the present invention, and FIG. 46 is a cross-sectional view taken along line F-F of FIG. 45, and FIG. 47 is an overall plan view showing the surface side of a semiconductor device according to the present embodiment, respectively. Incidentally, FIG. 45 is also shown excepting a partial resin encapsulation body 8 in order to make it easy to see the drawing. Further, die pads 7a1, 7a2 and 7a3 and leads 7b are given hatching.

In the thirteenth embodiment, a metal body 60 is bonded onto a main surface of a semiconductor chip 5b, and part of the metal body 60 is exposed from the resin encapsulation body 8. The metal body 60 is formed of a metal high in thermal conductivity like, for example, copper or aluminum or the like and bonded to a source electrode pad BP5 of a semiconductor chip 5b through solder or an adhesive material 61 formed of a conductive resin or the like. Since the semiconductor chip 5b is longer than the semiconductor chip 5a in on time as shown in FIG. 3, the semiconductor chip 5b is apt to generate heat in particular. Therefore, the metal body 60 is disposed so as to cover an area for forming a second field effect transistor Q2 corresponding to a heat generation source of the semiconductor chip 5b. In this structure, heat generated at the semiconductor chip 5b is radiated into the wiring board side through the die pad 7a2 from the back surface of the semiconductor chip 5b. In addition to it, the heat is radiated to the outside through the metal body 60 even from the main surface of the semiconductor chip 5b as shown in FIGS. 46 and 47. Thus, high dissipation can be obtained. A further improvement in dissipation can be carried out by placing a radiating fin over the upper surface of the package 6a and bonding it onto an exposed surface of the metal body 60.

Fourteenth Preferred Embodiment

The present embodiment will explain a modification of the heat radiation construction.

Figure 48:
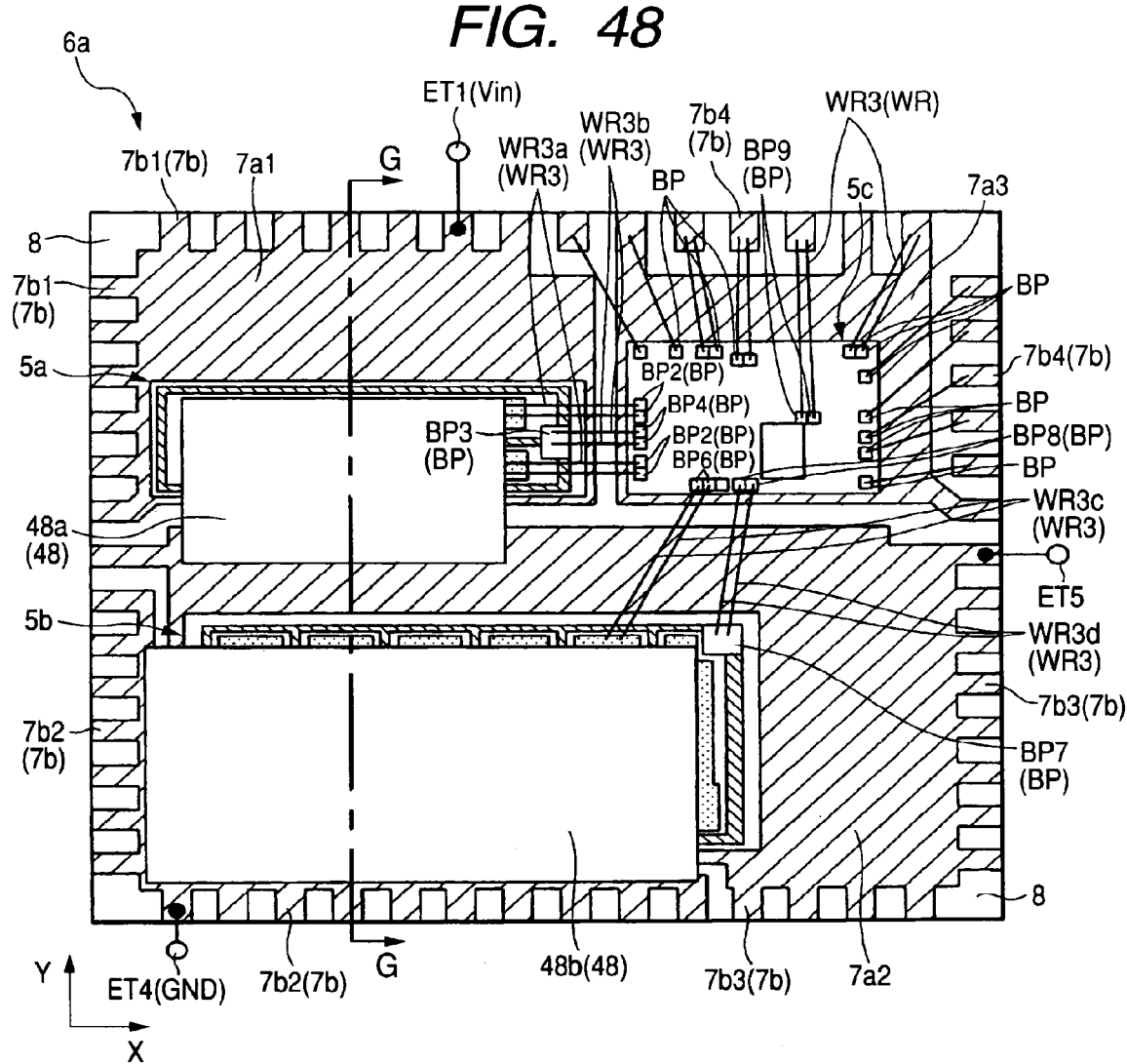
FIG. 48 is a plan view illustrating one example of a package configuration of a semiconductor device according to a fourteenth embodiment of the present invention.
Figure 49:
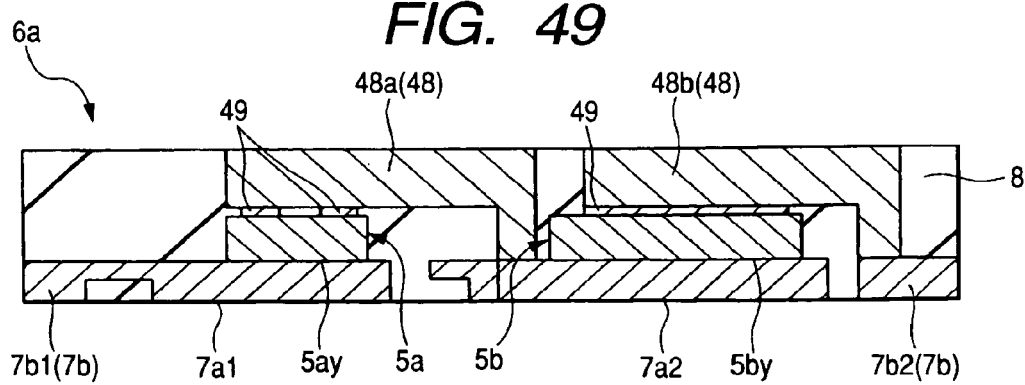
FIG. 49 is a cross-sectional view taken along line G-G of FIG. 48.
Figure 50:
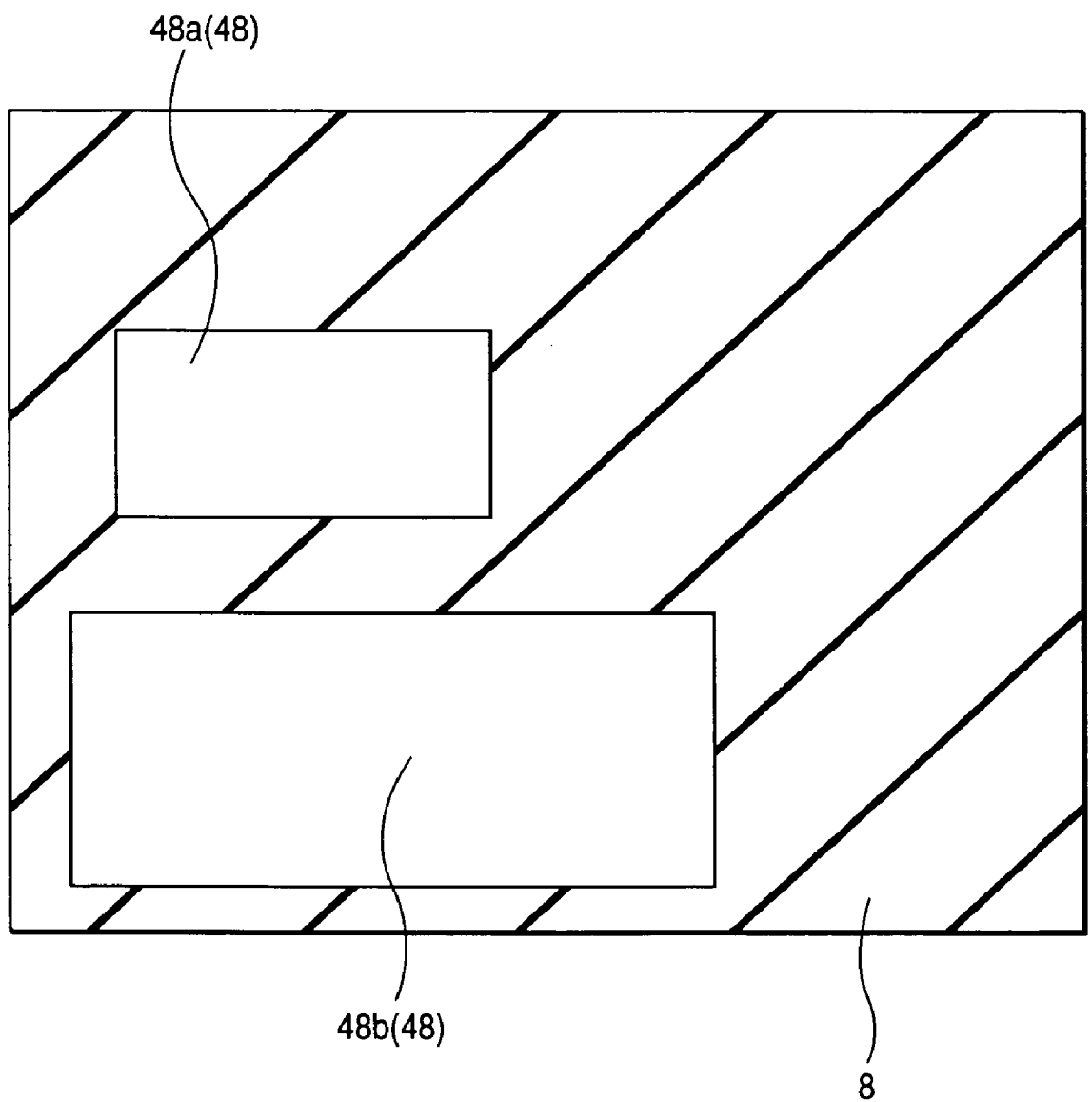
FIG. 50 is an overall plan view showing the surface side of the semiconductor device shown in FIG. 48.

FIG. 48 is a plan view illustrating a configurational example of a package 6a including some circuits of a non-insulated type DC-DC converter 1 according to the fourteenth embodiment of the present invention, FIG. 49 is a cross-sectional view taken along line G-G of FIG. 48, and FIG. 50 is an overall plan view showing the surface side of a semiconductor device according to the fourteenth embodiment, respectively. Incidentally, FIG. 48 is also shown excepting a partial resin encapsulation body 8 in order to make it easy to see the drawing. Further, die pads 7a1, 7a2 and 7a3 and leads 7b are given hatching.

In the fourteenth embodiment, some of wirings for electrically connecting electrode pads BP and respective parts are configured as metal plate wirings 48 in place of the wires WR in a manner similar to the tenth embodiment. Further, some of the metal plate wirings 48 are exposed from the resin encapsulation body 8. The metal plate wirings 48 are disposed so as to cover areas for forming first and second field effect transistors Q1 and Q2 corresponding to heat generation sources of semiconductor chips 5a and 5b in particular. Although the metal plate wirings 48a and 48b on both sides of the semiconductor chips 5a and 5b are exposed from the upper surface of the package 6a in FIGS. 48 through 50, such a configuration that only the metal plate wiring 48b on the semiconductor chip 5b side in which the second field effect transistor Q2 for the low side switch relatively high in the amount of generated heat is formed, may be adopted. Even in the present embodiment, a further improvement in heat radiation can also be achieved by placing a radiating fin over the upper surface of the package 6a and bonding it to an exposed surface of each metal plate wiring 48.

According to the fourteenth embodiment, each of the metal plate wirings 48 is caused to have a radiating function in addition to advantageous effects obtained at the tenth and thirteenth embodiments. Thus, there is no need to add other parts for radiation. Therefore, the number of the process steps for assembling the package 6a can be reduced as compared with the thirteenth embodiment, and the time required to assemble the package 6a can be shortened. Since the number of parts can be decreased, the cost of the semiconductor device can be reduced.

Fifteenth Preferred Embodiment

The present embodiment will explain a modification of the heat radiation construction.

Figure 51:
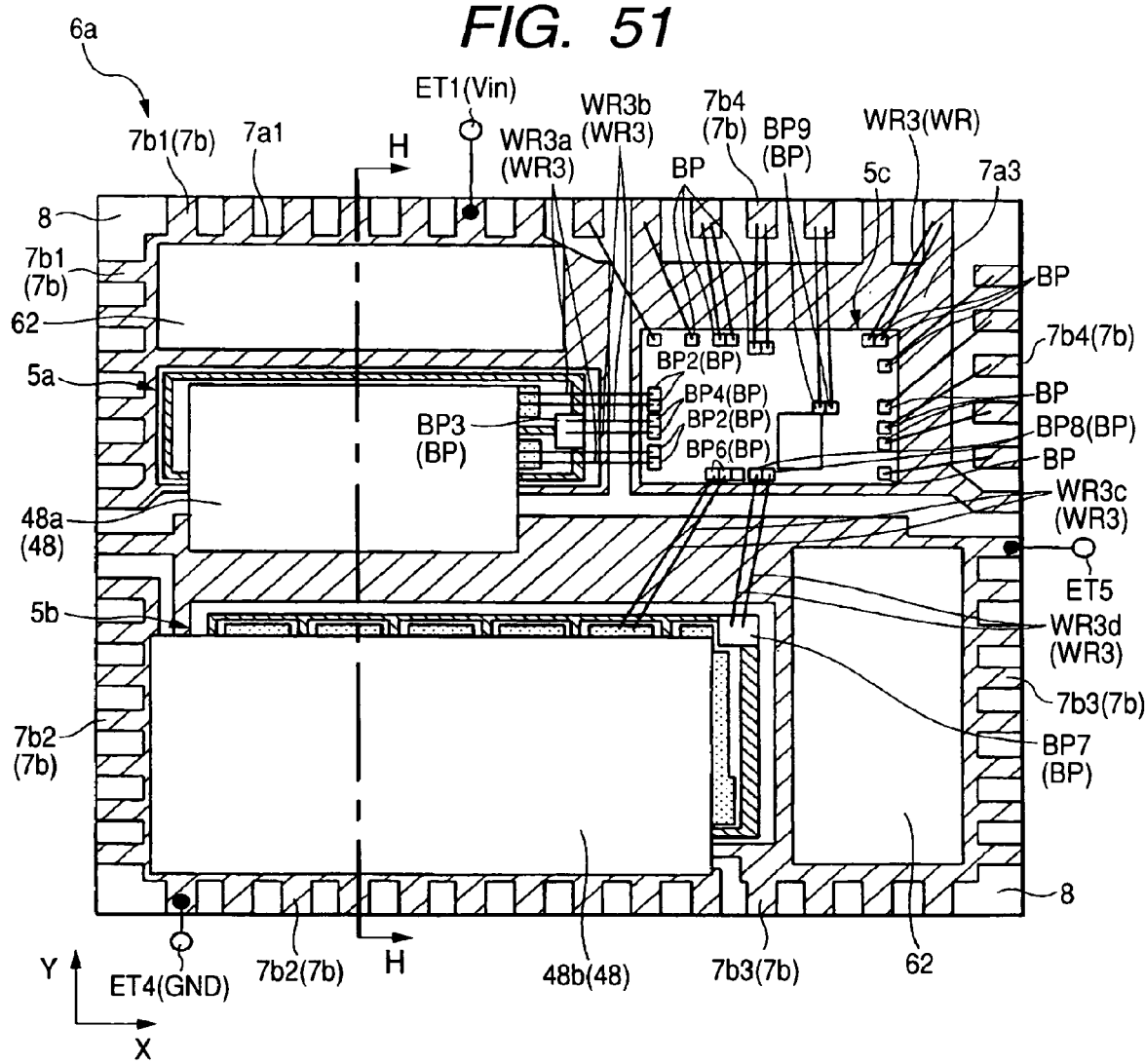
FIG. 51 is a plan view illustrating one example of a package configuration of a semiconductor device according to a fifteenth embodiment of the present invention.
Figure 52:
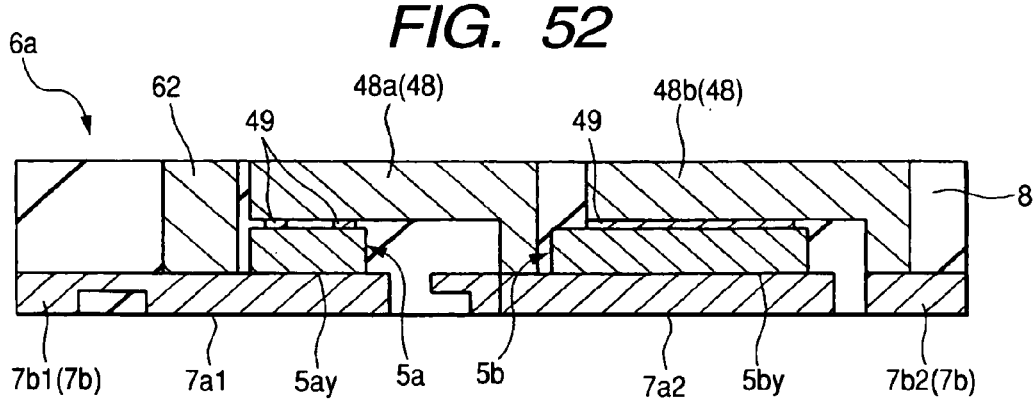
FIG. 52 is a cross-sectional view taken along line H-H of FIG. 51.
Figure 53:
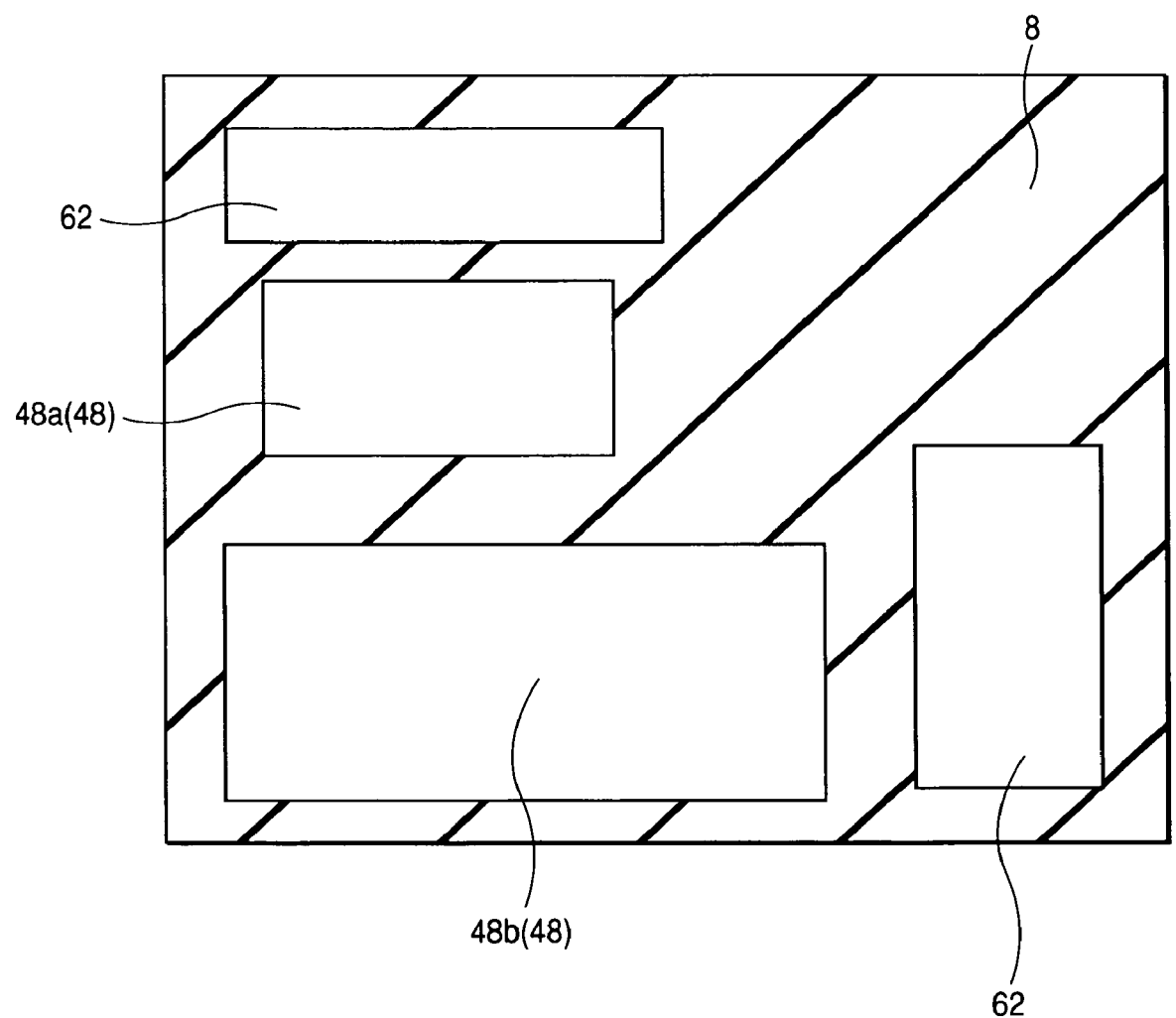
FIG. 53 is an overall plan view showing the surface side of the semiconductor device shown in FIG. 51.

FIG. 51 is a plan view illustrating a configurational example of a package 6a including some circuits of a non-insulated type DC-DC converter 1 according to the fifteenth embodiment of the present invention, FIG. 52 is a cross-sectional view taken along line H-H of FIG. 51, and FIG. 53 is an overall plan view showing the surface side of a semiconductor device according to the fifteenth embodiment, respectively. Incidentally, FIG. 51 is also shown excepting a partial resin encapsulation body 8 in order to make it easy to see the drawing. Further, die pads 7a1, 7a2 and 7a3 and leads 7b are given hatching.

In the fifteenth embodiment, some of wirings for electrically connecting electrode pads BP and respective parts are configured as metal plate wirings 48 in place of the wires WR in a manner similar to the fourteenth embodiment. Further, some of the metal plate wirings 48 are exposed from the resin encapsulation body 8. The metal plate wirings 48 are disposed so as to cover areas for forming first and second field effect transistors Q1 and Q2 corresponding to heat generation sources of semiconductor chips 5a and 5b in particular. Further, metal bodies 62 are respectively bonded onto the surfaces of the die pads 7a1 and 7a2, and some of the metal bodies 62 are exposed from the resin encapsulation body 8 as shown in FIGS. 51 through 53. In this structure, heat generated at the semiconductor chips 5a and 5b are radiated from the back surfaces of the semiconductor chips 5a and 5b to the wiring board side through the die pads 7a1 and 7a2. Besides, the heat is radiated to the outside even from a main surface of the semiconductor chip 5b through the metal plate wiring 48. Furthermore, the heat are radiated from the back surfaces of the semiconductor chips 5a and 5b to the outside of the resin encapsulation body 8 through the die pads 7a1 and 7a2 and metal bodies 62. Thus, dissipation higher than the twelfth and thirteenth embodiments can be obtained. The dissipation can be further improved by placing a radiating fin over the upper surface of the package 6a and bonding it onto an exposed surface of each metal body 62.

According to the fifteenth embodiment, each metal plate wiring 48 is caused to have a lead-omission preventing function in addition to the advantageous effects obtained at the tenth, thirteenth and fourteenth embodiments. In the present embodiment, the areas of the die pads 7a1, 7a2 and 7a3 are formed larger than those of semiconductor chips 5a, 5b and 5c. The semiconductor chips 5a, 5b and 5c are respectively disposed so as to approach one sides of the die pads 7a1, 7a2 and 7a3. Therefore, since any mounting-free large flat areas exist in the die pads 7a1 and 7a2 in particular, the force of adhesion to the resin encapsulation body 8 is weak. Thus, the metal bodies 62 are placed over the die pads 7a1 and 7a2. Consequently, the force of adhesion between each of the die pads 7a1 and 7a2 and the resin encapsulation body 8 can be made high as well as an improvement in radiating effect, thereby making it possible to further improve the reliability of the semiconductor device.

While the invention made above by the present inventors has been described specifically based on the embodiments, the present invention is not limited to the embodiments. It is needless to say that various changes can be made without the scope not departing from the gist thereof.

Although the above embodiment has illustrated the flat package structure as the package structure, for example, the present invention is not limited to it. For example, a BGA (Ball Grid Array) package structure may be adopted.

In the above embodiment, for example, the DC-DC converter widely used as one example of the power circuit has been illustrated with the power MOS•FET as an example. However, the present invention is not limited to it. A power MIS•FET (Metal Insulator Semiconductor Field Effect Transistor) structure with an insulating film intervened therein in place of, for example, an oxide film may be adopted.

While the above description has principally been made of the case in which the invention made by the present inventors is applied to the power circuit for control of CPU and DSP, which belongs to the field of application reaching the background of the invention, the present invention is not limited to it but applicable in various ways. The present invention can be applied even to a power circuit for control of other circuit.

The present invention is applicable to the manufacturing industry of a semiconductor.

What is claimed is:

1. A semiconductor device including a DC-DC converter, comprising:
    a first semiconductor chip including a high side MOSFET of the DC-DC converter, the first semiconductor chip having a first gate electrode pad, a first source electrode pad, and a first drain electrode;
    a second semiconductor chip including a low side MOSFET of the DC-DC converter, the second semiconductor chip having a second gate electrode pad, a second source electrode pad, and a second drain electrode;
    a third semiconductor chip including a first driver circuit to drive the high side MOSFET and a second driver circuit to drive the low side MOSFET, the third semiconductor chip having a first electrode pad and a second electrode pad;
    a resin body covering the first, second, and third semiconductor chips; and
    a metal plate conductor which is electrically and mechanically connected to the first source electrode pad of the first semiconductor chip,
    wherein the first source electrode pad of the first semiconductor chip and the second drain electrode of the second semiconductor chip are electrically coupled to each other through the metal plate conductor, wherein the first semiconductor chip has a rectangular shape in plan view, with a pair of long sides and a pair of short sides, wherein the metal plate conductor is disposed so as to overlap one of the long sides of the first semiconductor chip in plan view, and wherein said one long side of the first semiconductor chip is arranged such that a closest distance between the second semiconductor chip and said one long side is less than a closest distance between the second semiconductor chip and the other long side.

2. A semiconductor device according to claim 1, wherein the first electrode pad of the third semiconductor chip is electrically coupled to the first gate electrode pad of the first semiconductor chip, and wherein the second electrode pad of the third semiconductor chip is electrically coupled to the second gate electrode pad of the second semiconductor chip.

3. A semiconductor device according to claim 1, further comprising:

an input terminal exposed from the resin body and electrically coupled to the first drain electrode of the first semiconductor chip;

a ground potential terminal exposed from the resin body and electrically coupled to the second source electrode pad of the second semiconductor chip; and an output terminal exposed from the resin body and electrically coupled to the first source electrode pad of the first semiconductor chip and to the second drain electrode of the second semiconductor chip.

4. A semiconductor device according to claim 3, further comprising:

a power supply terminal exposed from the resin body and electrically coupled to one of the first driver circuit and the second driver circuit of the third semiconductor chip.

5. A semiconductor device according to claim 3, wherein the resin body has a top surface and a bottom surface opposite the top surface, and wherein the input terminal, the ground potential terminal, and the output terminal are exposed from the bottom surface of the resin body.

6. A semiconductor device according to claim 1, further comprising:

a first bonding wire that electrically couples the first electrode pad of the third semiconductor chip to the first gate electrode pad of the first semiconductor chip; and a second bonding wire that electrically couples the second electrode pad of the third semiconductor chip to the second gate electrode pad of the second semiconductor chip, wherein a width of the metal plate conductor is greater than respective widths of the first and second bonding wires.

7. A semiconductor device according to claim 1, wherein the first source electrode pad forms a rectangular shape in plan view, with a pair of long sides and a pair of short sides, and wherein the long sides of the first semiconductor chip are parallel to the long sides of the first source electrode pad.

8. A semiconductor device according to claim 1, wherein the metal plate conductor is connected to the first source electrode pad by solder.

9. A semiconductor device according to claim 1, wherein the metal plate conductor is comprised of copper.

10. A semiconductor device according to claim 1, further comprising:

a first bonding wire that electrically couples the first electrode pad of the third semiconductor chip to the first gate electrode pad of the first semiconductor chip; and a second bonding wire that electrically couples the second electrode pad of the third semiconductor chip to the second gate electrode pad of the second semiconductor chip, wherein the first and second bonding wires are comprised of gold.

11. A semiconductor device according to claim 1, wherein the first gate electrode pad, the first source electrode pad, the second gate electrode pad, and the second source electrode pad are comprised of aluminum.

12. A semiconductor device according to claim 1, wherein the first gate electrode pad and the first source electrode pad are disposed on a top surface of the first semiconductor chip, and the first drain electrode is disposed on a bottom surface of the first semiconductor chip, the top surface being opposite the bottom surface.

13. A semiconductor device according to claim 12, wherein the first and second electrode pads are disposed on a top surface of the third semiconductor chip.

14. A semiconductor device according to claim 1, wherein the first source electrode pad includes a first source electrode pad portion and a second source electrode pad portion, and wherein the metal plate conductor is electrically and mechanically connected to the first source electrode pad portion and to the second source electrode pad portion.

15. A semiconductor device according to claim 14, wherein a first gate electrode wiring of the high side MOSFET, which is electrically connected to the first gate electrode pad, is disposed between the first source electrode pad portion and the second source electrode pad portion.

16. A semiconductor device according to claim 15, wherein the first gate electrode wiring and the first and second source electrode pad portions are formed using a same layer.

17. A semiconductor device according to claim 16, wherein the first gate electrode wiring extends in a direction parallel to the long sides of the first semiconductor chip.

18. A semiconductor device according to claim 1, wherein a first bonding wire is bonded to the first electrode pad of the third semiconductor chip, and wherein a second bonding wire is bonded to the second electrode pad of the third semiconductor chip.

19. A semiconductor device according to claim 1, wherein a first bonding wire is bonded to the first gate electrode pad of the first semiconductor chip.

20. A semiconductor device according to claim 19, wherein the first bonding wire is disposed so as to overlap one of the short sides of the first semiconductor chip.

21. A semiconductor device according to claim 1, wherein the metal plate conductor does not overlap the first gate electrode pad of the first semiconductor chip in plan view.

22. A semiconductor device according to claim 1, wherein a first bonding wire is bonded to the first electrode pad of the third semiconductor chip and to the first gate electrode pad of the first semiconductor chip, and wherein a second bonding wire is bonded to the second electrode pad of the third semiconductor chip and the second gate electrode pad of the second semiconductor chip.

23. A semiconductor device according to claim 1, wherein the metal plate conductor has a planar main body portion and a projecting portion which projects from the planar main body portion to electrically couple the first source electrode pad of the first semiconductor chip to the second drain electrode of the second semiconductor chip.

24. A semiconductor device according to claim 23, wherein the metal plate conductor is L-shaped in cross-section.

25. A semiconductor device according to claim 1, wherein the first source electrode pad and the metal plate conductor are electrically connected through at least one bump electrode.

* * * * *